(12) United States Patent
Moriya et al.

(10) Patent No.: US 8,576,910 B2
(45) Date of Patent: Nov. 5, 2013

(54) PARAMETER SELECTION METHOD, PARAMETER SELECTION APPARATUS, PROGRAM, AND RECORDING MEDIUM

(75) Inventors: Takehiro Moriya, Musashino (JP); Noboru Harada, Musashino (JP); Yutaka Kamamoto, Musashino (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 327 days.

(21) Appl. No.: 13/143,554

(22) PCT Filed: Jan. 22, 2010

(86) PCT No.: PCT/JP2010/050794
§ 371 (c)(1),
(2), (4) Date: Jul. 7, 2011

(87) PCT Pub. No.: WO2010/084951
PCT Pub. Date: Jul. 29, 2010

(65) Prior Publication Data
US 2011/0274165 A1    Nov. 10, 2011

(30) Foreign Application Priority Data

Jan. 23, 2009   (JP) ................................. 2009-013265

(51) Int. Cl.
*H04N 7/32*    (2006.01)
*H04N 11/02*   (2006.01)

(52) U.S. Cl.
USPC ............ 375/240.12; 375/240.01; 375/240.23; 375/240.26; 382/238; 382/239; 382/244; 382/246; 708/426

(58) Field of Classification Search
USPC ............. 375/240.01, 240.12, 240.23, 240.26; 382/238, 239, 244, 246; 708/426
See application file for complete search history.

(56) References Cited

U.S. PATENT DOCUMENTS 6,028,963 A    2/2000 Kajiwara
7,596,279 B2 *  9/2009 Sugimoto et al. ............. 382/238
(Continued)

FOREIGN PATENT DOCUMENTS

JP    10 4557       1/1998
JP    2006 126810   5/2006
(Continued)

OTHER PUBLICATIONS

Moriya et al. JP2008-157998 JPO Full Text and Abstract Translation. Jul. 2008.*

(Continued)

*Primary Examiner* — Christopher S Kelley
*Assistant Examiner* — Zhihan Zhou
(74) *Attorney, Agent, or Firm* — Oblon, Spivak, McClelland, Maier & Neustadt, L.L.P.

(57) ABSTRACT

Provided that a first segment is an earliest time segment included in a discrete time segment, and a second segment is a time segment subsequent to the first segment, a positive second-segment parameter that corresponds to a weakly monotonically increasing function value of an average amplitude of prediction residuals in a time segment including the second segment is used as a parameter for variable length coding of prediction residuals in the second segment. In addition, a value that corresponds to a weakly monotonically increasing function value of the sum of the second-segment parameter and a positive additional value that corresponds to an index representing the prediction effectiveness of time-series signals in the time segment including the second segment is used as a parameter for variable length coding of the prediction residual at a certain discrete time in the first segment.

15 Claims, 28 Drawing Sheets

(56) References Cited

U.S. PATENT DOCUMENTS

| | | | |
|---|---|---|---|
| 8,238,423 B2* | 8/2012 | Shibata et al. | 375/240.03 |
| 2006/0103556 A1 | 5/2006 | Malvar | |
| 2007/0009033 A1* | 1/2007 | Liebchen | 375/240.15 |

FOREIGN PATENT DOCUMENTS

| | | |
|---|---|---|
| JP | 2008 157998 | 7/2008 |
| JP | 2008 185701 | 8/2008 |
| JP | 2009 25496 | 2/2009 |
| JP | 2009 69309 | 4/2009 |

OTHER PUBLICATIONS

Moriya et al. JP2008-185701 JPO Full Text and Abstract Translation. Aug. 2008.*

Liebchen et al. MPEG-4 ALS: an Emerging Standard for Lossless Audio Coding. Proceedings of the Data Compression Conference (DCC'04) 2004, pp. 1-10.*

Kamamoto, Y., et al., "Improvement of Lossless Audio Coding MPEG-4 ALS," NTT Gijutsu Journal, vol. 20, No. 2, pp. 11-18, (Feb. 2008) (with partial English translation).

Hans, M., et al., :Lossless Compression of Digital Audio, IEEE Signal Processing Magazine, vol. 18, No. 4, pp. 21-32, (Jul. 2001).

ISO/IEC 14496-3:2005 FDAM 2, "Information Technology—Coding of audio-visual objects; Part 3: Audio; Amendment 2: Audio Lossless Coding (ALS), new audio profiles and BSAC extensions," ISO/IEC, pp. 1-83, (2005).

International Telecommunication Union, "Pulse Code Modulation (PCM) of Voice Frequencies," ITU-T Recommendation G.711, pp. 1-10, (1993).

International Search Report issued Apr. 13, 2010 in PCT/JP10/050794 filed Jan. 22, 2010.

* cited by examiner

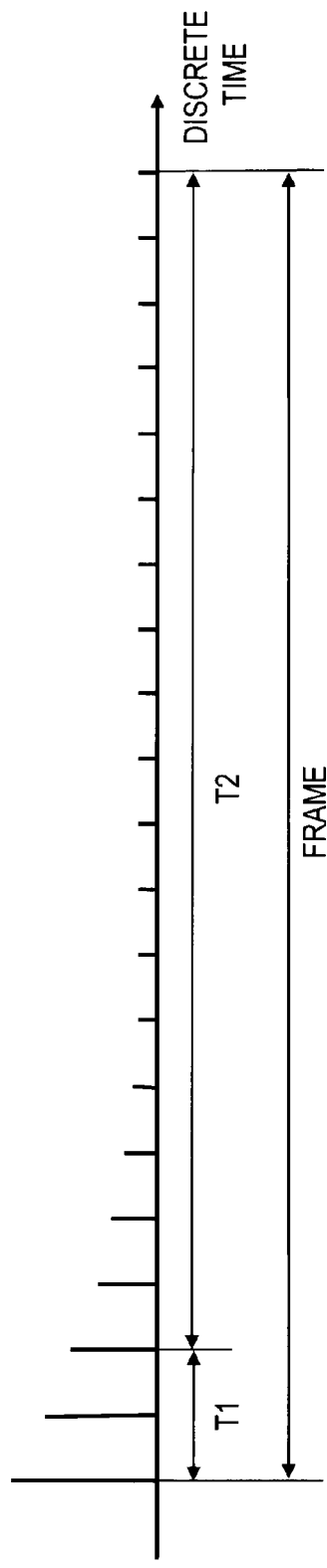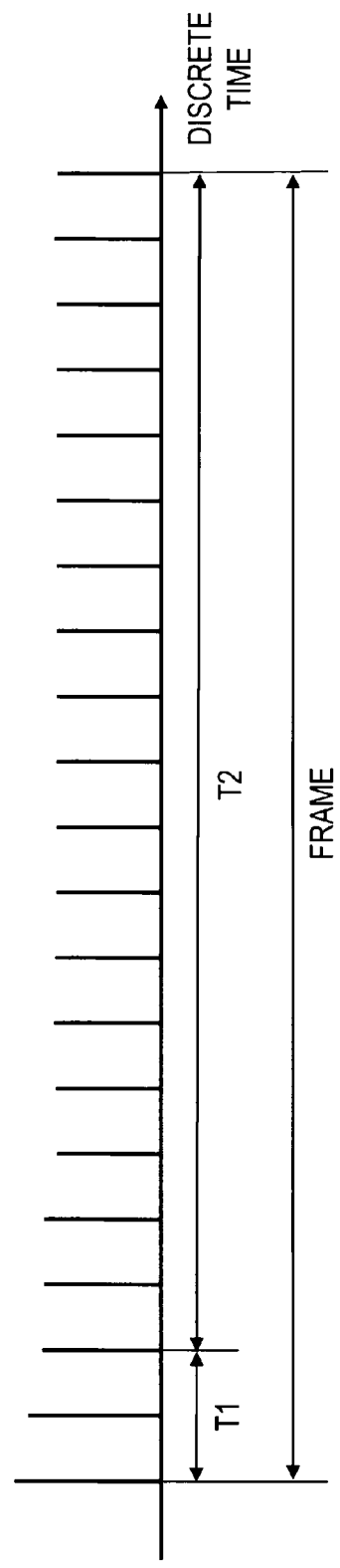

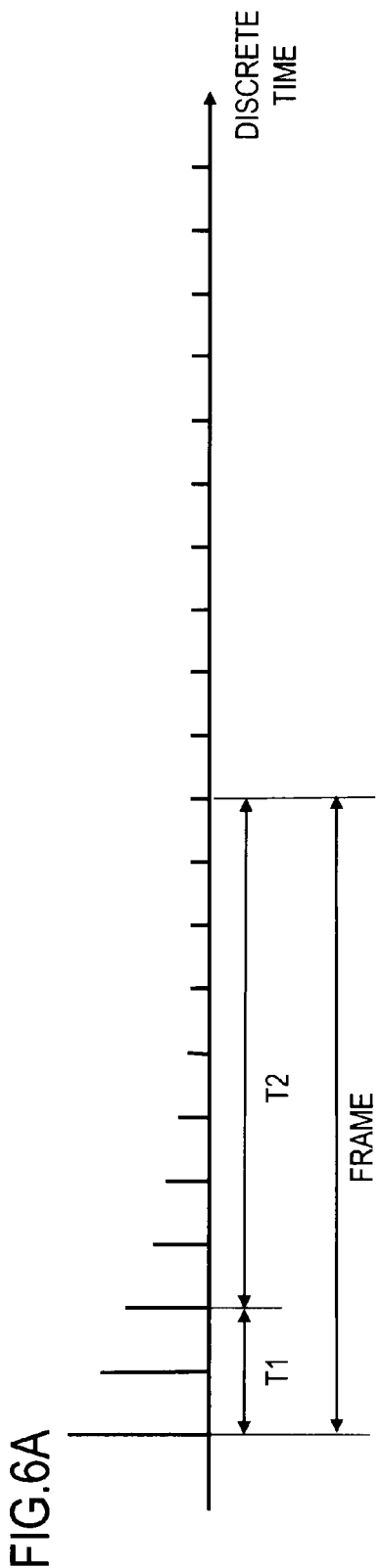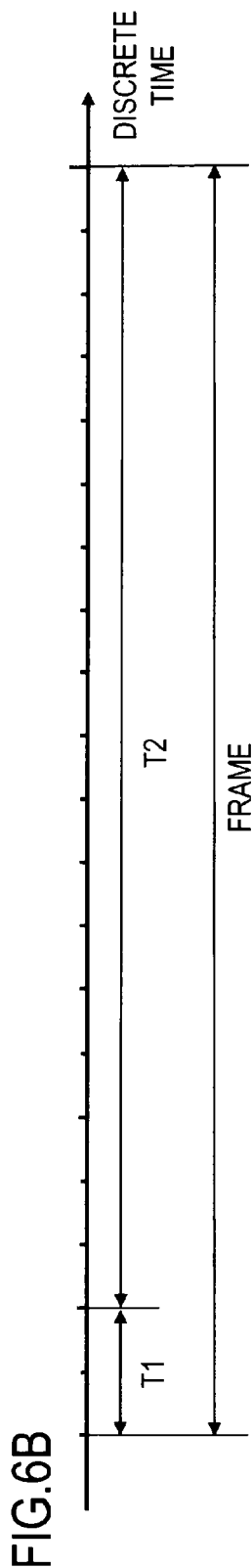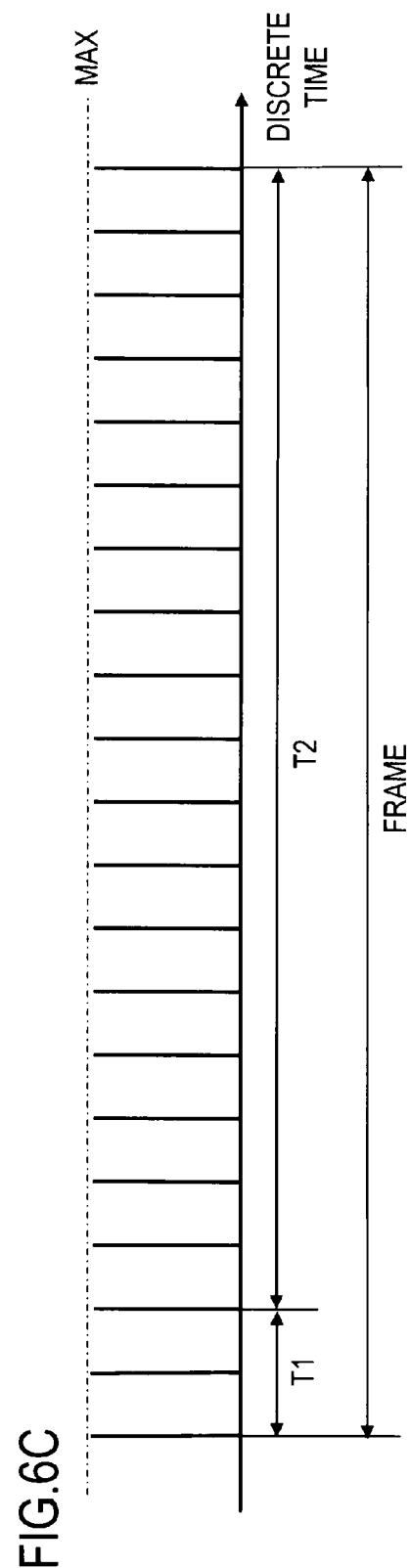

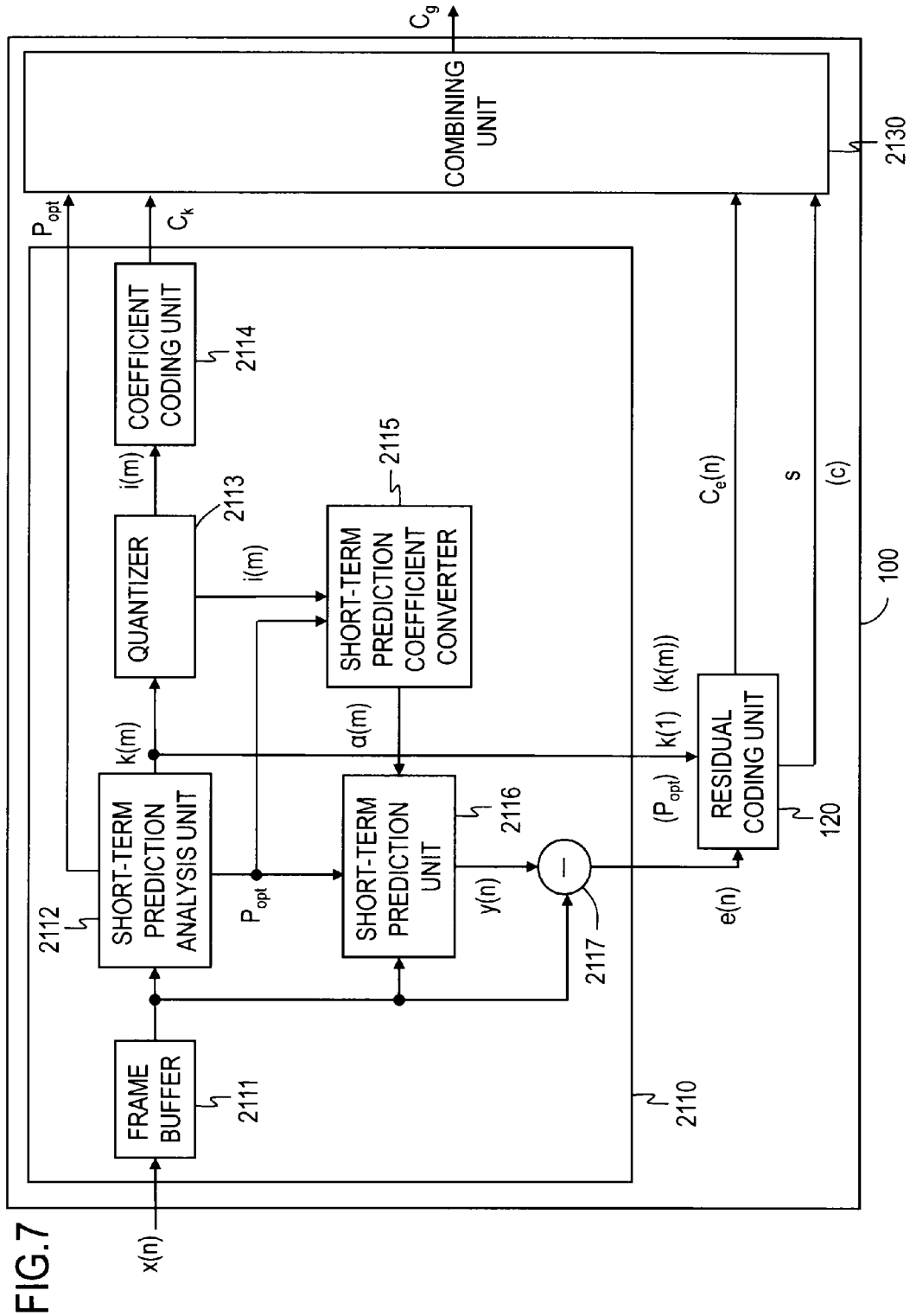

PARAMETER SELECTION METHOD, PARAMETER SELECTION APPARATUS, PROGRAM, AND RECORDING MEDIUM

TECHNICAL FIELD

The present invention relates to a technique of performing prediction analysis to encode time-series signals. In particular, it relates to a technique of selecting a parameter for variable length coding of a prediction residual.

BACKGROUND ART

When time-series signals, such as audio signals and video information, are transmitted on a communication channel or recorded on an information recording medium, it is effective in terms of transmission efficiency or recording efficiency to transmit or record the time-series signals after they are converted to compressed codes. In recent years, increasing use of broadband access and increasing capacity of storage devices have caused greater importance to lossless compression encoding methods that allow the original signal to be reproduced losslessly, rather than lossy compression encoding methods that place the highest priority on high compression rates (refer to non-patent literature 1, for example). In such circumstances, a predictive coding has been approved as an international standard of Moving Picture Experts Group (MPEG), which is named as MPEG-4 ALS (see Non-patent literature 2, for example). The predictive coding is a lossless compression coding of acoustic signals based on a short-term prediction analysis, which is an autocorrelation analysis using adjacent time-series signals, and/or a long-term prediction analysis, which is an autocorrelation analysis using time-series signals apart from each other by a delay value (a pitch period).

FIG. 1 is a block diagram for illustrating a functional configuration of an encoder 2100 based on a conventional predictive coding scheme. FIG. 2 is a block diagram for illustrating a functional configuration of a decoder 2200 based on the conventional predictive coding scheme. FIG. 3A is a block diagram for illustrating a functional configuration of a residual coding unit 2120 shown in FIG. 1, and FIG. 3B is a block diagram for illustrating a functional configuration of a residual decoding unit 2220 shown in FIG. 2. FIG. 4 is a graph for illustrating a relationship between a prediction order and a code amount in a predictive coding scheme using a short-term prediction analysis. In FIG. 4, the abscissa represents the prediction order, and the ordinate represents the code amount. First, a conventional predictive coding scheme using a short-term prediction analysis will be described with reference to these drawings.

(Encoding Method)

Pulse code modulation (PCM) time-series signals x(n) that are sampled and quantized are input to a frame buffer 2111 in the encoder 2100 (FIG. 1). In the expression x(n), the character n denotes an index of a discrete time, and a discrete time corresponding to an index n is referred to as a "discrete time n". Smaller indices n represent earlier discrete time. In addition, the time-series signal x(n) means a time-series signal at a discrete time n.

The frame buffer 2111 buffers time-series signals x(n) (n=0, ..., N−1) in a predetermined time segment (referred to as a "frame" hereinafter) (the character N represents a predetermined integer equal to or greater than 2). A time segment including discrete times n=0, ..., N−1 will be expressed as a "time segment (0, ..., N−1)" hereinafter. One frame of time-series signals x(n) (n=0, ..., N−1) buffered is passed to a short-term prediction analysis unit 2112 in a predictive coding unit 2110. The short-term prediction analysis unit 2112 calculates first-order to $P_{opt}$-th-order PARCOR coefficients k(m) (m=1, 2, ..., $P_{opt}$) by short-term prediction analysis.

[Short-term Prediction Analysis and Optimum Prediction Order]

In the short-term prediction analysis, it is assumed that a linear combination of a time-series signal x(n) at a time n and P time-series signals x(n−1), x(n−2), ..., x(n−P) at times n−1, n−2, ..., n-P preceding the time n weighted with respective coefficients α(m) (m=1, ..., P), is a prediction residual e(n) (the number P is referred to as a "prediction order", the coefficient α(m) is referred to as a "short-term prediction coefficient", and the prediction residual e(n) is referred to also as a "prediction error"). A linear prediction model based on the assumption is expressed by the following formula (1). In the linear prediction analysis, for the input time-series signals x(n) (n=0, ..., N−1), coefficients, such as the short-term prediction coefficients α(m) (m=1, 2, ..., P) that minimize the energy of the prediction residuals e(n) (n=0, ..., N−1), or PARCOR coefficients k(m) (m=1, 2, ..., P) that can be converted into the short-term prediction coefficients, are calculated.

$$e(n)=x(n)+\alpha(1)\cdot x(n-1)+\alpha(2)\cdot x(n-2)+\ldots+\alpha(P)\cdot x(n-P) \quad (1)$$

Specific examples of the short-term prediction analysis include sequential methods, such as the Levinson-Durbin method and the Burg method, and methods of solving, for each prediction order, the simultaneous equations whose solutions are short-term prediction coefficients that minimize the prediction residuals, such as the autocorrelation method and the covariance method.

A linear finite impulse response (FIR) filter expressed by the following formula (2) for estimating a time-series signal y(n) at a time n from P time-series signals x(n−1), x(n−2), ..., x(n−P) at preceding times n−1, n−2, ..., n-P is referred to as a "short-term prediction filter".

$$y(n)=-\{\alpha(1)\cdot x(n-1)+\alpha(2)\cdot x(n-2)+\ldots+\alpha(P)\cdot x(n-P)\} \quad (2)$$

The character $P_{opt}$ denotes a positive integer that represents an optimum prediction order P, which is referred to as an "optimum prediction order". In the scheme disclosed in Non-patent literature 2, the optimum prediction order $P_{opt}$ is determined based on the minimum description length (MDL) principle. According to the MDL principle, the best model is a model that minimizes the code word length, which is equal to the sum of the description length of the model and the description length of data by the model. That is, according to the scheme disclosed in Non-patent literature 2, the optimum prediction order $P_{opt}$ is a prediction order P that minimizes the code amount required for lossless decoding.

(code amount required for lossless decoding)=(code amount required for PARCOR coefficients)+(code amount required for a prediction residual) (3)

As schematically shown by the straight line 4A in FIG. 4, the code amount required for PARCOR coefficients increases in proportion to the prediction order. In addition, in general, as the prediction order increases, the energy of the prediction residual decreases, and the code amount in a case of performing entropy coding of the prediction residual decreases logarithmically as schematically shown by the curve 4B. Therefore, as schematically shown by the curve 4C that is a sum of the straight line 4A and the curve 4B, the code amount required for lossless decoding does not monotonically decreases as the prediction order increases but is minimized for a certain prediction order. The short-term prediction analysis unit 2112 searches a range of integers from an integer equal to or greater than a minimum prediction order $P_{min}$ to an integer equal to or smaller than a maximum prediction order $P_{max}$ and determines, as the optimum prediction order $P_{opt}$, a prediction order that minimizes the code amount required for lossless decoding.

As an alternative to the adaptive determination of the optimum prediction order $P_{opt}$ described above, the optimum prediction order $P_{opt}$ may be a fixed value (this is the end of the description of [Short-term prediction analysis and optimum prediction order]).

The calculated PARCOR coefficients k(m) (m=1, 2, ..., $P_{opt}$) are passed to a quantizer 2113, and the quantizer 2113 quantizes the PARCOR coefficients k(m) to produce quantized PARCOR coefficients i(m) (m=1, 2, ..., $P_{opt}$). The quantized PARCOR coefficients i(m) (m=1, 2, ..., $P_{opt}$) are passed to a coefficient coding unit 2114, and the coefficient coding unit 2114 performs variable length coding of the quantized PARCOR coefficients i(m). The quantized PARCOR coefficients i(m) (m=1, 2, ..., $P_{opt}$) are also passed to a short-term prediction coefficient converter 2115. The optimum prediction order $P_{opt}$ is also fed to the short-term prediction coefficient converter 2115, and the short-term prediction coefficient converter 2115 uses these to calculate the short-term prediction coefficients α(m) (m=1, 2, ..., $P_{opt}$). Then, a short-term prediction unit 2116 calculates short-term prediction values y(n) (n=0, ..., N−1) according to the short-term prediction filter (formula (2)) at P=$P_{opt}$, using the time-series signals x(n) (n=0, ..., N−1) in one frame, the short-term prediction coefficients α(m) (m=1, 2, ..., $P_{opt}$) and the optimum prediction order $P_{opt}$. Then, a subtraction unit 2117 calculates the prediction residuals e(n) by subtracting the short-term prediction values y(n) from the time-series signals x(n), respectively (a prediction filter processing).

The prediction residuals e(n) (n=0, ..., N−1) are integers within a predetermined range. For example, when the input time-series signals x(n) are expressed in integers with a finite number of bits, and the linear prediction values y(n) are output values of a linear prediction filter where the filter coefficients are integer linear prediction coefficients obtained, for example, by rounding off decimal places, the prediction residuals e(n) in integer representation with a finite number of bits (or represented by integers within a predetermined range) can be obtained by subtracting the linear prediction values y(n) from the time-series signals x(n), respectively. When the time-series signals x(n) or the linear prediction values y(n) are not expressed in integers, the prediction residuals e(n) may be obtained by expressing the differences calculated by subtracting the linear prediction values y(n) from the time-series signals x(n), with integers having a finite number of bits, respectively. The residual coding unit 2120 (FIG. 3A) performs Golomb-Rice coding of the prediction residuals e(n) (n=0, ..., N−1) represented by integers. In the Golomb-Rice coding, first, a parameter calculator 2121 generates a parameter s, which is an integer, using the input prediction residuals e(n) (n=0, ..., N−1) (the parameter s is sometimes referred to as a "Rice parameter").

[Generation of Parameter s]

An optimum value of the parameter s depends on the amplitude of the input prediction residuals e(n) (n=0, ..., N−1). Typically, it is assumed that the prediction residuals e(n) in a certain discrete time segment, such as a frame and a sub-frame that is a time segment obtained by dividing the frame, have an uniform amplitude, and the parameter s is set for each discrete time segment based on the average amplitude of the prediction residuals e(n) in the segment.

However, for a discrete time segment (a frame, a sub-frame or the like) randomly accessed, the assumption that all the prediction residuals e(n) in the discrete time segment have an uniform amplitude does not hold. That is, for a discrete time segment randomly accessed, any time-series signal before the discrete time segment cannot be used for calculation with the short-term prediction filter (formula (2)). Therefore, for discrete times from the first discrete time to the $P_{opt}$-th discrete time in the discrete time segment, the number of time series signals that can be used for calculation with the short-term prediction filter is limited to less than the optimum prediction order $P_{opt}$. As a result, the prediction residuals e(n) at the first discrete time to the $P_{opt}$-th discrete time in the discrete time segment often have larger amplitude than the prediction residuals e(n) at the $P_{opt+1}$-th and following discrete times.

Thus, as illustrated below, according to the method disclosed in Non-patent literature 2, a value uniquely determined from the length of the bits representing the time-series signal x(n) is used as the parameter s at the discrete time n=0, a value obtained by adding a fixed value to a parameter determined from the average amplitude of the prediction residuals e(n) at the discrete time n=3 and the following discrete times is used as the parameter s at the discrete times n=1, 2, and the parameter determined from the average amplitude of the prediction residuals e(n) at the discrete time n=3 and the following discrete times is used as the parameter s at the discrete times n=3, ..., N−1. For example, the length of the bits representing the time-series signal x(n) minus 4 is used as the parameter s at the discrete time n=0, the parameter determined from the average amplitude of the prediction residuals e(n) plus 3 is used as the parameter s at the discrete time n=1, the parameter determined from the average amplitude of the prediction residuals e(n) plus 1 is used as the parameter s at the discrete time n=2, and the parameter determined from the average amplitude of the prediction residuals e(n) is used as the parameter s at the discrete times n=3, ..., N−1 (this is the end of the description of [Generation of parameter s]).

Then, the prediction residuals e(n) (n=0, ..., N−1) and the parameters s are input to a separating calculator 2122a in a coding unit 2122. The separating calculator 2122a performs a predetermined division using these values to calculate integer quotients q(n) (n=0, ..., N−1) and information sub(n) (n=0, ..., N−1) that represents the reminders thereof. Essentially, the division is a calculation that divides the prediction residual e(n) by $2^s$. However, because of the necessity of distinguishing between positive and negative values of the prediction residuals e(n), reduction of the code length, and so on, some modifications may be added to the operations to divide the prediction residuals e(n) simply by the modulus $2^s$. Then, a variable length coding unit 2122b performs Alpha coding of the quotients q(n) to produce information prefix(n). The generated information prefix(n) and the information sub (n) are input to a combining unit 2122c. The combining unit 2122c outputs residual codes $C_e$(n) corresponding to the prediction residuals e(n), each of which is a bit combination value prefix(n)|sub(n) of the information prefix(n) and the information sub(n). In addition to the residual codes $C_e$(n), the residual coding unit 2120 output the parameters s.

The optimum prediction order $P_{opt}$ selected by the short-term prediction analysis unit 2112, a coefficient code $C_k$ generated by the predictive coding unit 2110, and the residual codes $C_e$(n) and the parameters s generated by the residual coding unit 2120 are passed to a combining unit 2130, and the combining unit 2130 combines them to produce a code $C_g$.

(Decoding Method)

The code $C_g$ input to the decoder 2200 (FIG. 2) is separated by a separator 2210 into the optimum prediction order $P_{opt}$, the coefficient code $C_k$, the residual codes $C_e(n)$ (n=0, ..., N−1) and the parameters s. The optimum prediction order $P_{opt}$ and the coefficient code $C_k$ are input to a predictive decoding unit 2230, and the residual codes $C_e(n)$ (n=0, ..., N−1) and the parameters s are input to the residual decoding unit 2220.

A separator 2221 in the residual decoding unit 2220 (FIG. 3B) separates the input residual codes $C_e(n)$ into the information prefix(n) and the information sub(n), respectively. A variable length decoding unit 2222 decodes the resulting information prefix(n) to produce the quotients q(n). The information sub(n), the quotients q(n) and the parameters s are input to a combining calculator 2223, and the combining calculator 2223 reproduces the prediction residuals e(n) using these values.

On the other hand, the coefficient code $C_k$ is input to a coefficient decoding unit 2231 in the predictive decoding unit 2230. The coefficient decoding unit 2231 decodes the coefficient code $C_k$ to produce the quantized PARCOR coefficients i(m) (m=1, 2, ..., $P_{opt}$). The quantized PARCOR coefficients i(m) (m=1, 2, ..., $P_{opt}$) are passed to a short-term prediction coefficient converter 2232. The short-term prediction coefficient converter 2232 uses the quantized PARCOR coefficients i(m) (m=1, 2, ..., $P_{opt}$) to calculate each short-term prediction coefficients α(m) (m=1, 2 ..., $P_{opt}$) to the short-term prediction filter (formula (2)) of the optimum prediction order $P_{opt}$. A short-term prediction unit 2233 generates short-term prediction values y(n) (n=0, ..., N−1) according to the short-term prediction filter (formula (2)) for P=$P_{opt}$, using the calculated short-term prediction coefficients α(m) (m=1, 2, ..., $P_{opt}$) and the time-series signals x(n) previously output from an adder 2234. The adder 2234 sums the short-term prediction values y(n) and the prediction residuals e(n) reproduced by the residual decoding unit 2220 to produce the lossless decoded values x(n) (n=0, ..., N−1) of the time-series signals, respectively (an inverse prediction filtering processing).

PRIOR ART LITERATURE

Non-Patent Literature

Non-patent literature 1: Mat Hans and Ronald W. Schafer, "Lossless Compression of Digital Audio", IEEE SIGNAL PROCESSING MAGAZINE, July 2001, pp. 21-32

Non-patent literature 2: ISO/IEC 14496-3 AMENDMENT 2: Audio Lossless Coding (ALS), new audio profiles and BSAC extensions

SUMMARY OF THE INVENTION

Problems to be Solved by the Invention

As described above, according to the method disclosed in Non-patent literature 2, a value uniquely determined from the length of the bits representing a time-series signal and a value obtained by adding a fixed value to a parameter determined from the average amplitude of prediction residuals are used as parameters for variable length coding of prediction residuals in the vicinity of the beginning of a discrete time segment.

However, according to this method, the parameters may significantly deviate from the optimum parameters.

Means to Solve the Problems

According to the present invention, provided that a first segment is an earliest time segment included in a discrete time segment, and a second segment is a time segment subsequent to the first segment, a positive second-segment parameter that corresponds to a weakly monotonically increasing function value of an average amplitude of prediction residuals in a time segment including the second segment is calculated as a parameter for variable length coding of prediction residuals in the second segment. In addition, a value that corresponds to a weakly monotonically increasing function value of the sum of the second-segment parameter and a positive additional value that corresponds to an index representing prediction effectiveness of time-series signals in the time segment including the second segment is calculated as a parameter for variable length coding of the prediction residual at a certain discrete time in the first segment.

Effects of the Invention

According to the present invention, appropriate parameters for variable length coding of prediction residuals can be selected.

BRIEF DESCRIPTION OF THE DRAWINGS

FIG. 5A is a diagram for schematically illustrating amplitude (|e(n)|) of prediction residuals e(n) in a frame randomly accessed;

FIG. 5B is a diagram for schematically illustrating amplitude (|e(n)|) of prediction residuals e(n) in a frame randomly accessed;

FIG. 6A is a diagram for schematically illustrating amplitude (|e(n)|) of prediction residuals e(n) in a frame randomly accessed;

FIG. 6B is a diagram for schematically illustrating amplitude (|e(n)|) of a prediction residuals e(n) in a frame randomly accessed;

FIG. 6C is a diagram for schematically illustrating amplitude (|e(n)|) of prediction residuals e(n) in a frame randomly accessed;

FIG. 7 is a block diagram for illustrating a functional configuration of an encoder according to a first embodiment;

DETAILED DESCRIPTION OF THE EMBODIMENTS

In the following, a principle of the present invention will be first described, and then, specific embodiments will be described.

[Principle]

First, a reason why parameters for variable length coding of prediction residuals selected according to the conventional method significantly deviate from an optimum parameter will be discussed (not known in the prior art).

First, if a value uniquely determined from the length of the bits representing a time-series signal is used as a parameter, the parameter may significantly deviate from the optimum parameter for some amplitude of the prediction residuals.

Figure 4:
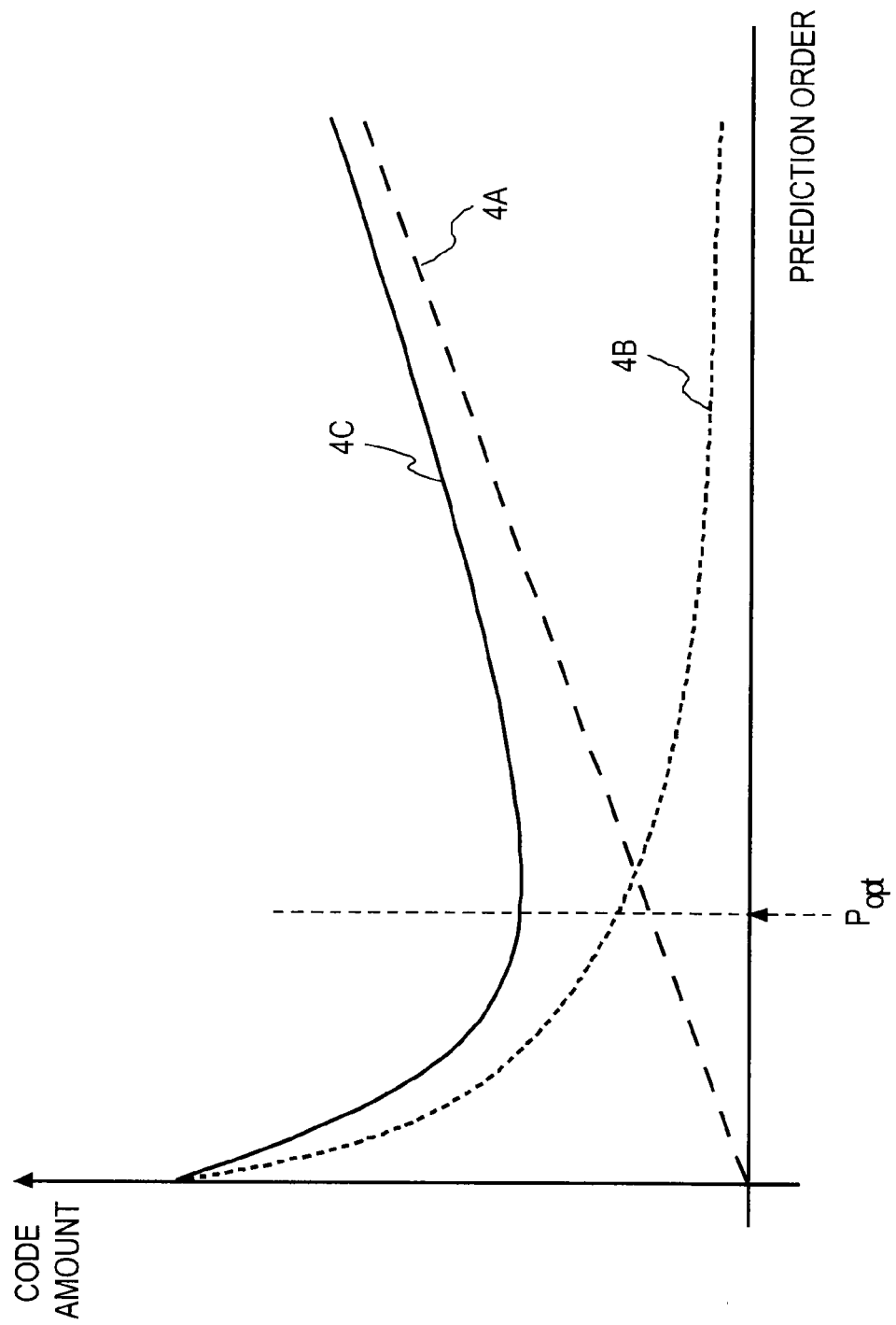
FIG. 4 is a graph for illustrating a relationship between a prediction order and a code amount in a predictive coding scheme using a short-term prediction analysis.

If a value obtained by adding a fixed value to a parameter determined from the average amplitude of the prediction residuals in a discrete time segment randomly accessed is used as a parameter in the vicinity of the beginning of the discrete time segment, the parameter may significantly deviate from the optimum value depending on the degree of short-term prediction (the degree of prediction effectiveness) in the discrete time segment. That is, if time-series signals have high autocorrelation, the prediction residuals can be reduced by increasing the prediction order, and thus, the optimum prediction order becomes large (see FIG. 4). In this case, in a time segment in which a sufficient amount of time-series signals (for example, an optimum prediction order of time-series signals) that can be used for calculation with a short-term prediction filter are available (referred to as a "time segment in which a sufficient amount of time-series signals are available" hereinafter), the ratio of the average amplitude of the prediction residuals to the average amplitude of the time-series signals can be low. However, in a segment in which a sufficient amount of time-series signals that can be used for calculation with a short-term prediction filter are not available (referred to as a "time segment in which a sufficient amount of time-series signals are not available" hereinafter), such as a vicinity of the beginning of a discrete time segment, the prediction residual cannot be sufficiently small. Therefore, when the time-series signals have high autocorrelation, the difference between the amplitude of the prediction residual in the time segment in which a sufficient amount of time-series signals are available and the amplitude of the prediction residual in the time segment in which a sufficient amount of time-series signals are not available is large. On the other hand, when the time-series signals have low autocorrelation, even if the prediction order increases, the ratio of the average amplitude of the prediction residuals to the average amplitude of the time-series signals does not significantly decreases, and therefore the optimum prediction order is small (see FIG. 4). In this case, since the optimum prediction order is low, the difference between the amplitude of the prediction residual in the time segment in which a sufficient amount of time-series signals are available and the amplitude of the prediction residual in the time segment in which a sufficient amount of time-series signals are not available is small. In short, depending on the degree of the autocorrelation among the time-series signals, the difference between the amplitude of the prediction residual in the time segment in which a sufficient amount of time-series signals are available and the amplitude of the prediction residual in the time segment in which a sufficient amount of time-series signals are not available varies. Since the optimum parameter depends on the amplitude of the prediction residuals, the difference between the optimum parameter in the time segment in which a sufficient amount of time-series signals are available and the optimum parameter in the time segment in which a sufficient amount of time-series signals are not available varies with the degree of the autocorrelation among the time-series signals or, in other words, with the ratio of the average amplitude of the prediction residuals to the average amplitude of the time-series signals. According to the method disclosed in Non-patent literature 2, the difference between these optimum parameters is assumed as a fixed value to set the parameter in the time segment in which a sufficient amount of time-series signals are not available. Thus, depending on the degree of the autocorrelation among the time-series signals, the parameter in the time segment in which a sufficient amount of time-series signals are not available may be inappropriate.

A similar problem occurs in a case where the optimum prediction order is a fixed value. That is, when the time-series signals have high autocorrelation, the prediction residuals can be sufficiently reduced in the time segment in which a sufficient amount of time-series signals are available, while the prediction residuals cannot be sufficiently reduced in the time segment in which a sufficient amount of time-series signals are not available. Therefore, when the time-series signals have high autocorrelation, the difference between the amplitude of the prediction residual in the time segment in which a sufficient amount of time-series signals are available and the amplitude of the prediction residual in the time segment in which a sufficient amount of time-series signals are not available is large. On the other hand, when the time-series signals have low autocorrelation, the prediction residuals do not significantly decrease even if the amount of time-series signals that can be used for calculation with the short-term prediction filter increases, and therefore, the difference between the amplitude of the prediction residual in the time segment in which a sufficient amount of time-series signals are available and the amplitude of the prediction residual in the time segment in which a sufficient amount of time-series signals are not available is small. In this case also, depending on the degree of the autocorrelation among the time-series signals, the difference between the optimum parameter in the time segment in which a sufficient amount of time-series signals are available and the optimum parameter in the time segment in which a sufficient amount of time-series signals are not available varies. Thus, according to the method disclosed in Non-patent literature 2, the parameter in the time segment in which a sufficient amount of time-series signals are not available may be inappropriate.

A similar problem occurs also in a predictive coding scheme that uses a long-term prediction analysis and a predictive coding scheme that uses a short-term prediction analysis and a long-term prediction analysis in combination.

A long-term prediction analysis uses a property that the amplitude characteristics of time-series signals are repeated at a fundamental period. In the long-term prediction analysis, on the assumption that the prediction residual e(n) is a linear combination of a time-series signal x(n) at a time n and time-series signals x(n−τ−j) at respective times n−τ−j that precede the time n by τ+j weighted with coefficients ρ(j) (referred to as a "gain") (τ denotes a fundamental period (a delay value), j=−tap, ..., tap (tap is often 0 or 1)), a long-term prediction model expressed by the following formula (4) is defined.

$$e(n)=x(n)+\rho(-tap)\cdot x(n-\tau+tap)+\ldots+\rho(tap)\cdot x(n-\tau-tap) \quad (4)$$

And each gain ρ(j) and a delay value t that minimize the energy of the prediction residuals e(n) are calculated for the input time-series signals x(n).

A linear FIR filter expressed by the following formula (5) is referred to as a "long-term prediction filter".

$$y(n)=-\{\rho(-tap)\cdot x(n-\tau+tap)+\ldots+\rho(tap)\cdot x(n-\tau-tap)\} \quad (5)$$

In the long-term prediction analysis also, when time-series signals have high autocorrelation at every fundamental periods, the prediction residuals can be sufficiently reduced in the time segment in which a sufficient amount of time-series signals are available, while the prediction residuals cannot be sufficiently reduced in the time segment in which a sufficient amount of time-series signals that can be used for calculation with the long-term prediction filter are not available (see formula (4)). On the other hand, when the time-series signals have low autocorrelation, the prediction residuals do not significantly decrease even if the amount of time-series signals that can be used for calculation with the long-term prediction filter increases, and therefore, the difference between the amplitude of the prediction residual in the time segment in which a sufficient amount of time-series signals are available and the amplitude of the prediction residual in the time segment in which a sufficient amount of time-series signals are not available is small. Therefore, depending on the degree of the autocorrelation among the time-series signals, the difference between the optimum parameter in the time segment in which a sufficient amount of time-series signals are available and the optimum parameter in the time segment in which a sufficient amount of time-series signals are not available varies. Thus, according to the method disclosed in Non-patent literature 2, the parameter in the time segment in which a sufficient amount of time-series signals are not available may be inappropriate.

The problem described above is not exclusive to the Rice parameter for Golomb-Rice coding of the prediction residual but common to any parameters used for variable length coding of the prediction residuals in which the optimum values of the parameters for minimizing the code amount weakly monotonically increases or monotonically increases with an increase of the amplitude of the prediction residuals.

Embodiments of the present invention solve the problems as described below.

First, as an example, a case where prediction residuals obtained by using a short-term prediction filter are encoded will be described.

FIGS. 5A and 5B and FIGS. 6A to 6C are diagrams for schematically illustrating amplitude (|e(n)|) of prediction residuals e(n) in a frame (which is equivalent to "a certain discrete time segment") randomly accessed. In these drawings, the abscissa represents the discrete time n, and the ordinate represents the amplitude of the prediction residual. The frame is a discrete time segment (0, ..., N−1) consisting of discrete times n=0, ..., N−1. Reference character T1 denotes a time segment from the earliest discrete time to the L-th discrete time in the frame (referred to as a first segment: the earliest time segment in the discrete time segment), and reference character T2 denotes a time segment from the L+1-th discrete time to the last discrete time in the frame (referred to as a second segment: a time segment following the first segment). Reference character N represents a predetermined integer equal to or greater than 2. Reference character L represents a predetermined positive integer (an integer equal to or greater than 1) that is smaller than the number of discrete times N included in the discrete time segment (0, ..., N−1). In the encoding of the prediction residuals obtained by using the short-term prediction filter, reference numeral L represents a predetermined positive integer equal to or smaller than the maximum prediction order $P_{max}$ of the short-term prediction analysis.

FIG. 5A schematically illustrates the amplitude of the prediction residuals e(n) (n=0, ..., N−1) for the time-series signals x(n) (n=0, ..., N−1) having high autocorrelation. FIG. 5B schematically illustrates the amplitude of the prediction residuals e(n) (n=0, ..., N−1) for the time-series signals x(n) (n=0, ..., N−1) having low autocorrelation.

As illustrated in FIG. 5A, when the time-series signals x(n) (n=0, ..., N−1) have high autocorrelation, the optimum prediction order $P_{opt}$ is high; therefore, the amplitude of the prediction residuals e(n) are large in the time segment in the vicinity of the beginning of the frame in which a sufficient amount of time-series signals x(n) are not available, and the amplitude of the prediction residuals e(n) are small in the following time segment in which a sufficient amount of time-series signals x(n) are available. On the other hand, when the time-series signals x(n) (n=0, ..., N−1) have low autocorrelation, the optimum prediction order $P_{opt}$ is low; therefore, not only the amplitude of the prediction residuals e(n) in the time segment in which a sufficient amount of time-series signals x(n) are not available but also the amplitude of the prediction residuals e(n) in the time segment in which a sufficient amount of time-series signals x(n) are available are large as illustrated in FIG. 5B. As described above, the difference between the amplitude of the prediction residual e(n) in the time segment in which a sufficient amount of time-series signals x(n) are not available and the amplitude of the prediction residual e(n) in the time segment in which a sufficient amount of time-series signals x(n) are available varies with the degree of the autocorrelation among the time-series signals x(n) (n=0, ..., N−1). Since the optimum parameter for variable length coding of the prediction residuals e(n) (n=0, ..., N−1) depends on the amplitude of the prediction residuals e(n) (n=0, ..., N−1), the difference between the optimum parameter in the time segment in which a sufficient amount of time-series signals x(n) are available and the optimum parameter in the time segment in which a sufficient amount of time-series signals x(n) are not available varies with the degree of the autocorrelation among the time-series signals x(n) (n=0, ..., N−1).

In this embodiment, in variable length coding of the prediction residuals e(n) (n=0, ..., N−1), the sum of the optimum parameter in the time segment in which a sufficient amount of time-series signals x(n) are available and a positive additional value that weakly monotonically increases with an increase of the degree of autocorrelation among the time-series signals x(n) (n=0, ..., N−1) or a corrected value of the sum (these values correspond to weakly monotonically increasing function values of the additional value) is estimated as the optimum parameter in the time segment in which a sufficient amount of time-series signals x(n) are not available.

More specifically, as shown in FIG. 5A, when the time-series signals x(n) (n=0, ..., N−1) have high autocorrelation, and the ratio of the average amplitude of the prediction residuals e($\mu$) ($\mu=\mu_{min}$, ..., $\mu_{max}$) to the average amplitude of the time-series signals x($\mu$) ($\mu=\mu_{min}$, ..., $\mu_{max}$, $\mu_{min} \leq \mu_{max}$) in a time segment including the second segment T2 is low (when the prediction effectiveness is high), the sum of the optimum parameter in the time segment in which a sufficient amount of time-series signals x(n) are available (the time segment including the second segment T2) and a high additional value or a corrected value of the sum is estimated as a parameter in the time segment in which a sufficient amount of time-series signals x(n) are not available (the first segment T1).

On the other hand, as shown in FIG. 5B, when the time-series signals x(n) (n=0, ..., N−1) have low autocorrelation, and the ratio of the average amplitude of the prediction residuals e($\mu$) ($\mu=\mu_{min}$, ..., $\mu_{max}$) to the average amplitude of the time-series signals x($\mu$) ($\mu=\mu_{min}$, ..., $\mu_{max}$) in a time segment including the second segment T2 is high (when the prediction effectiveness is low), the sum of the optimum parameter in the time segment in which a sufficient amount of time-series signals x(n) are available (the time segment including the second segment T2) and a low additional value (including 0) or a corrected value of the sum is estimated as a parameter in the time segment in which a sufficient amount of time-series signals x(n) are not available (the first segment T1).

That is, a weakly monotonically increases value with respect to the sum of the optimum parameter in the time segment including the second segment T2 and an additional value that weakly monotonically increases with a decrease of the ratio of the average amplitude of the prediction residuals e($\mu$) ($\mu=\mu_{min}$, ..., $\mu_{max}$) to the average amplitude of the time-series signals x($\mu$) ($\mu=\mu_{min}$, ..., $\mu_{max}$) in the time segment including the second segment T2 is estimated as a parameter in the first segment T1. The additional value corresponds to a weakly monotonically decreasing function value of the ratio of the average amplitude of the prediction residuals to the average amplitude of the time-series signals in the time segment including the second segment T2.

In other words, in these embodiments, a value that corresponds to a weakly monotonically increasing function value of the sum of the optimum parameter in the time segment including the second segment T2 and a positive additional value corresponding to an index representing the prediction effectiveness of the time-series signals x($\mu$) ($\mu=\mu_{min}$, ..., $\mu_{max}$) in the time segment including the second segment T2 is used as a parameter in the first segment T1. Thus, an optimum parameter that depends on the degree of the autocorrelation among the time-series signals x(n) (n=0, ..., N−1) (the degree of the prediction effect) can be estimated.

The time segment in which the time-series signals x(n) required for calculation with the short-term prediction filter of the optimum prediction order $P_{opt}$ are not completely available is the time segment (0, ..., $P_{opt}$−1) consisting of the first to $P_{opt}$-th discrete times. The optimum prediction order $P_{opt}$ is adaptively selected from the range from the minimum prediction order $P_{min}$ to the maximum prediction order $P_{max}$ both inclusive. Therefore, the time segment (0, ..., $P_{max}$−1) consisting of the first to $P_{max}$-th discrete times can be the time segment in which the time-series signals x(n) required for the calculation with the short-term prediction filter are not completely available.

Thus, in these embodiments, it is assumed that the time segment (0, ..., L−1) in the time segment (0, ..., $P_{max}$−1) is the first segment T1. And it is also assumed that the remaining time segment (L, ..., N−1) is the second segment T2. In variable length coding of the prediction residuals e(n), a positive second-segment parameter s that weakly monotonically increases with an increase of the average amplitude of the prediction residuals e($\mu$) ($\mu=\mu_{min}$, ..., $\mu_{max}$) in the time segment including the second segment T2 is calculated as a parameter for variable length coding of the prediction residuals e(z) in the second segment T2. The second-segment parameter s corresponds to a weakly monotonically increasing function value of the average amplitude of the prediction residuals e($\mu$) ($\mu=_{min}$, ..., $\mu_{max}$) in the time segment including the second segment T2.

In addition, in these embodiments, the sum of the second-segment parameter s and a positive additional value that weakly monotonically increases with an increase of the degree of autocorrelation among the time-series signals x(n) (n=0, ..., N−1) in the frame or a corrected value of the sum is a first-segment parameter for variable length coding of the prediction residual at a discrete time in the first segment T1. The first-segment parameter corresponds to a weakly monotonically increasing function value of the sum of the second-segment parameter s and a positive additional value corresponding to an index representing the prediction effectiveness of the time-series signals x($\mu$) ($\mu=\mu_{min}$, ..., $\mu_{max}$). In decoding of the codes of the prediction residuals e(n), the positive additional value is determined according to the same criterion as in the variable length coding of the prediction residuals e(n). Furthermore, the sum of the positive second-segment parameter that weakly monotonically increases with an increase of the average amplitude of the prediction residuals in the time segment including the second segment T2 and the additional value or a corrected value of the sum is a first-segment parameter for decoding the variable length code of the prediction residual at the discrete time in the first segment T1.

In these embodiments, a frame randomly accessed has been taken as an example of the certain discrete time segment randomly accessed. However, the leading sub-frame randomly accessed may be the "certain discrete time segment". In addition, the phrase "weakly monotonically increase" used in this embodiment is synonymous with a phrase "monotonically non-decrease". Thus, provided that a value that weakly monotonically increases with an increase of a value $\gamma$ (a value corresponding to a weakly monotonically increasing function value of a value $\gamma$) is expressed as f($\gamma$), a relation of f($\gamma_1$)≤f($\gamma_2$) holds for any values $\gamma_1$ and $\gamma_2$ ($\gamma_1 \leq \gamma_2$). In addition, the phrase "weakly monotonically decrease" is synonymous with a phrase "monotonically non-increase". Thus, provided that a value that weakly monotonically decreases with an increase of a value $\gamma$ (a value corresponding to a weakly monotonically decreasing function value of a value $\gamma$) is expressed as g($\gamma$), a relation of g($\gamma_1$)≥g($\gamma_2$) holds for any values $\gamma_1$ and $\gamma_2$ ($\gamma_1 \leq \gamma_2$).

In the following, examples of setting of the additional values for encoding the prediction residuals obtained by the short-term prediction filter will be listed.

(Case in which Magnitude of Parcor Coefficient is Used as Index)

The PARCOR coefficient k(m) is one of the index representing the degree of the autocorrelation among the time-series signals x(n) in a frame (an index representing the prediction effectiveness of the time-series signals $x(\mu)$ ($\mu=\mu_{min}, \ldots, \mu_{max}$)). The PARCOR coefficient k(m) falls within a range of $-1.0 \leq k(m) \leq 1.0$, and the absolute value of the PARCOR coefficient k(m) increases with the degree of the autocorrelation among the time-series signals x(n). Therefore, if the magnitude of the PARCOR coefficient k(m) of a certain order is used as the index, and the additional value is changed depending on the magnitude of the index, the optimum parameter in the first segment T1 can be selected. That is, when the magnitude of the PARCOR coefficient of a certain order is a first value, where the PARCOR coefficient corresponds to the time-series signals in a frame, a value corresponding to a weakly monotonically increasing function value of the sum of the second-segment parameter and a positive first additional value is used as a parameter for variable length coding of the prediction residual at a certain discrete time in the first segment T1. When the magnitude of the PARCOR coefficient is a second value greater than the first value, a value corresponding to a weakly monotonically increasing function value of the sum of the second-segment parameter and a second additional value equal to or greater than the first additional value is used as a parameter for variable length coding of the prediction residual at a certain discrete time in the first segment T1. The magnitude of the PARCOR coefficient may be the amplitude of the PARCOR coefficient, the absolute value of the PARCOR coefficient, or the energy of the PARCOR coefficient. Alternatively, the magnitude of the PARCOR coefficient may be evaluated by evaluating the magnitude of a map value of the PARCOR coefficient.

In this case, in variable length coding of the prediction residuals e(n), the optimum parameter in the first segment T1 is set by using as the additional value a value that weakly monotonically increases with an increase of the absolute value |k(m)| of the PARCOR coefficient k(m) of a certain order obtained by short-term prediction analysis of the time-series signals x(n) (n=0, ..., N−1) in a frame. The additional value in this case corresponds to a weakly monotonically increasing function value of the magnitude of the PARCOR coefficient k(m) of the certain order. In decoding of the codes of the prediction residuals e(n), an additional value is determined according to the same criterion as in the encoding by using a decoded value of the code corresponding to the PARCOR coefficient of the order used in determining the additional value in the encoding, and the parameter in the first segment T1 is calculated therefrom.

EXAMPLES 1 TO 4

In examples 1 to 4, L=3. Each of additional values a(r) is set to increase stepwise as the absolute value |k(1)| of a first-order PARCOR coefficient k(1) increases. Each of the additional values a(r) is an additional value at a discrete time r, and each of the first-segment parameters s(r) at each discrete time r (=0, 1, 2) is expressed by a formula: s(r)=s+a(r) (r=0, 1, 2). Reference character r (r=0, ..., L−1) represents an index of each of the first to L-th discrete times in the first segment T1, and the discrete time represented by the index r is referred to as a "discrete time r". The prediction residuals tend to be greater at discrete times closer to the beginning of the frame. Therefore, each of the additional values a(r) preferably corresponds to a weakly monotonically decreasing function value of the index r.

As shown in the example 3, the additional value a(r) may be 0 at any of discrete times r (=0, 1, 2), depending on the value of |k(1)|. As shown in the example 4, the additional values a(r) at the discrete times r(=0, 1, 2) may be the same each other, depending on the value of |k(1)|. Alternatively, as shown in the example 5, the additional values a(r) may be function values that continuously vary in accordance with the value of |k(1)|.

EXAMPLE 1

When $0.9 \leq |k(1)| \leq 1.0$: a(0)=3, a(1)=2, a(2)=1
When $0.6 \leq |k(1)| < 0.9$: a(0)=2, a(1)=1, a(2)=0
When $0 \leq |k(1)| < 0.6$: a(0)=1, a(1)=0, a(2)=0

EXAMPLE 2

When $0.9 \leq |k(1)| \leq 1.0$: a(0)=2, a(1)=1, a(2)=0
When $0 \leq |k(1)| < 0.9$: a(0)=1, a(1)=0, a(2)=0

EXAMPLE 3

When $0.9 \leq |k(1)| \leq 1.0$: a(0)=3, a(1)=2, a(2)=1
When $0.6 \leq |k(1)| < 0.9$: a(0)=2, a(1)=1, a(2)=0
When $0 \leq |k(1)| < 0.6$: a(0)=0, a(1)=0, a(2)=0

EXAMPLE 4

When $0.9 \leq |k(1)| \leq 1.0$: a(0)=2, a(1)=2, a(2)=2
When $0 \leq |k(1)| < 0.9$: a(0)=1, a(1)=1, a(2)=1

EXAMPLE 5 a(0)=2|k(1)|+1, a(1)=2|k(1)|, a(2)=|k(1)|

EXAMPLES 6 AND 7

In examples 6 and 7 also, L=3. However, the present invention is applied to only part of the discrete times in the first segment T1. In these examples, the parameter at the discrete time r=0 is a fixed value (the length of the bits representing the time-series signal x(n) minus 4, for example), and the first-segment parameter at each discrete time r=1 and 2 is expressed as s(r)=s+a(r) (r=1, 2). In the example 7, each of the additional values a(1) at the discrete time r=1 are set to increase stepwise as the value of |k(1)| increases, and the additional value a(2) at the discrete time r=2 is a fixed value.

EXAMPLE 6

When $0.9 \leq |k(1)| \leq 1.0$: a(1)=3, a(2)=2
When $0.6 \leq |k(1)| < 0.9$: a(1)=2, a(2)=1
When $0 \leq |k(1)| < 0.6$: a(1)=1, a(2)=0

EXAMPLE 7

When $0.9 \leq |k(1)| \leq 1.0$: a(1)=3, a(2)=1
When $0.6 \leq |k(1)| < 0.9$: a(1)=2, a(2)=1
When $0 \leq |k(1)| < 0.6$: a(1)=1, a(2)=1

(Case in which Optimum Prediction Order is Used as Index)

The optimum prediction order $P_{opt}$ can also be used as the index representing the degree of the autocorrelation among the time-series signals x(n) (n=0, ..., N−1) in a frame (the index representing the prediction effectiveness of the time-series signals x(μ) (μ=μ$_{min}$, ..., μ$_{max}$)). As the autocorrelation among the time-series signals x(n) (n=0, ..., N−1) becomes higher (as the prediction effectiveness becomes higher), the decreased amount of energy of the prediction residual e(n) due to an increase of the prediction order increases, and the optimum prediction order P$_{opt}$ adaptively selected increases. Therefore, the optimum parameter in the first segment T1 can be set by using the optimum prediction order P$_{opt}$ as an index and changing the additional value depending on the magnitude of the index.

In this case, in variable length coding of the prediction residuals e(n), the optimum parameter in the first segment T1 is set by using as the additional value a value that weakly monotonically increases with an increase of the optimum prediction order P$_{opt}$ adaptively selected in short-term prediction analysis of the time-series signals x(n) (n=0, ..., N−1) in a frame. The additional value in this case corresponds to a weakly monotonically increasing function value of the optimum prediction order P$_{opt}$. In decoding of the code of the prediction residual e(n), the parameter in the first segment T1 is calculated by determining an additional value according to the same criterion as in the encoding using the optimum prediction order P$_{opt}$ used to determine the additional value in the coding.

EXAMPLES 8 AND 9

In an example 8, L=3. Each of additional values a(r) is set to increase stepwise as the optimum prediction order P$_{opt}$ increases. The first-segment parameter s(r) at each discrete time r (=0, 1, 2) is expressed by a formula: s(r)=s+a(r) (r=0, 1, 2). The prediction residuals tends to be greater at discrete times closer to the beginning of the frame. Therefore, each of the additional values a(r) preferably corresponds to a weakly monotonically decreasing function value of the index r. In an example 9, L=2. As in the case where the PARCOR coefficient is used as the index, depending on the value of the optimum prediction order P$_{opt}$, the additional value a(r) may be 0 at any of discrete times r (=0, 1, 2), or the additional values a(r) at the discrete times r (=0, 1, 2) may be the same each other. In this case also, the present invention may be applied to only part of the discrete times in the first segment T1. Furthermore, the additional values a(r) may be a function value that continuously vary in accordance with the optimum prediction order P$_{opt}$.

EXAMPLE 8

When 16≤P$_{opt}$≤P$_{max}$: a(0)=3, a(1)=2, a(2)=1
When 4≤P$_{opt}$<16: a(0)=2, a(1)=1, a(2)=0
When P$_{min}$≤P$_{opt}$<4: a(0)=1, a(1)=0, a(2)=0

EXAMPLE 9

When 16≤P$_{opt}$≤P$_{max}$: a(0)=3, a(1)=2
When 4≤P$_{opt}$<16: a(0)=2, a(1)=1
When P$_{min}$≤P$_{opt}$<4: a(0)=1, a(1)=0

(Case 1 in which Index Corresponds to Energy of Prediction Residuals)

When the time-series signals x(n) (n=0, ..., N−1) in a frame have high autocorrelation (when the prediction effectiveness of the time-series signals x(μ) (μ=μ$_{min}$, ..., μ$_{max}$) is high), the energy of the prediction residuals in the frame is low. To the contrary, when the time-series signals x(μ) in a frame have low autocorrelation (when the prediction effectiveness of the time-series signals x(μ) (μ=μ$_{min}$, ..., μ$_{max}$) is low), the energy of the prediction residuals in the frame is high. Therefore, the energy of the prediction residuals in the frame can be used as the index representing the degree of the autocorrelation among the time-series signals x(n) (n=0, N−1) in a frame (the index representing the prediction effectiveness of the time-series signals x(μ) (μ=μ$_{min}$, ..., μ$_{max}$)). The total sum of the energy of the prediction residuals in a frame can be estimated using the first-order to P-th-order PARCOR coefficients k(m) (m=1, ..., P) obtained by short-term prediction analysis of the time-series signals x(n) (n=0, ..., N−1) in the frame at the prediction order P according to a formula: $E(0) \cdot \Pi_{m=1}^{P}\{1-k(m)^2\}$. In this formula, $E(0)$ represents the total sum of the energy of the time-series signals x(n) (n=0, ..., N−1) in the frame ($E(0) = \Sigma_{n=0}^{N-1}\{x(n)\}^2$). When the prediction order P is adaptively selected, the prediction order P is the optimum prediction order P$_{opt}$. However, $E(0)$ does not represent the degree of the autocorrelation among the time-series signals x(n) (n=0, ..., N−1), $E(p)$ ($=\Pi_{m=1}^{P}\{1-k(m)^2\}$) is used as the index.

In this case, in variable length coding of the prediction residuals e(n), the optimum parameter in the first segment T1 is set by using as the additional value a value that weakly monotonically decreases with an increase of $E(p)$ ($=\Pi_{m=1}^{P}\{1-k(m)^2\}$) (a value corresponding to a weakly monotonically decreasing function of E(p)). The values $\{1-k(m)^2\}$ for respective prediction orders m are calculated in the short-term prediction analysis process according to the Burg method or the like. Therefore, E(p) can be calculated without recalculation of the values $\{1-k(m)^2\}$ if the values are saved in a memory. In decoding of the codes of the prediction residuals e(n), an additional value is determined according to the same criterion as in the encoding by using decoded values of the code corresponding to the first-order to P-th-order PARCOR coefficients, and the parameter in the first segment T1 is calculated therefrom.

EXAMPLES 10 AND 11

In an example 10, L=3. Each of additional values a(r) is set to decrease stepwise as E(p) increases. Each of the first-segment parameters s(r) at each discrete time r (=0, 1, 2) is expressed by a formula: s(r)=s+a(r) (r=0, 1, 2). The prediction residuals tend to be greater at discrete times closer to the beginning of the frame. Therefore, each of the additional values a(r) preferably corresponds to a weakly monotonically decreasing function value of the index r. In an example 11, L=2. As in the case where the PARCOR coefficient is used as the index, depending on the value of E(p), the additional value a(r) may be 0 at any of discrete times r (=0, 1, 2), or the additional values a(r) at the discrete times r (=0, 1, 2) may be the same each other. In this case also, the present invention may be applied to only part of the discrete times in the first segment T1. Furthermore, the additional values a(r) may be function values that continuously vary in accordance with the value of E(p).

EXAMPLE 10

When 0≤E(p)<0.1: a(0)=3, a(1)=2, a(2)=1
When 0.1≤E(p)<0.6: a(0)=2, a(1)=1, a(2)=0
When 0.6≤E(p)≤1: a(0)=1, a(1)=0, a(2)=0

EXAMPLE 11

When $0 \leq E(p) < 0.1$: $a(0)=3$, $a(1)=2$
When $0.1 \leq E(p) < 0.6$: $a(0)=2$, $a(1)=1$
When $0.6 \leq E(p) \leq 1$: $a(0)=1$, $a(1)=0$ (Case 2 in which Index Corresponds to Energy of Prediction Residuals)

At the first discrete time r=0 in the first segment T1, there is no time-series signals that can be used for calculation with the short-term prediction filter. Thus, an average energy $E(0)/N$ of the time-series signals $x(n)$ ($n=0, \ldots, N-1$) in the frame is used to estimate the energy of the prediction residual $e(0)$ at the discrete time r=0 to be $E(0)/N$. When $P > r > 0$, the energy of the prediction residual $e(r)$ at each discrete time r in the first segment T1 is estimated to be $\{E(0)/N\} \cdot \Pi_{m=1}^{r}\{1-k(m)^2\}$. When the prediction order P is adaptively selected, the prediction order P is the optimum prediction order $P_{opt}$. When $L \geq P$, the energy of the prediction residual $e(z)$ ($z=L, \ldots, N-1$) at each discrete time z in the second segment T2 is estimated to be $\{E(0)/N\} \cdot \Pi_{m=1}^{P}\{1-k(m)^2\}$, and the average energy of the prediction residuals $e(z)$ ($z=L, \ldots, N-1$) in the second segment T2 is approximated as $\{E(0)/N\} \cdot \Pi_{m=1}^{P}\{1-k(m)^2\}$.

Therefore, when $L \geq P$, the difference between the energy of the prediction residual $e(0)$ at the first discrete time r=0 in the first segment T1 and the average energy of the prediction residuals $e(z)$ ($z=L, \ldots, N-1$) in the second segment T2 is approximated as $\{E(0)/N\} \{1-\Pi_{m=1}^{P}\{1-k(m)^2\}\}$. When $L \geq P > r > 0$, the difference between the energy of the prediction residual $e(r)$ at the discrete time r in the first segment T1 and the average energy of the prediction residuals $e(z)$ ($z=L, \ldots, N-1$) in the second segment T2 is approximated as $\{E(0)/N\} \{\{\Pi_{m=1}^{r}\{1-k(m)^2\}-\Pi_{m=1}^{P}\{1-k(m)^2\}\}$.

Therefore, in this case, in variable length coding of the prediction residuals $e(n)$, a value that weakly monotonically increases with an increase of the value of $1-\Pi_{m=1}^{P}\{1-k(m)^2\}$ (a value corresponding to a weakly monotonically increasing function value of $1-\Pi_{m=1}^{P}\{1-k(m)^2\}$) is used as the additional value $a(0)$ at the discrete time r=0. Furthermore, a value that weakly monotonically increases with an increase of the value of $\Pi_{m=1}^{r}\{1-k(m)^2\}-\Pi_{m=1}^{P}\{1-k(m)^2\}$ (a value corresponding to a weakly monotonically increasing function value of $\Pi_{m=1}^{r}\{1-k(m)^2\}-\Pi_{m=1}^{P}\{1-k(m)^2\}$) is used as the additional value $a(r)$ at the discrete time r ($0 < r < P$). Each optimum parameter in the first segment T1 is set by using each of the additional values. In decoding of the codes of the prediction residuals $e(n)$, each additional value is determined according to the same criterion as in the encoding by using decoded values of the code corresponding to the first-order to P-th-order PARCOR coefficients, and each parameter in the first segment T1 is calculated therefrom.

In this case, the first-segment parameter $s(r)$ at each discrete time r ($=0, \ldots, L-1$) is expressed by a formula: $s(r)=s+a(r)$. As in the case where the PARCOR coefficient is used as the index, depending on the value of $1-\Pi_{m=1}^{P}\{1-k(m)^2\}$ or $\Pi_{m=1}^{r}\{1-k(m)^2\}-\Pi_{m=1}^{P}\{1-k(m)^2\}$, the additional value $a(r)$ ($=0, \ldots, L-1$) may be 0 at any of discrete times r ($=0, \ldots, L-1$), or the additional values $a(r)$ ($=0, \ldots, L-1$) at the discrete times r ($=0, \ldots, L-1$) may be the same each other. In this case also, the present invention may be applied to only part of the discrete times in the first segment T1. Furthermore, the additional values $a(r)$ may be function values that continuously vary in accordance with the value of $1-\Pi_{m=1}^{P}\{1-k(m)^2\}$ or $\Pi_{m=1}^{r}\{1-k(m)^2\}-\Pi_{m=1}^{P}\{1-k(m)^2\}$.

(Example of Relationship Between Number of Samples in Frame and Additional Value)

FIG. 6A schematically shows the amplitude of the prediction residuals $e(n)$ ($n=0, \ldots, N-1$) when the number of samples in a frame is smaller than that in the case shown in FIG. 5A. As can be seen from comparison between FIGS. 5A and 6A, the average amplitude of the prediction residuals in the second segment T2 tends to increase as the number of samples in the frame decreases. This is because the ratio of the "time segment in which the time-series signals $x(n)$ required for calculation with the short-term prediction filter are not completely available" in the second segment T2 increases as the number of samples in the frame decreases. Therefore, the additional value preferably weakly monotonically increases with an increase of the number of time-series signals in the discrete time segment randomly accessed that is a unit of the encoding process. In other words, the additional value preferably corresponds to a weakly monotonically increasing function value of the number of time-series signals in the discrete time segment. For example, the unit of the encoding process can be switched between a frame and a sub-frame, and the additional value can be larger when the unit of the encoding process is a frame than when the unit of the encoding process is a sub-frame.

(Example of Relationship Between Magnitude of Second-Segment Parameter and Additional Value)

FIG. 6B schematically shows a case where the amplitude of the prediction residuals $e(n)$ in a frame is close to 0. FIG. 6C schematically shows a case where the amplitude of the prediction residuals $e(n)$ in a frame is close to the maximum amplitude value MAX.

In the case where the amplitude of each prediction residual $e(n)$ in a frame is close to 0 as shown in FIG. 6B, the frame is likely to be a non-active speech segment. In this case, the difference between the average amplitude of the prediction residuals $e(r)$ ($r=0, \ldots, L-1$) in the first segment T1 and the average amplitude of the prediction residuals $e(z)$ ($z=L, \ldots, N-1$) in the second segment T2 is also close to 0. In this case, the variation of the difference in average amplitude between the first segment T1 and the second segment T2, which corresponds to the variation of the degree of the autocorrelation among the time-series signals $x(n)$ ($n=0, \ldots, N-1$) (the variation of the degree of the prediction effectiveness of the time-series signals $x(\mu)$ ($\mu=\mu_{min}, \ldots, \mu_{max}$)), also decreases.

In the case where the amplitude of the prediction residuals $e(n)$ ($n=0, \ldots, N-1$) in a frame is close to the maximum amplitude value MAX as shown in FIG. 6C, each prediction residual $e(n)$ ($n=0, \ldots, N-1$) is saturated. In this case, the difference between the average amplitude of the prediction residuals $e(r)$ ($r=0, \ldots, L-1$) in the first segment T1 and the average amplitude of the prediction residuals $e(z)$ ($n=L, \ldots, N-1$) in the second segment T2 is often close to 0. In this case, the difference in average amplitude between the first segment T1 and the second segment T2, which corresponds to the difference in degree of the autocorrelation among the time-series signals $x(n)$ ($n=0, \ldots, N-1$), also decreases.

Thus, each additional value is preferably set to be small in the case where the amplitude of each prediction residual $e(n)$ ($n=0, \ldots, N-1$) in the frame is close to 0 or the maximum amplitude value MAX. More specifically, predetermined values TH1 and TH2 are set to be equal to or greater than 0 and equal to or smaller than the maximum amplitude value MAX ($0 \leq TH1 < TH2 \leq MAX$), and the additional value $a(r)$ in the case where the second-segment parameter s is equal to or smaller than the predetermined value TH1 can be set to be equal to or smaller than the additional value $a(r)$ in the case where the second-segment parameter is greater than the predetermined value TH1 and smaller than the predetermined value TH2. That is, the additional value in the case where the second-segment parameter s is equal to or smaller than the predetermined value TH1 can be set to be smaller than the additional value in the case where the second-segment parameter s is greater than the predetermined value TH1. Alternatively, the additional value a(r) in the case where the second-segment parameter s is equal to or greater than the predetermined value TH2 can be equal to or smaller than the additional value a(r) in the case where the second-segment parameter s is greater than the predetermined value TH1 and smaller than the predetermined value TH2. That is, the additional value in the case where the second-segment parameter s is equal to or greater than the predetermined value TH2 can be smaller than the additional value in the case where the second-segment parameter s is smaller than the predetermined value TH2. Alternatively, both the settings may be used.

(Additional Information)

Even in the conventional short-term predictive coding scheme, the index to determine the additional value described above, such as the PARCOR coefficient, is given to the decoder. Thus, in the processing according to these embodiments, the encoder does not have to add new information to the code.

However, the encoder may be configured to select a criterion for determining the additional value, and auxiliary information d representing the criterion selected by the encoder may be included in the code. For example, the encoder may select one of the criteria in ((Example 1)) and ((Example 2)) described above, determine the additional value according to the criterion, and provide the code including the auxiliary information d representing the selected criterion to the decoder. Alternatively, the encoder may select one criterion from a criterion in which the PARCOR coefficient is used as the index and a criterion in which the optimum prediction order is used as the index described above, determine the additional value according to the selected criterion, and provide the code including the auxiliary information d representing the selected criterion to the decoder.

As an alternative to using the sum of the second-segment parameter and the additional value as the first-segment parameter, a corrected value that weakly monotonically increases with respect to the sum of the second-segment parameter and the additional value may be used as the first-segment parameter. In this case, the encoder may provide the code including auxiliary information c that represents the content of the correction to the decoder. An example of the auxiliary information c representing the content of the correction is the difference between a parameter actually calculated from the average amplitude of the prediction residuals e(r) (r=0, . . . , L−1) in the first segment T1 and the sum of the second-segment parameter and the additional value.

(Combination of Criteria)

The additional values a(r) (r=0, . . . , L−1) may be set according to a combination of criteria described above. For example, different criteria may be used for different discrete times. For example, the additional value a(1) at the discrete time r=1 may be determined according to a criterion in which the PARCOR coefficient is used as the index described above, and the additional value a(2) at the discrete time r=2 may be determined according to a criterion in which the optimum prediction order is used as the index described above.

(Parameter)

The parameters set in this embodiment are parameters for variable length coding of the prediction residuals, and whose optimum value for minimizing the code amount weakly monotonically increases or monotonically increases with an increase of the amplitude of the prediction residuals. An example of the parameter is a Rice parameter for Golomb-Rice coding of the prediction residuals. However, this example does not limit the scope of the present invention. For example, the present invention can be applied to a parameter for any variable length coding method in which each code corresponding to the prediction residual is information that includes first information identifying integer quotient obtained by division using the prediction residual or integer not smaller than 0 that monotonically increase with increase in the absolute value of the prediction residual, as a dividend, and integer depending on the parameter decided for the time segment corresponding to the prediction residual, as a modulus, and second information identifying the remainder obtained when the dividend are divided by the modulus. Examples of the parameter include a Rice parameter, a Golomb parameter for Golomb coding of the prediction residuals, and a parameter for a variable length coding method in which the Alpha coding performed in a Golomb-Rice code or a Golomb code is replaced with a Huffman coding.

The second-segment parameter s weakly monotonically increases with an increase of the average amplitude of the prediction residuals e($\mu$) ($\mu=\mu_{min}$, . . . $\mu_{max}$) in the time segment including the second segment T2. The second-segment parameter s may be set by using the average amplitude of the prediction residuals e(z) (z=L, . . . , N−1) in the second segment T2, set by using the average amplitude of the prediction residuals e(n) (n=0, . . . , N−1) in the first segment T1 and the second segment T2, or set by using the average amplitude of the prediction residuals in a part of the first segment T1 and in the second segment T2. If the second-segment parameter s weakly monotonically increases with respect to the average amplitude of the prediction residuals e($\mu$) ($\mu=\mu$min, . . . , $\mu_{max}$) in the time segment including the second segment T2, the second-segment parameter s can be set by using the average amplitude of the prediction residuals in a part of the second segment T2.

Furthermore, in the variable length coding method described above in which each code corresponding to the prediction residual is information that includes first information identifying integer quotient obtained by division using the prediction residual or integer not smaller than 0 that monotonically increase with increase in the absolute value of the prediction residual, as a dividend, and integer depending on the parameter decided for the time segment corresponding to the prediction residual, as a modulus, and second information identifying the remainder obtained when the dividend are divided by the modulus, the second-segment parameter s is calculated to minimize the average amplitude of the codes of the prediction residuals e($\mu$) ($\mu=\mu_{min}$, . . . , $\mu_{max}$) in the time segment including the second segment T2. In the case of the Rice parameter, for example, the second-segment parameter s is an integer obtained by quantizing the value of $\log_2 \{\ln 2 \cdot (2 \cdot D)\}$ (where D represents the average amplitude of the prediction residuals e($\mu$) ($\mu=\mu_{min}$, . . . , $\mu_{max}$) in the time segment including the second segment T2).

(Coding of Prediction Residuals Obtained by Using Long-Term Prediction Filter)

In the case of performing long-term prediction analysis of time-series signals and coding prediction residuals obtained by using a long-term prediction filter, the value L described above is a predetermined integer equal to or smaller than the maximum value of the delay value $\tau$ in the long-term prediction analysis. As described above, the long-term prediction analysis is a processing that calculates each gain $\rho(j)$ and the delay value $\tau$ that minimize the energy of the prediction residuals e(n) (n=0, . . . , N−1) expressed by the formula (4) for the input time-series signals x(n) (n=0, . . . , N−1), and the delay value $\tau$ is adaptively selected from a range from the minimum delay value $T_{min}$ to the maximum delay value $T_{max}$ both inclusive. Therefore, the time segment $(0, \ldots, T_{max}-1)$ consisting of the first to $T_{max}$-th discrete times can be the time segment in which the time-series signals x(n) required for calculation with the long-term prediction filter are not completely available. Thus, in this embodiment, it is assumed that the time segment $(0, \ldots, L-1)$ in the time segment $(0, \ldots, T_{max}-1)$ is the first segment T1. And it is also assumed that the remaining time segment $(L, \ldots, N-1)$ is the second segment T2. In variable length coding of the prediction residuals e(n), a positive second-segment parameter s that weakly monotonically increases with an increase of the average amplitude of the prediction residuals e(μ) (μ=$μ_{min}, \ldots, μ_{max}$) in the time segment including the second segment T2 is calculated as a parameter for variable length coding of the prediction residuals e(z) in the second segment T2. In addition, the sum of the second-segment parameter s and a positive additional value that weakly monotonically increases with an increase of the degree of autocorrelation among the time-series signals x(n) (n=0, . . . , N−1) in the frame (a value that corresponds to the index representing prediction effectiveness of the long-term prediction analysis of the time-series signals x(n) (n=0, . . . , N−1)) or a corrected value of the sum is a first-segment parameter for variable length coding of the prediction residual at a discrete time in the first segment T1. That is, the first segment parameter corresponds to a weakly monotonically increasing function value of the sum of the second-segment parameter s and a value corresponding to the index representing the prediction effectiveness of the long-term prediction analysis of the time-series signals x(n) (n=0, . . . , N−1).

In decoding of the codes of the prediction residuals e(n), the first-segment parameter for decoding the variable length code of the prediction residual in a discrete time in the first segment is calculated according to the same criterion as in the variable length coding of the prediction residual e(n).

The additional value in the encoding of the prediction residual obtained by using the long-term prediction filter is a value that weakly monotonically increases with an increase of the absolute value |ρ(j)| of the gain ρ(j), which is the prediction coefficient of the long-term prediction filter obtained by long-term prediction analysis of the time-series signals x(n) (n=0, . . . , N−1) in the discrete time segment (0, . . . , N−1), for example. In this example, in variable length coding of the prediction residuals e(n), the optimum parameter in the first segment T1 is set by using a value that weakly monotonically increases or decreases with an increase of the gain ρ(j) as the additional value. In decoding of the codes of the prediction residuals e(n), an additional value is determined according to the same criterion as in the encoding by using a decoded value of the code corresponding to the gain ρ(j), and the parameter in the first segment T1 is calculated therefrom.

EXAMPLES 12 AND 13

In an example 12, L=3. In the example 12, each of additional values a(r) is set to increase stepwise with an increase of the absolute value |ρ(j)| of the gain ρ(j). Each of the first-segment parameters s(r) at each discrete time r (=0, 1, 2) is expressed by a formula: s(r)=s+a(r) (r=0, 1, 2). The prediction residuals tend to be greater at discrete times closer to the beginning of the frame. Therefore, each of the additional values a(r) preferably corresponds to a weakly monotonically decreasing function value of the index r. In an example 13, each of additional values a(r) is set to increase stepwise with an increase of the average value $ρ_{ave}$ of the absolute values of the gains ρ(−tap), . . . , ρ(tap). Depending on the value of the gain, the additional value a(r) may be 0 at any discrete times r(=0, 1, 2), or the additional values a(r) at the discrete times r(=0, 1, 2) may be the same each other. In this case also, the present invention may be applied to only part of the discrete times in the first segment T1. Alternatively, the additional values a(r) may be function values that continuously vary in accordance with the gain.

EXAMPLE 12

When |ρ(0)|≥60: a(0)=3, a(1)=2, a(2)=1
When 60>|ρ(0)|≥40: a(0)=2, a(1)=1, a(2)=0
When 40>|ρ(0)|: a(0)=1, a(1)=0, a(2)=0

EXAMPLE 13

When $ρ_{ave}$≥60: a(0)=3, a(1)=2, a(2)=1
When 60>$ρ_{ave}$≥40: a(0)=2, a(1)=1, a(2)=0
When 40>$ρ_{ave}$: a(0)=1, a(1)=0, a(2)=0

Except for the specific methods of setting the additional value, all things are the same as the encoding of the prediction residuals obtained by using the short-term prediction filter described above. Furthermore, the present invention may be applied to a case where long-term prediction analysis is applied for time-series signals that are prediction residuals obtained by using the short-term prediction filter, and prediction residuals obtained by using the long-term prediction filter are coded. Alternatively, the present invention may be applied to a case where short-term prediction analysis is applied for time-series signals that are prediction residuals obtained by using the long-term prediction filter, and prediction residuals obtained by using the short-term prediction filter are encoded. When the short-term prediction analysis and the long-term prediction analysis are used in combination in this way, each additional value may be set in the same way as the encoding of the prediction residuals obtained by using the short-term prediction filter described above, may be set in the same way as the encoding of the prediction residuals obtained by using the long-term prediction filter described above, or may be the additional value set according to a combination of these setting criteria.

[First Embodiment]

Next, a first embodiment of the present invention will be described. In this embodiment, prediction residuals obtained by using the short-term prediction filter are encoded. In this embodiment, an example in which the magnitude of the PARCOR coefficient is used as the index to set the additional value will be described. In addition, as a specific criterion, the criterion in ((Example 1)) will be illustrated. Furthermore, in the example in this embodiment, the predetermined values TH1 and TH2 are set to fall within a range from 0 to the maximum amplitude value MAX both inclusive (0≤TH1<TH2≤MAX), the additional value a(r) in the case where the second-segment parameter s is equal to or smaller than the predetermined value TH1 is set to be equal to or smaller than the additional value a(r) in the case where the second-segment parameter is greater than the predetermined value TH1 and smaller than the predetermined value TH2, and the additional value a(r) in the case where the second-segment parameter s is equal to or greater than the predetermined value TH2 is set to be equal to or smaller than the additional value a(r) in the case where the second-segment parameter s is greater than the predetermined value TH1 and smaller than the predetermined value TH2. Note that these conditions are not intended to limit the scope of the present invention.

(Configuration)

Figure 1:
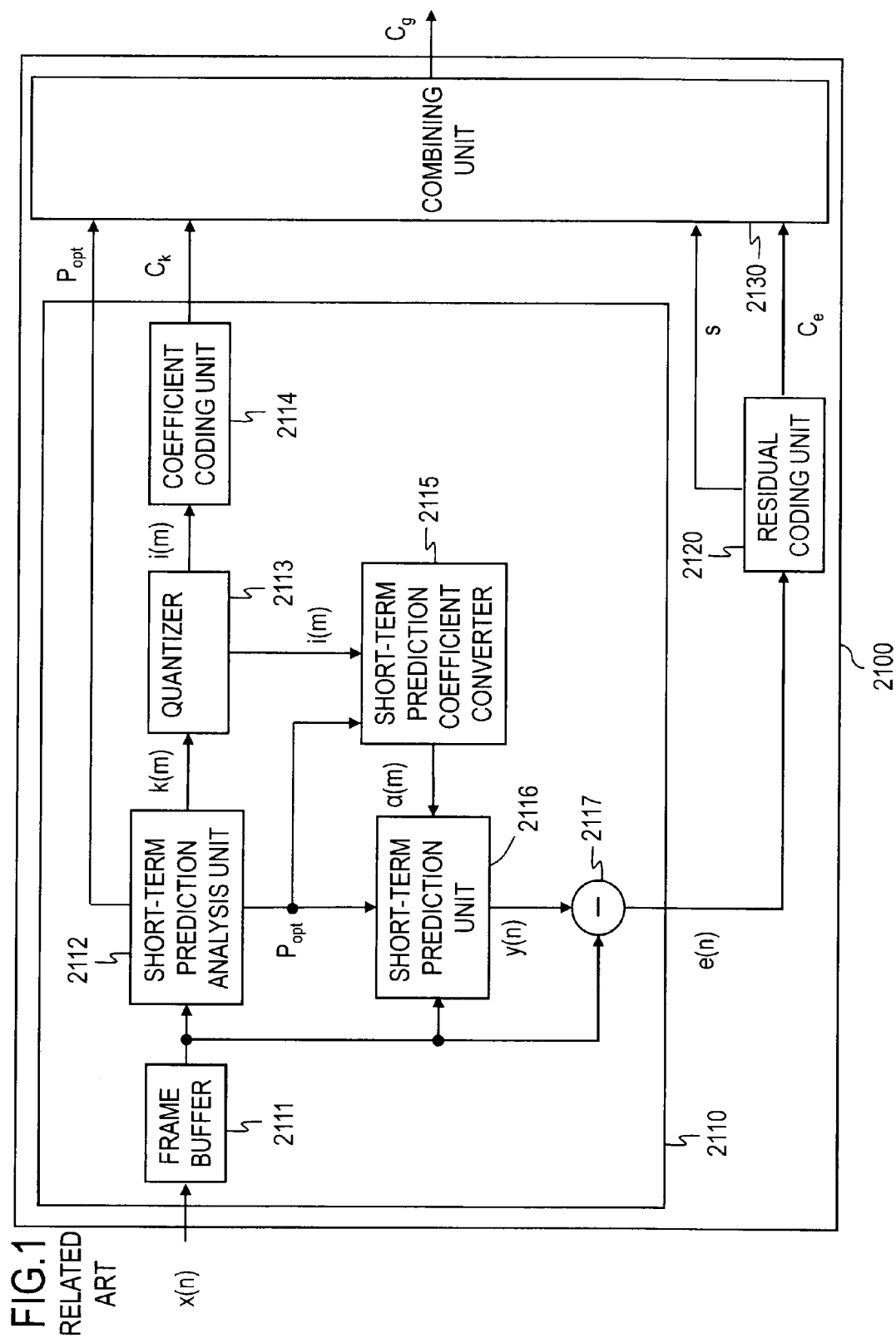
FIG. 1 is a block diagram for illustrating a functional configuration of an encoder based on a conventional predictive coding scheme.
Figure 2:
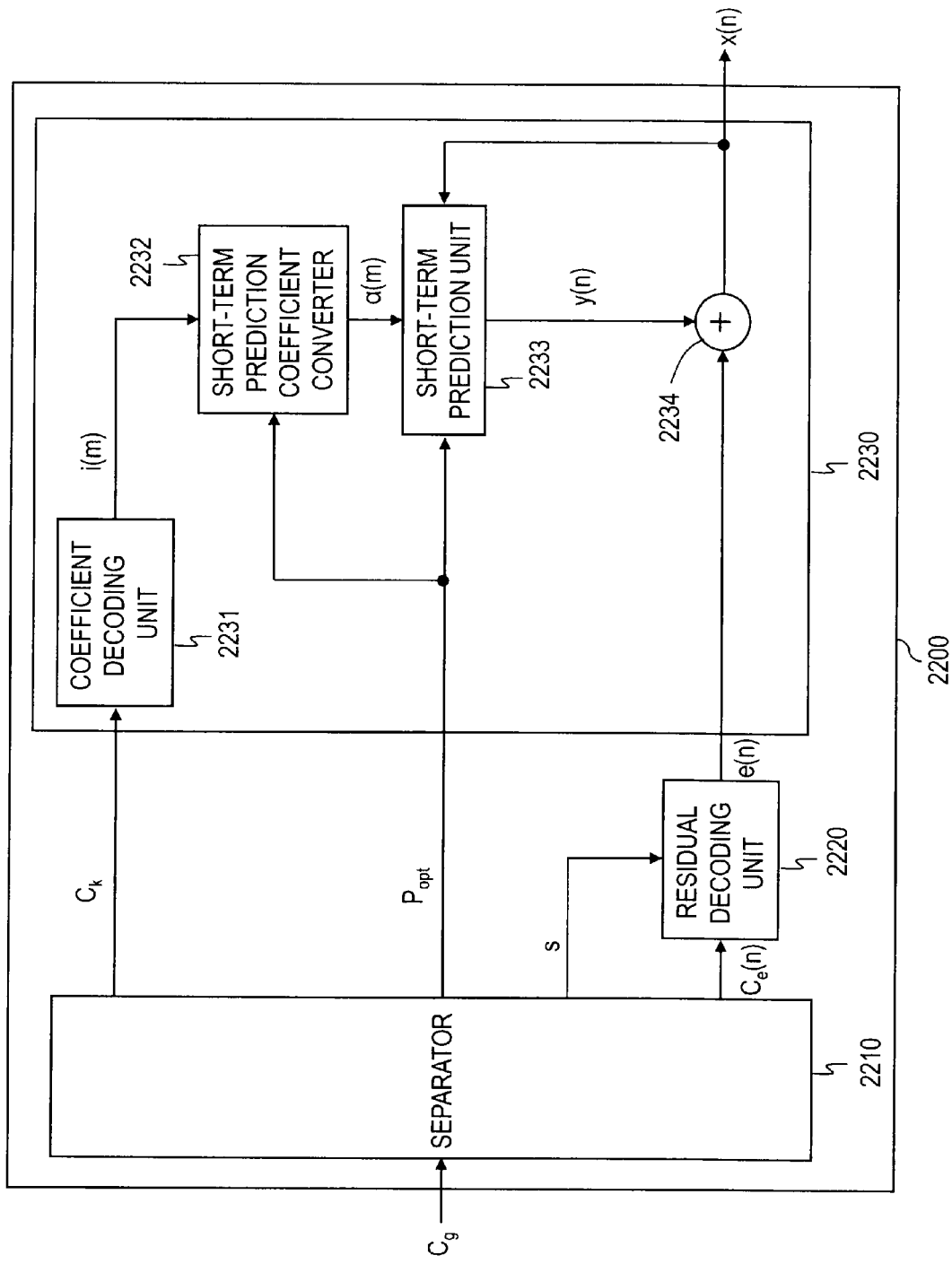
FIG. 2 is a block diagram for illustrating a functional configuration of a decoder based on the conventional predictive coding scheme.
Figure 3A:
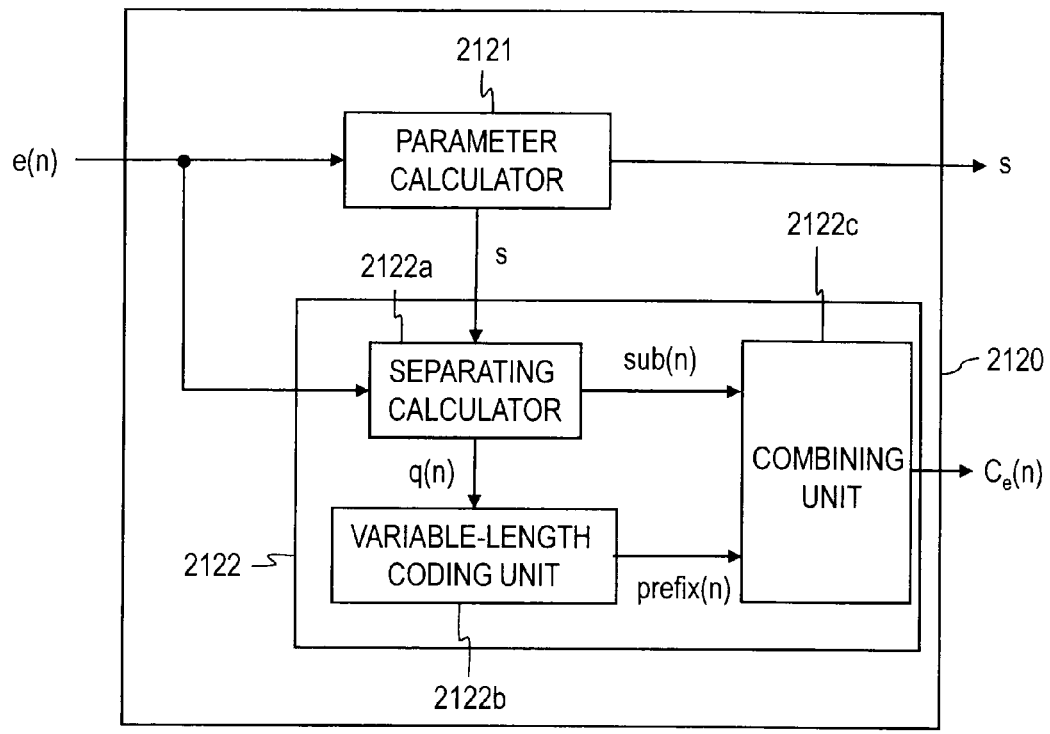
FIG. 3A is a block diagram for illustrating a functional configuration of a residual coding unit shown in FIG. 1.
Figure 3B:
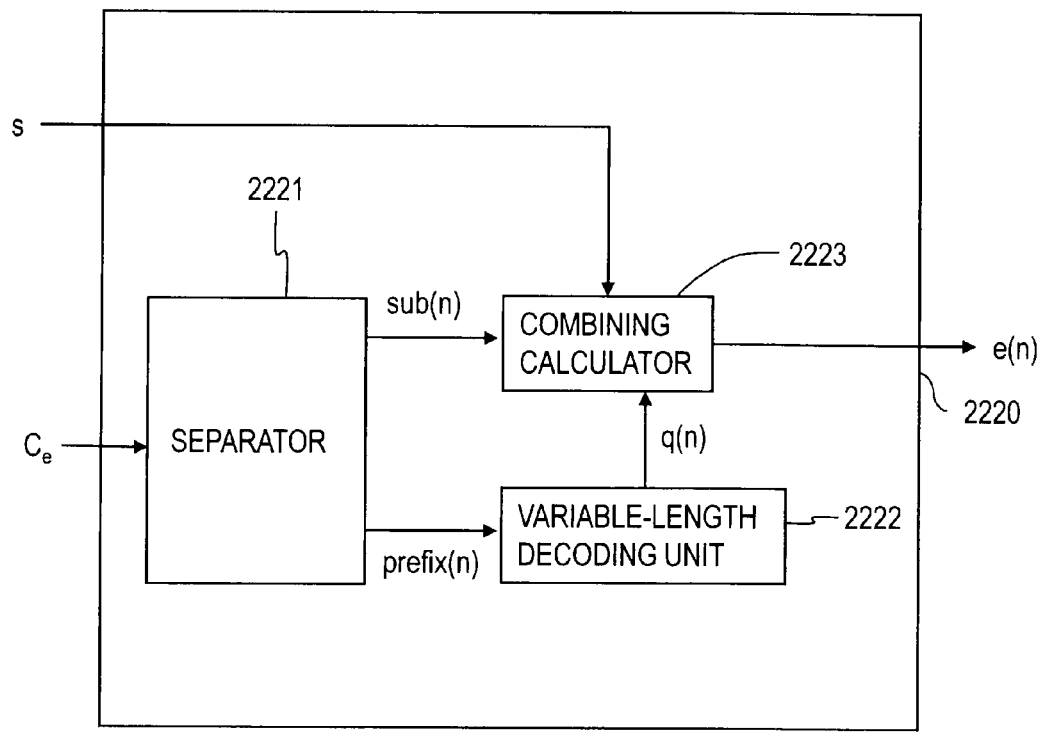
FIG. 3B is a block diagram for illustrating a functional configuration of a residual decoding unit shown in FIG. 2.
Figure 8:
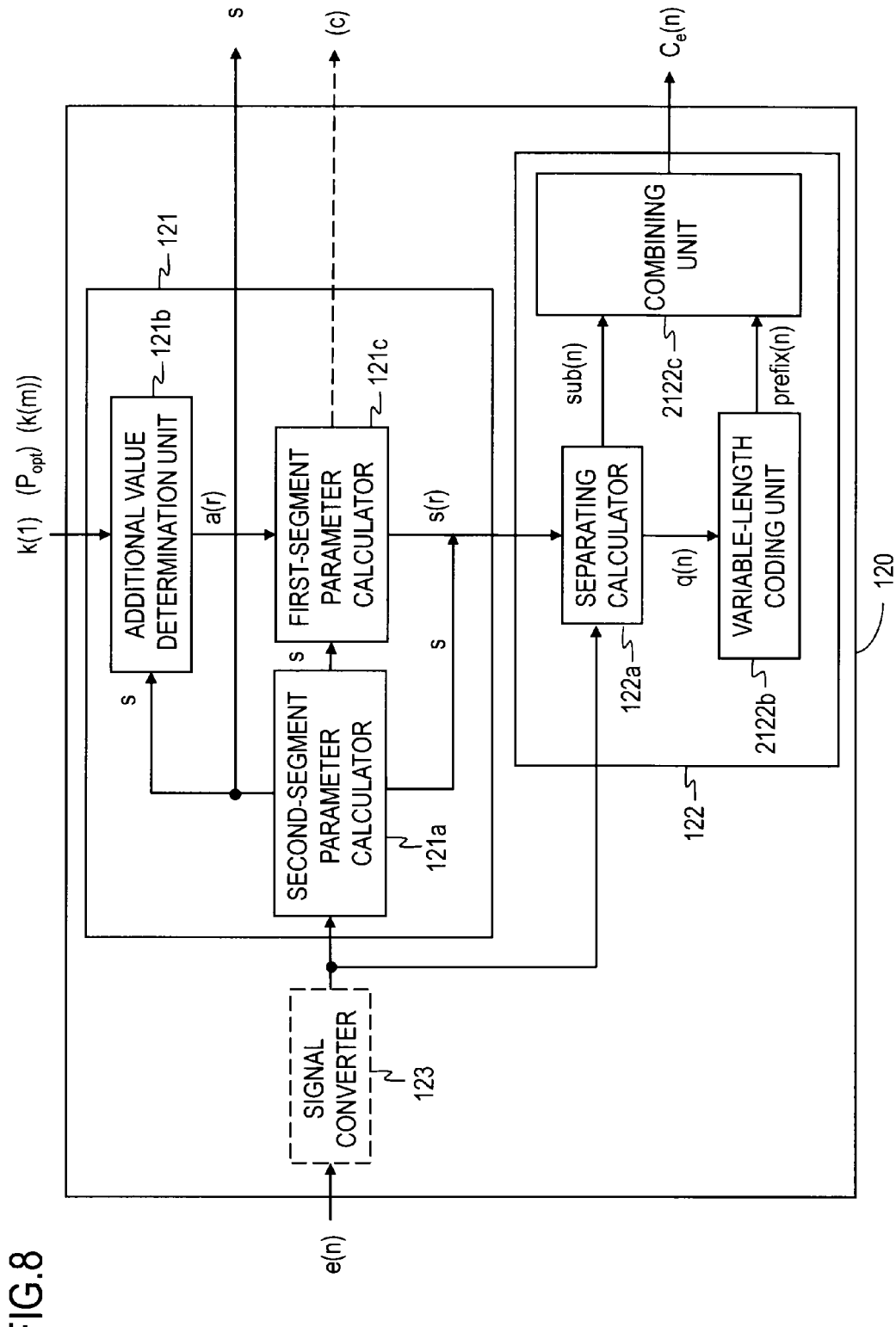
FIG. 8 is a block diagram for illustrating a functional configuration of a residual coding unit shown in FIG. 7.
Figure 9:
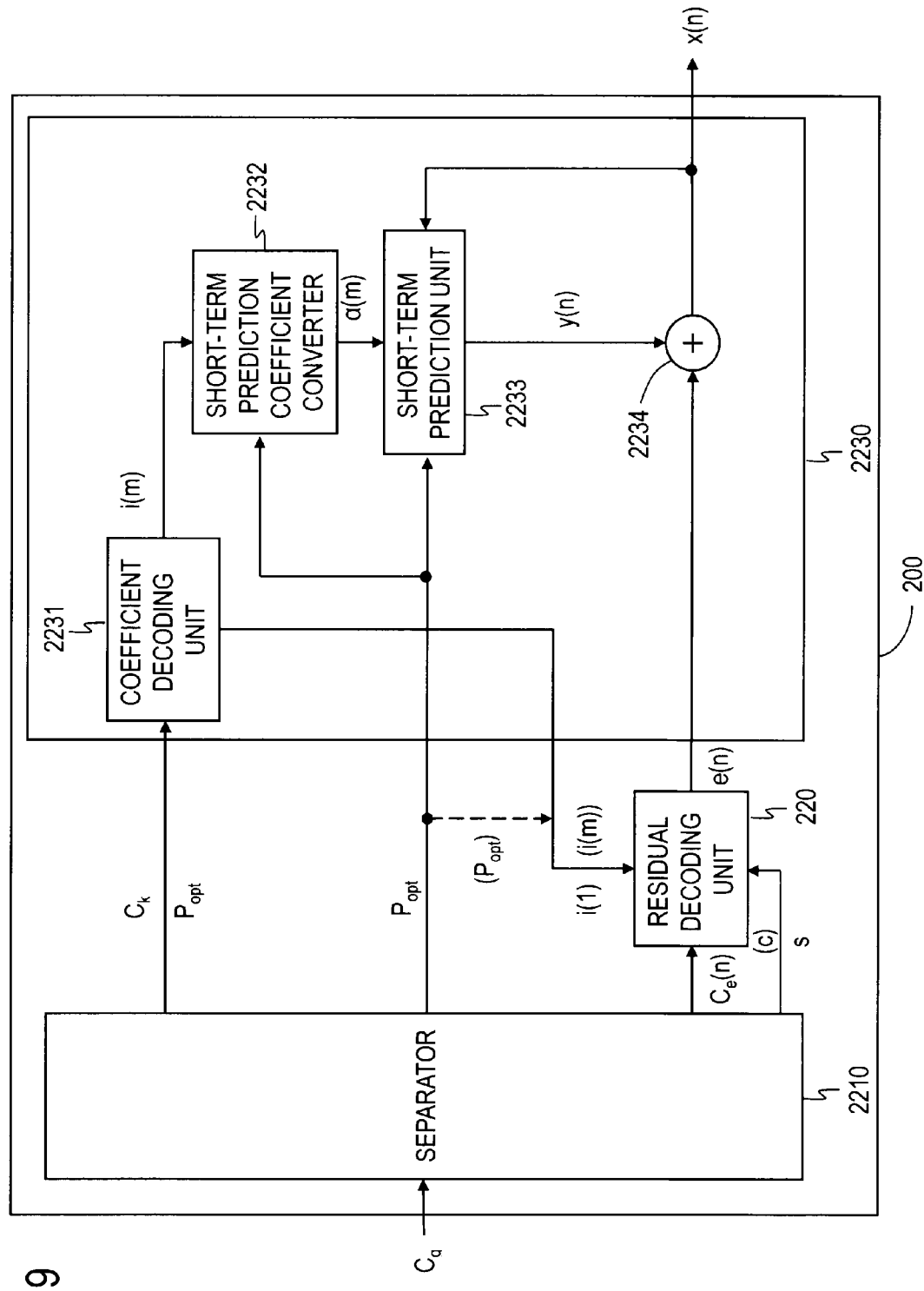
FIG. 9 is a block diagram for illustrating a functional configuration of a decoder according to the first embodiment.
Figure 10:
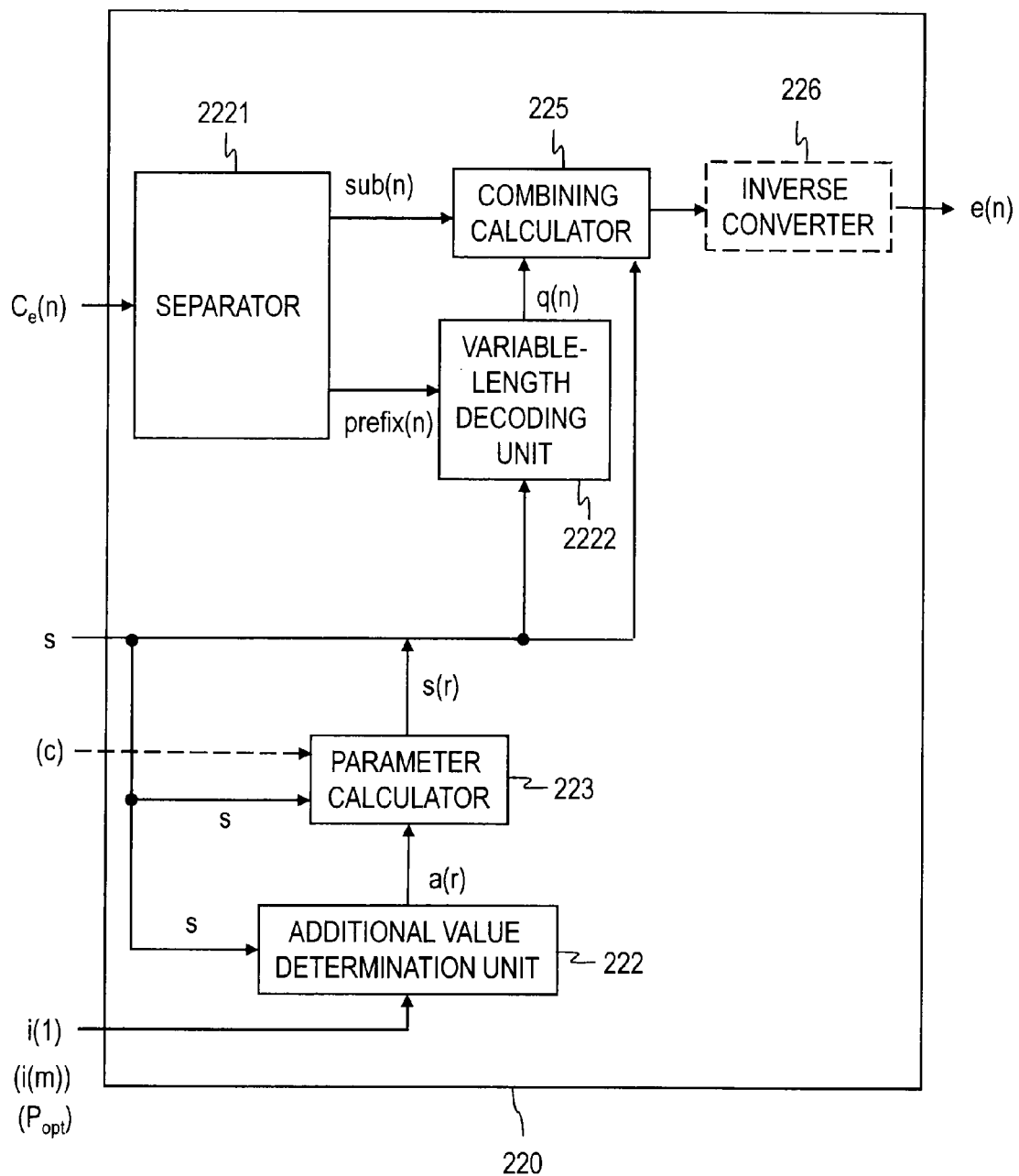
FIG. 10 is a block diagram for illustrating a functional configuration of a residual decoding unit shown in FIG. 9.

FIG. 7 is a block diagram for illustrating a functional configuration of an encoder 100 according to the first embodiment, and FIG. 8 is a block diagram for illustrating a functional configuration of a residual coding unit 120 shown in FIG. 7. FIG. 9 is a block diagram for illustrating a functional configuration of a decoder 200 according to the first embodiment, and FIG. 10 is a block diagram for illustrating a functional configuration of a residual decoding unit 220 shown in FIG. 9. In these drawings, the same components as those shown in FIGS. 1 to 3 are denoted by the same reference numerals, and descriptions thereof will be omitted.

As shown in FIG. 7, the encoder 100 according to this embodiment comprises a predictive coding unit 2110, the residual coding unit 120, and a combining unit 2130. As shown in FIG. 8, the residual coding unit 120 comprises a parameter calculator 121 and a coding unit 122. The parameter calculator 121 comprises a second-segment parameter calculator 121a, an additional value determination unit 121b, and a first-segment parameter calculator 121c. The coding unit 122 comprises a separating calculator 122a, a variable length coding unit 2122b, and a combining unit 2122c.

As shown in FIG. 9, the decoder 200 according to this embodiment comprises a separator 2210, the residual decoding unit 220, and a predictive decoding unit 2230. As shown in FIG. 10, the residual decoding unit 220 comprises a separator 2221, a variable length decoding unit 224, a combining calculator 225, an additional value determination unit 222, and a parameter calculator 223.

The encoder 100 and the decoder 200 according to this embodiment are, for example, a special apparatus formed by a well-known computer or a dedicated computer that comprises a central processing unit (CPU), a random-access memory (RAM) and a read-only memory (ROM), for example, and is loaded with a predetermined program, which is executed by the CPU. An example of the frame buffer 2111 is a memory, such as a RAM, a cache memory and a register, and the other processing units are each implemented by the CPU executing a predetermined program. Alternatively, an electronic circuit, such as an integrated circuit, may form at least part of these processing units. As required, the encoder 100 or the decoder 200 may additionally comprise a temporary memory that stores data that is output from the processing units and can be read out when the processing units perform another processing. Such implementations of the processing units apply to the other embodiments described below and modifications thereof.

(Encoding Method)

Figure 11:
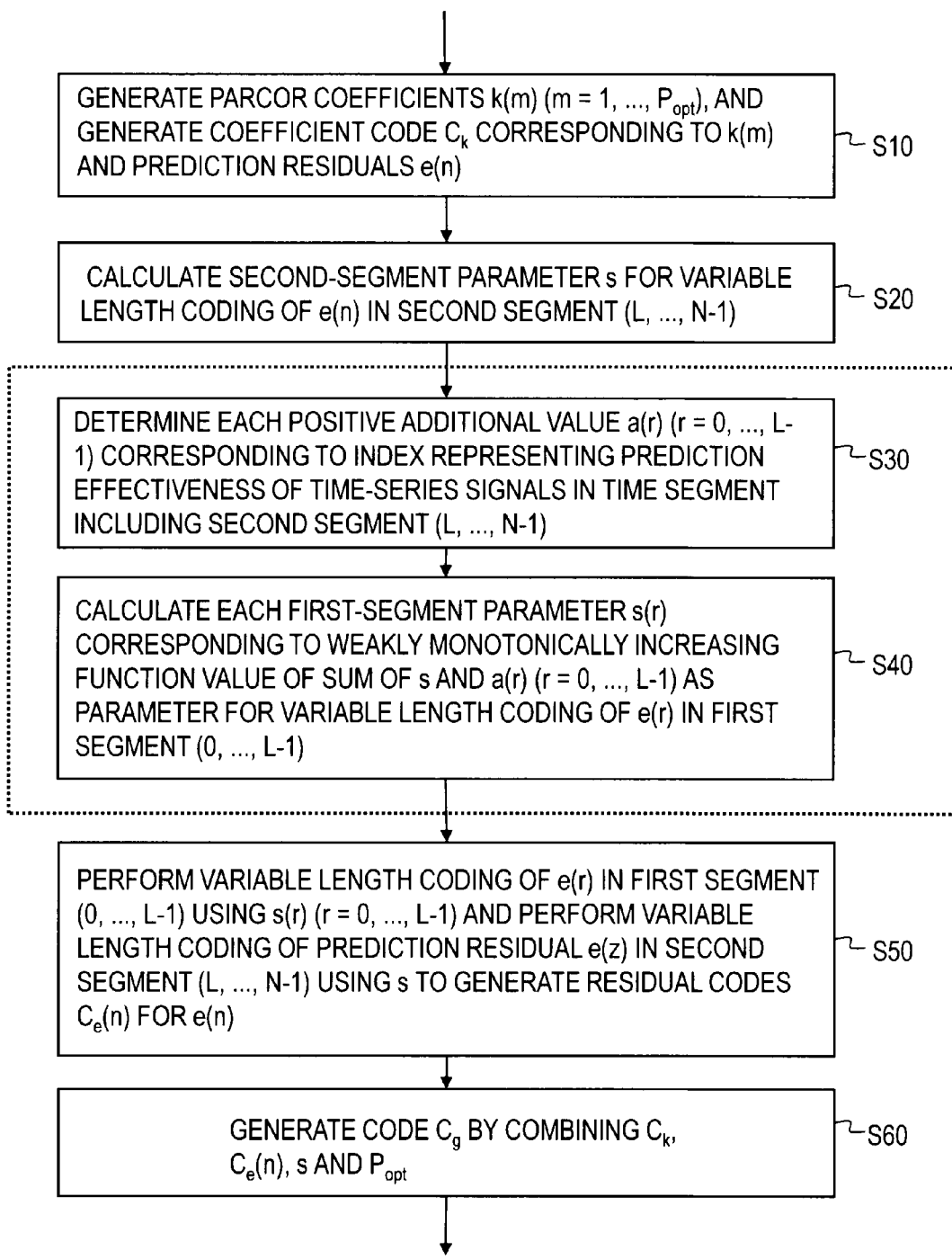
FIG. 11 is a flow chart for illustrating an encoding method according to the first embodiment.
Figure 12:
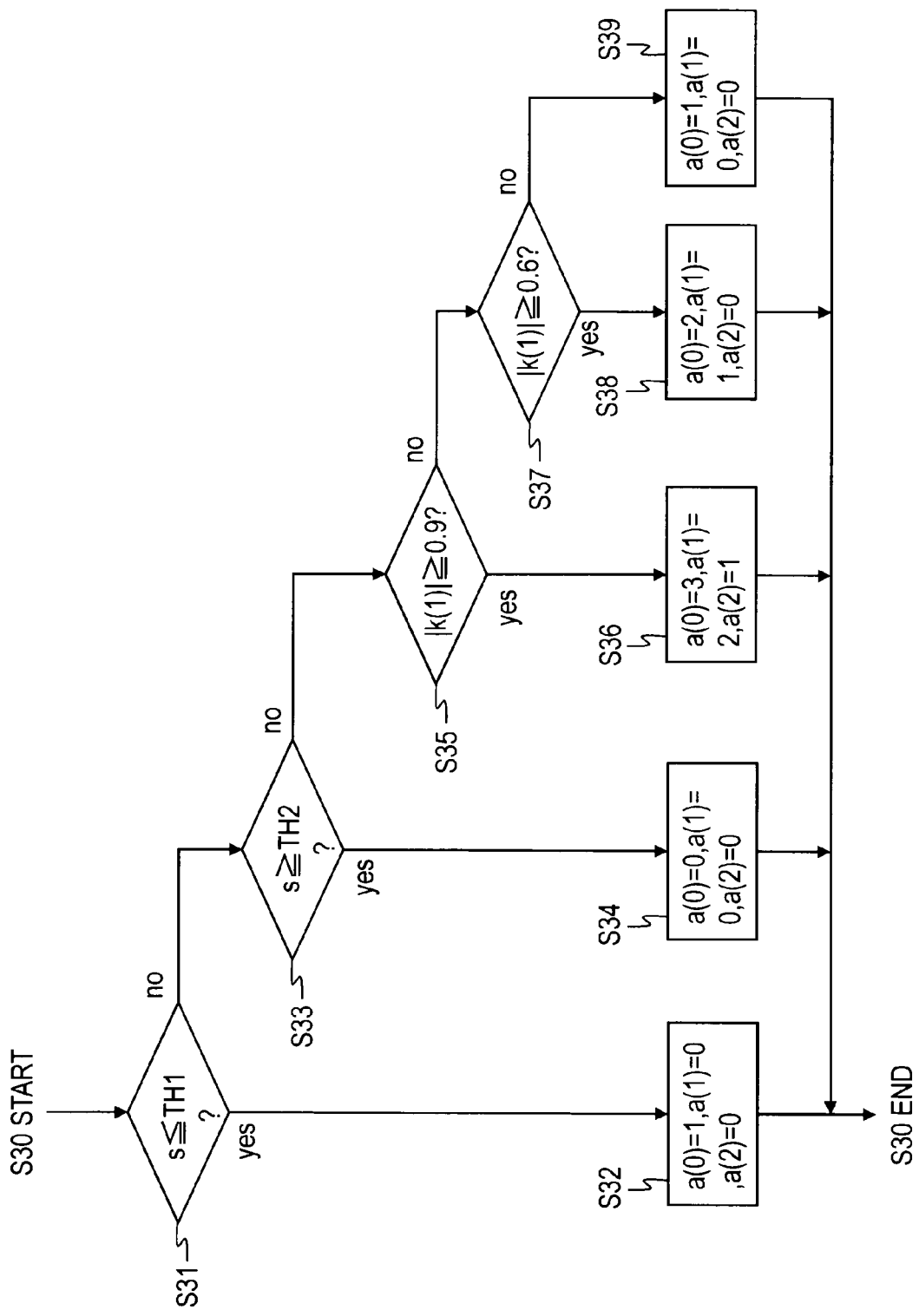
FIG. 12 is a flow chart for illustrating an example of step S30 in FIG. 11.
Figure 13:
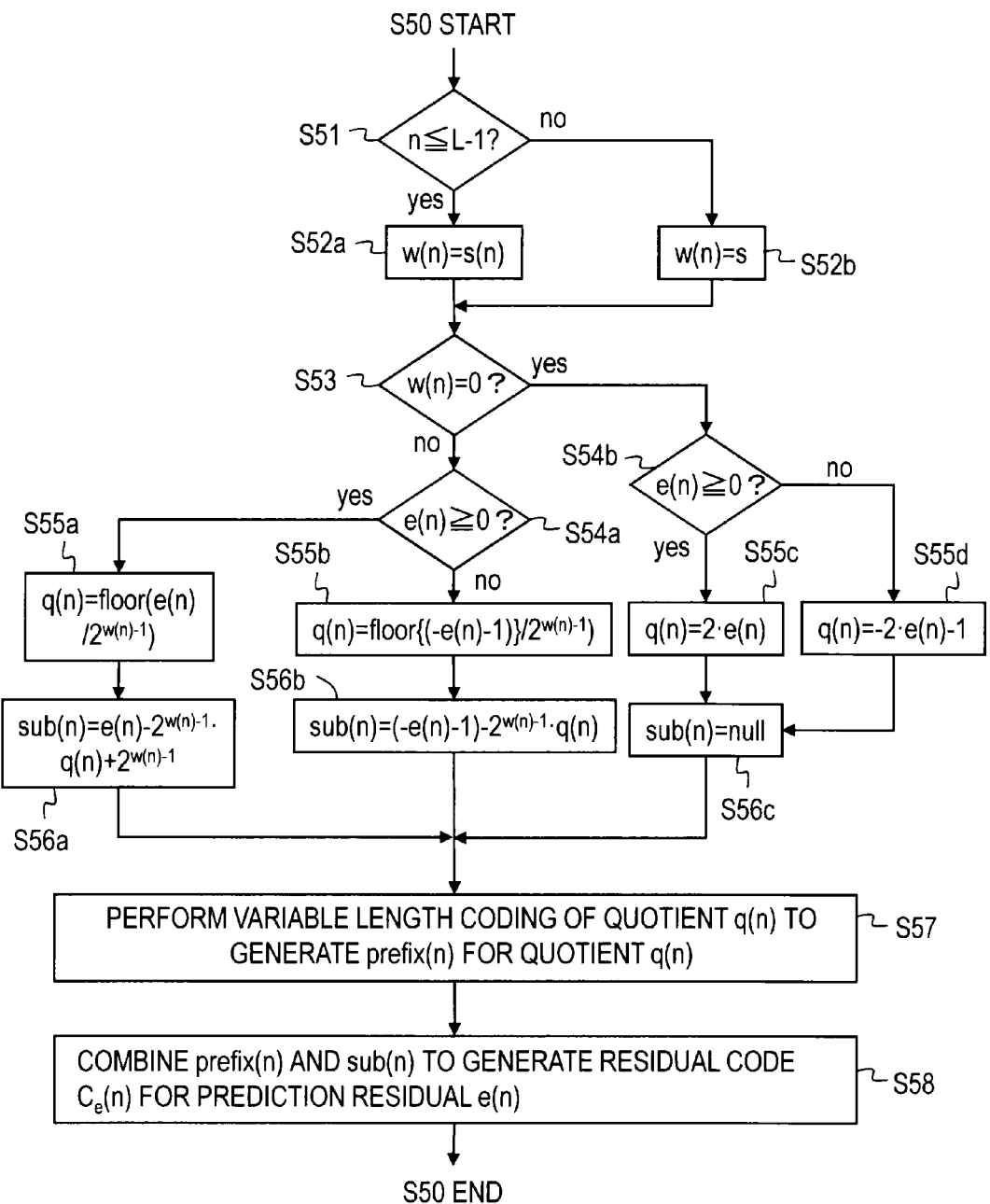
FIG. 13 is a flow chart for illustrating details of step S50 in FIG. 11.

FIG. 11 is a flow chart for illustrating an encoding method according to the first embodiment. FIG. 12 is a flow chart for illustrating an example of step S30 in FIG. 11, and FIG. 13 is a flow chart for illustrating details of step S50 in FIG. 11. In the following, the encoding method according to this embodiment will be described with reference to these drawings.

Time-series signals $x(n)$ that are sampled and quantized in the PCM format are input to the predictive coding unit 2110 in the encoder 100 (FIG. 7). These time-series signals $x(n)$ may be linearly quantized signals (sometimes referred to also as "uniformly quantized signals"), or nonlinearly quantized signals (sometimes referred to also as "nonuniformly quantized signals"), such as companded quantization signals (see ITU-T Recommendation G.711, "Pulse Code Modulation (PCM) of Voice Frequencies", for example). The time-series signals $x(n)$ may not be signals in the PCM format or signals that are not quantized.

One frame of time-series signals $x(n)$ ($n=0, \ldots, N-1$) buffered in the frame buffer 2111 are passed to the short-term prediction analysis unit 2112. The short-term prediction analysis unit 2112 performs short-term prediction analysis of the time-series signals $x(n)$ ($n=0, \ldots, N-1$), selects the optimum prediction order $P_{opt}$ from a range from the minimum prediction order $P_{min}$ to the maximum prediction order $P_{max}$ both inclusive, and generates the PARCOR coefficients $k(m)$ ($m=1, \ldots, P_{opt}$) for respective prediction orders m. The short-term prediction analysis unit 2112 may be configured to perform short-term prediction analysis of the time-series signals $x(n)$ directly, or to map the input nonlinearly quantized time-series signals $x(n)$ into linearly quantized signals or other nonlinearly quantized signals before performing the short-term prediction analysis. Then, a coefficient code $C_k$ corresponding to the PARCOR coefficients $k(m)$ ($m=1, 2, \ldots, P_{opt}$) are generated, and prediction residuals $e(n)$ ($n=0, \ldots, N-1$) are generated by the prediction filter processing described above (step S10).

The prediction residuals $e(n)$ ($n=0, \ldots, N-1$) are input to the second-segment parameter calculator 121a in the residual coding unit 120. Using the prediction residuals $e(n)$ ($n=0, \ldots, N-1$), the second-segment parameter calculator 121a calculates a positive second-segment parameter s that weakly monotonically increases with an increase of the average amplitude of the prediction residuals $e(\mu)$ ($\mu=\mu_{min}, \ldots, \mu_{max}$) in the time segment including the second segment $(L, \ldots, N-1)$ as a parameter for variable length coding of the prediction residuals $e(n)$ in the second segment $(L, \ldots, N-1)$. The calculation of the second-segment parameter is performed in the manner described above. For example, the second-segment parameter calculator 121a determines an integer obtained by quantizing the value of $\log_2 \{\ln 2 \cdot (2 \cdot D)\}$ as the second-segment parameter s (D represents the average amplitude of the prediction residuals $e(\mu)$ ($\mu=\mu_{min}, \ldots, \mu_{max}$) in the time segment including the second segment T2) (step S20).

Then, the first-order PARCOR coefficient $k(1)$ generated in step S10 and the second-segment parameter s generated in step S20 are input to the additional value determination unit 121b. Using these values, the additional value determination unit 121b determines each positive additional value $a(r)$ ($r=0, \ldots, L-1$) that weakly monotonically increases with a decrease of the ratio of the average amplitude of the prediction residuals $e(n)$ to the average amplitude of the time-series signals $x(\mu)$ ($\mu=\mu_{min}, \ldots, \mu_{max}$) in the time segment including the second segment $(L, \ldots, N-1)$. The additional value $a(r)$ in this example is a value that weakly monotonically increases with an increase of the degree of the autocorrelation among the time-series signals $x(n)$ ($n=0, \ldots, N-1$) in the discrete time segment $(0, \ldots, N-1)$. In addition, the additional value $a(r)$ in this example corresponds to the index representing the prediction effectiveness of the time-series signals $x(\mu)$ ($\mu=\mu_{min}, \ldots, \mu_{max}$) (step S30).

[Example of Step S30]

FIG. 12 shows an exemplary processing in the case where L=3. In this example, the additional value determination unit 121b first decides whether a condition that s≤TH1 is met or not (step S31). If the condition that s≤TH1 is met, the additional value determination unit 121b determines the additional values $a(0)=1$, $a(1)=0$, and $a(2)=0$ (step S32). If the condition that s≤TH1 is not met, the additional value determination unit 121b decides whether a condition that s≥TH2 is met or not (step S33). If the condition that s≥TH2 is met, the additional value determination unit 121b determines the additional values $a(0)=0$, $a(1)=0$, and $a(2)=0$ (step S34). Furthermore, if the condition that s≥TH2 is also not met, the additional value determination unit 121b decides whether a condition that $|k(1)|≥0.9$ is met or not (step S35). If the condition that $|k(1)|≥0.9$ is met, the additional value determination unit 121*b* determines the additional values a(0)=3, a(1)=2, and a(2)=1 (step S36). If the condition that |k(1)|≥0.9 is also not met, the additional value determination unit 121*b* decides whether a condition that |k(1)|≥0.6 is met or not (step S37). If the condition that |k(1)|≥0.6 is met, the additional value determination unit 121*b* determines the additional values a(0)=2, a(1)=1, and a(2)=0 (step S38). If the condition that |k(1)|≥0.6 is also not met, the additional value determination unit 121*b* determines the additional values a(0)=1, a(1)=0, and a(2)=0 (step S39). In this example, the additional values a(r) are determined using the absolute value |k(1)| of the first-order PARCOR coefficient k(1) as the index. However, in order to prevent the additional values a(r) selected in the encoder 100 from being different from the additional values a(r) selected in the decoder 200 (described later) because of the quantization error of the first-order PARCOR coefficient k(1), the additional values a(r) may be determined in the above-described manner using as the index the absolute value of the first-order PARCOR coefficient k(1) obtained by once quantizing the first-order PARCOR coefficient k(1) and then performing inverse quantization of the resulting quantized first-order PARCOR coefficient (this is the end of the description of [Example of step S30]).

Then, the second-segment parameter s generated in step S20 and the additional values a(r) (r=0, ..., L−1) generated in step S30 are input to the first-segment parameter calculator 121*c*. Using these values, the first-segment parameter calculator 121*c* calculates first-segment parameters s(r)=s+a(r), which are the sums of the second-segment parameter s and the additional values a(r) (r=0, ..., L−1), respectively, as parameters for variable length coding of the prediction residuals e(r) at discrete times r in the first segment (0, ..., L−1) (step S40).

Then, the second-segment parameter s generated in step S20, the first-segment parameters s(r) (r=0, ..., L−1) generated in step S40 and the prediction residuals e(n) (n=0, ..., N−1) are input to the coding unit 2122. The coding unit 2122 performs variable length coding of the prediction residuals e(r) at the discrete times r in the first segment (0, ..., L−1) using the first-segment parameters s(r) (r=0, ..., L−1) and performs variable length coding of the prediction residuals e(z) at discrete times z (z=L, ... N−1) in the second segment (L, ..., N−1) using the second-segment parameter s to generate residual codes $C_e(n)$ corresponding to the prediction residuals e(n) (step S50). In an example of the coding method for the variable length coding of the prediction residuals e(z), each residual code $C_e(n)$ corresponding to the prediction residual e(n) is information that includes first information identifying integer quotient obtained by division using the prediction residual e(n) or integer not smaller than 0 that monotonically increase with increase in the absolute value of the prediction residual e(n), as a dividend, and integer depending on the parameter decided for the time segment corresponding to the prediction residual, as a modulus, and second information identifying the remainder obtained when the dividend are divided by the modulus. Examples of the coding method include a Golomb-Rice coding method, a Golomb coding method, and a variable length coding method in which the Alpha coding performed in a Golomb-Rice code or a Golomb code is replaced with a Huffman code.

[Example of Step S50]

FIG. 13 shows an example of the Golomb-Rice coding of the prediction residuals e(n). Although only a processing for a discrete time n will be described below, the same processing is actually performed for each of the discrete times n=0, ..., N−1.

In this example, the separating calculator 122*a* first decides whether or not n≤L−1 (step S51). This is intended to decide whether or not the relevant discrete time n belongs to the first segment T1. The separating calculator 122*a* determines that w(n)=s(n) if n≤L−1 (step S52*a*), and determines that w(n)=s if n>L−1 (step S52*b*).

Then, the separating calculator 122*a* decides whether w(n) is 0 or not (step S53). If it is not decided that w(n)=0, the separating calculator 122*a* decides whether or not the input prediction residual e(n) is equal to or greater than 0 (step S54*a*). If it is decided that e(n)≥0, the separating calculator 122*a* generates the integer quotient q(n) according to the following formula (6) (step S55*a*), generates information sub (n) for identifying the remainder according to the following formula (7), and outputs them (step S56*a*).

$$q(n) = \text{floor}(e(n)/2^{w(n)-1}) \text{ (for } e(n) \geq 0) \tag{6}$$

$$\text{sub}(n) = e(n) - 2^{w(n)-1} \cdot q(n) + 2^{w(n)-1} \text{ (for } e(n) \geq 0) \tag{7}$$

On the other hand, if it is decided that e(n) is not equal to or greater than 0 in step S54*a*, the separating calculator 122*a* generates the integer quotient q(n) according to the following formula (8) (step S55*b*) generates information sub(n) for identifying the remainder according to the following formula (9), and outputs them (step S56*b*).

$$q(n) = \text{floor}\{(-e(n)-1)/2^{w(n)-1}\} \text{ (for } e(n) < 0) \tag{8}$$

$$\text{sub}(n) = (-e(n)-1) - 2^{w(n)-1} \cdot q(n) \text{ (for } e(n) < 0) \tag{9}$$

On the other hand, if it is decided that w(n)=0 in step S53, the separating calculator 122*a* decides whether or not the input prediction residual e(n) is equal to or greater than 0 (step S54*b*). If it is decided that e(n)≥0, the separating calculator 122*a* generates the quotient q(n) according to the following formula (10) (step S55*c*) and outputs it while the information sub(n) is null (step S56*c*).

$$q(n) = 2 \cdot e(n) \text{ (for } e(n) \geq 0) \tag{10}$$

On the other hand, if it is decided that e(n) is not equal to or greater than 0 in step S54*b*, the separating calculator 122*a* generates the quotient q(n) according to the following formula (11) (step S55*d*) and outputs it while the information sub(n) is null (step S56*c*).

$$q(n) = -2 \cdot e(n) - 1 \text{ (for } e(n) < 0) \tag{11}$$

Then, the quotient q(n) output from the separating calculator 122*a* is input to the variable length coding unit 2122*b*. The variable length coding unit 2122*b* encodes the quotient q(n) according to a variable length coding method, such as the Alpha coding method, to generate information prefix(n) corresponding to the quotient q(n) and outputs the information prefix(n) (step S57).

Then, the information sub(n) output from the separating calculator 122*a* and the information prefix(n) output form the variable length coding unit 2122*b* are input to the combining unit 2122*c*. The combining unit 2122*c* combines the information prefix(n) and the information sub(n) to generate the residual code $C_e(n)$ corresponding to the prediction residual e(n) (step S58) (this is the end of the description of [Example of step S50]).

Then, the coefficient code $C_k$, the residual codes $C_e(n)$ (n=0, ..., N−1), the second-segment parameter s and the prediction order $P_{opt}$ are input to the combining unit 2130, and the combining unit 2130 combines these values to generate the code $C_g$ and outputs the code $C_g$ (step S60). In this embodiment, any special auxiliary information used by the decoder 200 only to decode the additional value a(r) does not have to be added to the code $C_g$.

(Decoding Method)

Figure 14:
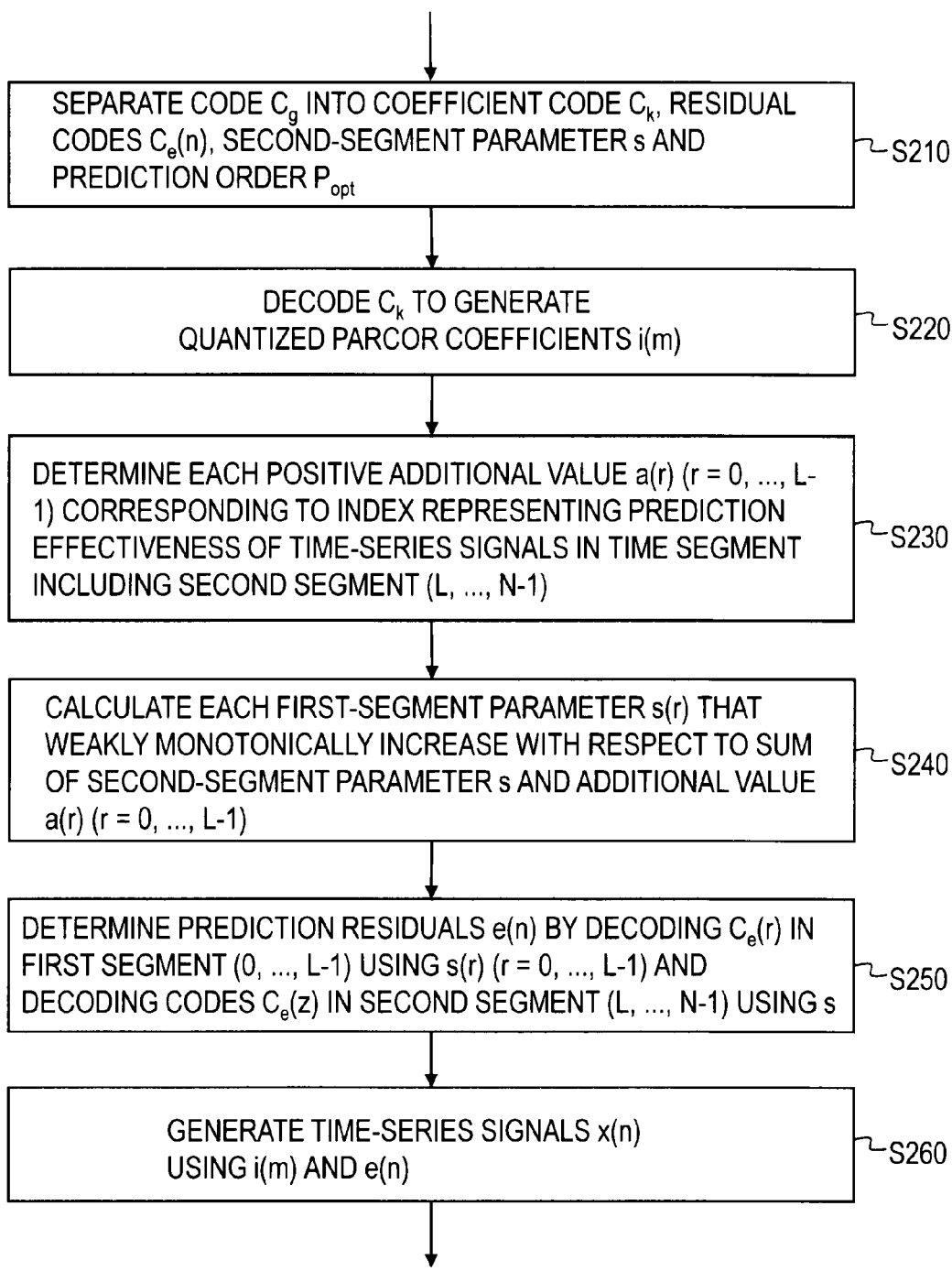
FIG. 14 is a flow chart for illustrating a decoding method according to the first embodiment.
Figure 15:
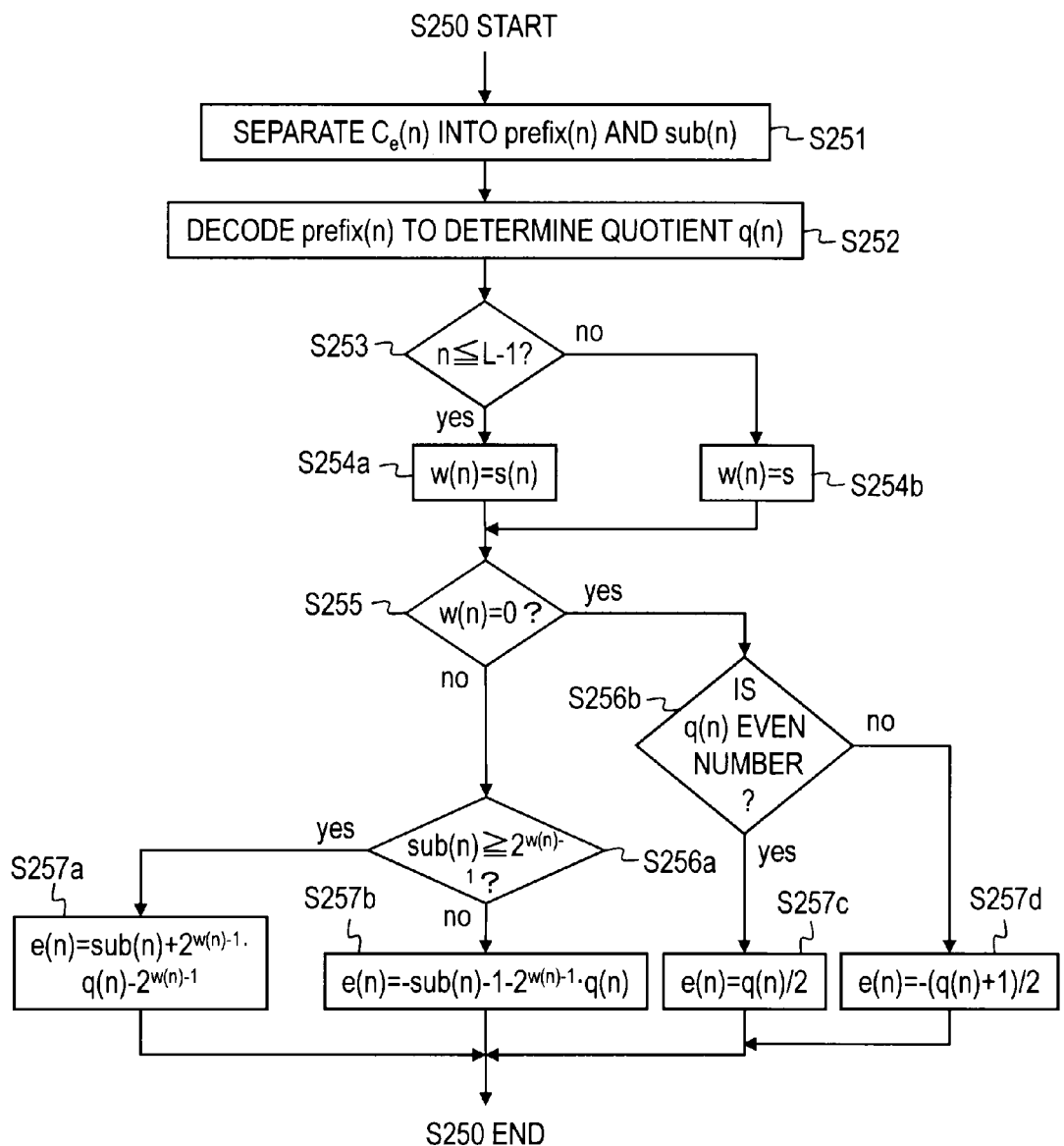
FIG. 15 is a flow chart for illustrating details of step S250.

FIG. 14 is a flow chart for illustrating a decoding method according to the first embodiment. FIG. 15 is a flow chart for illustrating details of step S250. In the following, the decoding method according to this embodiment will be described with reference to these drawings.

The separator 2210 in the decoder 200 (shown in FIG. 9) separates the code $C_g$ input to the decoder 200 into the coefficient code $C_k$ corresponding to the PARCOR coefficients, the residual codes $C_e(n)$ (n=0, ..., N−1) corresponding to the prediction residuals e(n) (n=0, ..., N−1), the second-segment parameter s and the optimum prediction order $P_{opt}$ (step S210).

The coefficient code $C_k$ is input to the coefficient decoding unit 2231, and the coefficient decoding unit 2231 decodes the coefficient code $C_k$ to generate the quantized PARCOR coefficients i(m)(m=1, ..., $P_{opt}$) (step S220).

Then, the second-segment parameter s output from the separator 2210 and the first-order quantized PARCOR coefficients i(1) output from the coefficient decoding unit 2231 are input to the additional value determination unit 222. Using these values, the additional value determination unit 222 determines each additional value a(r) (r=0, ..., L−1) that weakly monotonically increases with an increase of the degree of the autocorrelation among the time-series signals x(n) (n=0, ..., N−1) in the discrete time segment (0, ..., N−1). The determination of each of the additional values a(r) in this example is made based on the same criterion as in Step S30. According to the determination method illustrated in FIG. 12, the additional value determination unit 222 performs inverse quantization of the first-order quantized PARCOR coefficient i(1) to reproduce the first-order PARCOR coefficient k(1) and determines each of the additional values a(r) according to the procedure illustrated in FIG. 12 (step S230). Each of the additional values a(r) in this example corresponds to the index representing the prediction effectiveness of the time-series signals x(μ) (μ=$μ_{min}$, ..., $μ_{max}$).

Then, the second-segment parameter s output from the separator 2210 and each additional value a(r) (r=0, ..., L−1) output from the additional value determination unit 222 are input to the parameter calculator 223. The parameter calculator 223 calculates each first-segment parameter s(r) (r=0, ..., L−1), which is the sum of the second-segment parameter s and the additional value a(r) (r=0, ..., L−1) (step S240).

Then, the separator 2221, the variable length decoding unit 224 and the variable length decoding unit 2222 decode each residual code $C_e(r)$ (r=0, ..., L−1) at the discrete time r (r=0, ..., L−1) in the first segment (0, ..., L−1) using each first-segment parameter s(r) (r=0, ..., L−1), and decodes the residual codes $C_e(z)$ (z=L, ..., N−1) at the discrete times z (z=L, ..., N−1) in the second segment (L, ..., N−1) using the second-segment parameter s, thereby determining the prediction residuals e(n) (n=0, ..., N−1) (step S250).

[Example of Step S250]

FIG. 15 shows an example of the decoding of the Golomb-Rice codes of the prediction residuals e(n). Although only a processing for a discrete time n will be described below, the same processing is actually performed for each of the discrete times n=0, ..., N−1.

First, the residual code $C_e(n)$ is input to the separator 2221. The separator 2221 separates the residual code $C_e(n)$ into the information prefix(n) and the information sub(n) (step S251). The information prefix(n) is input to the variable length decoding unit 2222. The variable length decoding unit 2222 decodes the information prefix(n) to determine the quotient q(n) (step S252).

Then, the information sub(n) output from the separator 2221, the quotient q(n) output from the variable length decoding unit 2222, the first-segment parameter s(r) (r=0, ..., L−1) output from the parameter calculator 223 and the second-segment parameter s are input to the combining calculator 225.

The combining calculator 225 decides whether or not n≤L−1 (step S253). This is intended to decide whether or not the relevant discrete time n belongs to the first segment T1. The combining calculator 225 determines that w(n)=s(n) if n≤L−1 (step S254a), and determines that w(n)=s if n>L−1 (step S254b).

Then, the combining calculator 225 decides whether w(n) is 0 or not (step S255). If it is not decided that w(n)=0, the combining calculator 225 decides whether or not the information sub(n) is equal to or greater than $2^{w(n)-1}$ (step S256a). This decision corresponds to decision of whether or not the prediction residual e(n) is equal to or greater than 0. If it is decided that sub(n)≥$2^{w(n)-1}$ in step S256a, the combining calculator 225 calculates the prediction residual e(n) according to the following formula (step S257a).

$$e(n)=\text{sub}(n)+2^{w(n)-1} \cdot q(n)-2^{w(n)-1} \quad (12)$$

On the other hand, if it is decided that sub(n)<$2^{w(n)-1}$ in step S256a, the combining calculator 225 calculates the prediction residual e(n) according to the following formula (step S257b).

$$e(n)=-\text{sub}(n)-1-2^{w(n)-1} \cdot q(n) \quad (13)$$

On the other hand, if it is decided that w(n)=0 in step S255, the combining calculator 225 decides whether or not the information q(n) is an even number (step S256b). This decision corresponds to decision of whether or not the prediction residual e(n) is equal to or greater than 0. If it is decided that q(n) is an even number in step S256a, the combining calculator 225 calculates the prediction residual e(n) according to the following formula (step S257c).

$$e(n)=q(n)/2 \quad (14)$$

On the other hand, if it is decided that q(n) is an odd number in step S256b, the combining calculator 225 calculates the prediction residual e(n) according to the following formula (step S257d).

$$e(n)=-(q(n)+1)/2 \quad (15)$$

The prediction residual e(n) generated as described above is output from the combining calculator 225 (this is the end of the description of [Example of step S250]).

Then, using the prediction residuals e(n) (n=0, ..., N−1) output from the residual decoding unit 220 and the quantized PARCOR coefficients i(m) (m=1, ..., $P_{opt}$), the short-term prediction unit 2233 and the adder 2234 generates and outputs the time-series signals x(n) (n=0, ..., N−1) (step S260).

[Modification of First Embodiment]

In this embodiment, in coding of the prediction residuals e(n), the additional value determination unit 121b (FIG. 8) in the encoder 100 determines each additional value a(r) (r=0, ..., L−1) that weakly monotonically increases with an increase of the PARCOR coefficient of a certain order obtained by short-term prediction analysis of the time-series signals x(n) (n=0, ..., N−1) in a frame. And in decoding, the additional value determination unit 222 in the decoder 200 determines each additional value a(r) that weakly monotonically increases with an increase of the absolute value of the PARCOR coefficient of that order using the decoded value of the code corresponding to the PARCOR coefficient of that order. However, as described above, the additional value a(r) may be determined according to other criteria.

For example, in coding of the prediction residuals e(n), the optimum prediction order $P_{opt}$ adaptively selected during the short-term prediction analysis of the time-series signals x(n) (n=0, ..., N−1) in a frame may be input to the additional value determination unit 121b (FIG. 8) in the encoder 100, and the additional value determination unit 121b may determine each additional value a(r) that weakly monotonically increases with an increase of the optimum prediction order $P_{opt}$. In this case, in decoding, the optimum prediction order $P_{opt}$ output from the separator 2210 is input to the additional value determination unit 222 in the decoder 200, and the additional value determination unit 222 determines each additional value a(r) according to the same criterion as used in the additional value determination unit 121b.

In an alternative example, in coding of the prediction residuals e(n), the first-order to P-th-order PARCOR coefficients k(m) (m=1, ..., P) obtained by short-term prediction analysis of the time-series signals x(n) (n=0, ..., N−1) in a frame (P=$P_{opt}$, for example) may be input to the additional value determination unit 121b (FIG. 8) in the encoder 100, and the additional value determination unit 121b may determine each additional value a(r) that weakly monotonically decreases with an increase of $\Pi_{m=1}^{P}\{1-k(m)^2\}$. In this case, in decoding, the first-order to P-th-order quantized PARCOR coefficients i(m) output from the coefficient decoding unit 2231 (which correspond to "the decoded values of the code corresponding to the first-order to P-th-order PARCOR coefficients") are input to the additional value determination unit 222 in the decoder 200, and the additional value determination unit 222 reproduces the first-order to P-th-order PARCOR coefficients k(m) by inverse quantization of the quantized PARCOR coefficients and determines each additional value a(r) according to the same criterion as used in the additional value determination unit 121b.

In an alternative example, in coding of the prediction residuals e(n), the first-order to P-th-order PARCOR coefficients k(m) (m=1, ..., P) obtained by short-term prediction analysis of the time-series signals x(n) (n=0, ..., N−1) in a frame may be input to the additional value determination unit 121b (FIG. 8) in the encoder 100, and the additional value determination unit 121b may determine the additional value a(r) (r=0) that weakly monotonically increases with an increase of $1-\Pi_{m=1}^{P}\{1-k(m)^2\}$ and determine each additional value a(r) (0<r<P) that weakly monotonically increases with an increase of $\Pi_{m=1}^{r}\{1-k(m)^2\}-\Pi_{m=1}^{P}\{1-k(m)^2\}$. In this case, in decoding, the first-order to P-th-order quantized PARCOR coefficients i(m) (m=1, ..., P) output from the coefficient decoding unit 2231 are input to the additional value determination unit 222 in the decoder 200, and the additional value determination unit 222 reproduces the first-order to P-th-order PARCOR coefficients k(m) (m=1, ..., P) by inverse quantization of the quantized PARCOR coefficients and determines the additional values a(r) (r=0) and a(r) (0<r<P) according to the same criterion as used in the additional value determination unit 121b.

The different criteria described above may be used in combination. For example, the additional value a(r) may be determined using different criteria for different discrete times r.

In addition, if the unit of the encoding process can be switched between the frame and the sub-frame, the additional value determination units 121b and 222 can determine a larger additional value a(r) when unit of the process is the frame than when the unit of the process is the sub-frame.

Furthermore, in this embodiment, there has been described an example in which the predetermined values TH1 and TH2 are set to fall within a range from 0 to the maximum amplitude value MAX both inclusive (0≤TH1<TH2≤MAX), and the additional value a(r) in which the second-segment parameter s is equal to or smaller than the predetermined value TH1 is equal to or smaller than the additional value a(r) in which the second-segment parameter is greater than the predetermined value TH1 and smaller than the predetermined value TH2 (a lower limit criterion), and the additional value a(r) in which the second-segment parameter s is equal to or greater than the predetermined value TH2 is equal to or smaller than the additional value a(r) in which the second-segment parameter s is greater than the predetermined value TH1 and smaller than the predetermined value TH2 (an upper limit criterion). However, such a criterion that uses the predetermined values TH1 and TH2 may not be used. Alternatively, one of the upper limit criterion and the lower limit criterion may be used, for example.

As a further alternative, the residual coding unit 120 (FIG. 8) may comprise a signal converter 123 that maps the prediction residuals e(n) to integer values thereof, and the residual decoding unit 220 (FIG. 9) may comprise an inverse converter 226 that performs an inverse conversion of the mapping performed by the signal converter 123. In this case, the second-segment parameter calculator 121a uses the output values of the signal converter 123 to calculate the second-segment parameter s that weakly monotonically increases with an increase of the average amplitude of the prediction residuals in the time segment including the second segment T2, and the coding unit 2122 encodes the output values of the signal converter 123. In the residual decoding unit 220, the inverse converter 226 performs the inverse conversion of the output values of the combining calculator 225 and outputs the resulting values as the decoded prediction residuals e(n). The signal converter 123 performs the mapping according to a predetermined rule. For example, the signal converter 123 maps the input prediction residuals e(n) to odd integers while maintaining the magnitude relation therebetween if the prediction residuals e(n) are equal to or greater than 0, and maps the input prediction residuals e(n) to even numbers while maintaining the magnitude relation between the absolute values thereof if the prediction residuals e(n) are smaller than 0.

Furthermore, in this embodiment, the first-segment parameter calculator 121c in the encoder 100 determines the sum of the second-segment parameter s and each additional value a(r) (r=0, ..., L−1) as each first-segment parameter s(r) (r=0, ..., L−1) (step S40), and the parameter calculator 223 in the decoder 200 determines the sum of the second-segment parameter s and each additional value a(r) (r=0, ..., L−1) as each first-segment parameter s(r) (r=0, ..., L−1) (step S240). However, the first-segment parameter calculator 121c in the encoder 100 may determine each corrected value that weakly monotonically increases with respect to the sum of the second-segment parameter s and the additional value a(r) (r=0, ..., L−1) as each first-segment parameter s(r) (r=0, ..., L−1), and the parameter calculator 223 in the decoder 200 may determine each corrected value that weakly monotonically increases with respect to the sum of the second-segment parameter s and the additional value a(r) (r=0, ..., L−1) as each first-segment parameter s(r) (r=0, ..., L−1). In this case, the first-segment parameter calculator 121c may output auxiliary information c that represents the content of the correction for generating each first-segment parameter s(r) (r=0, ..., L−1), and the code $C_g$ including the auxiliary information c may be provided to the decoder 200. An example of the auxiliary information c is the difference between a Rice parameter or other parameter actually calculated from the average amplitude of the prediction residuals e(r) (r=0, ..., L−1) in the first segment T1 and the sum of the second-segment parameter s and the additional value a(r) (r=0, ..., L−1). In this case, the first-segment parameter s(r) is expressed by a formula: s(r)=s+a(r)+c. If the content of the correction is fixed, such as in the case where the first-segment parameter s(r) is the sum of the second-segment parameter s and the additional value a(r) (r=0, ..., L−1) multiplied by a constant const (s(r)=const·(s+a(r))), the code $C_g$ does not have to include the auxiliary information c.

[Second Embodiment]

Next, a second embodiment of the present invention will be described. In this embodiment, the code $C_g$ includes auxiliary information used in the decoder 200 for decoding the additional value a(r). In this case, although the auxiliary information adds to the code amount of the code $C_g$, the additional value a(r) can be set with higher flexibility. Thus, depending on the method of setting the additional value a(r), the code amount of the code $C_g$ can be reduced. The following description will be focused mainly on differences from the first embodiment, and descriptions of features common to the first embodiment will be omitted.

(Configuration)

Figure 16:
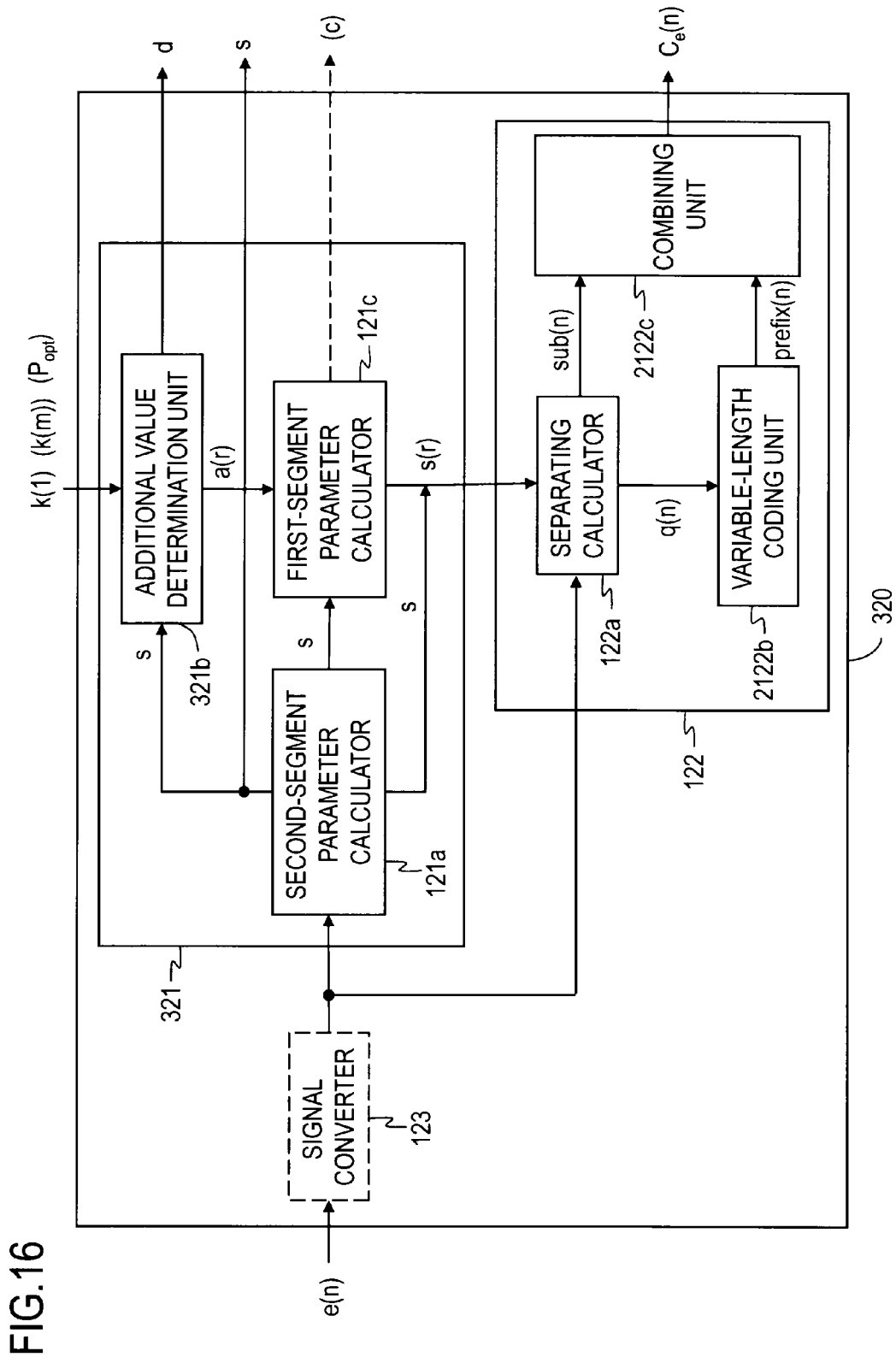
FIG. 16 is a block diagram for illustrating a functional configuration of a residual decoding unit in an encoder according to a second embodiment.
Figure 17:
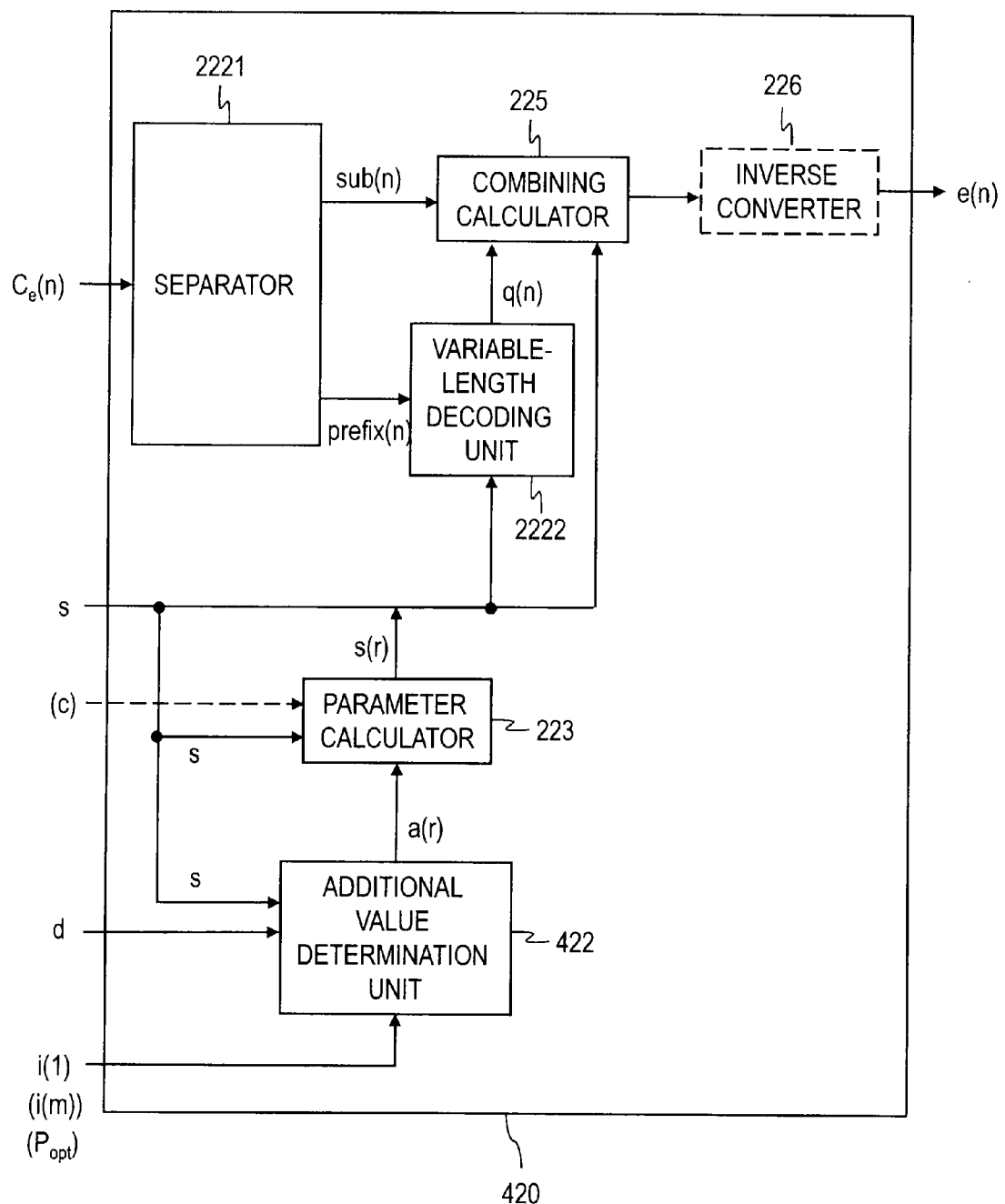
FIG. 17 is a block diagram for illustrating a functional configuration of a residual decoding unit in a decoder according to the second embodiment.

FIG. 16 is a block diagram for illustrating a functional configuration of a residual decoding unit 320 in an encoder according to the second embodiment. FIG. 17 is a block diagram for illustrating a functional configuration of a residual decoding unit 420 in a decoder according to the second embodiment. In these drawings, the same components as those in the first embodiment are denoted by the same reference numerals, and descriptions thereof will be omitted.

The encoder according to this embodiment is the encoder 100 according to the first embodiment with the residual coding unit 120 replaced with the residual coding unit 320 shown in FIG. 16. The residual coding unit 320 differs from the residual coding unit 120 in an additional value determination unit 321b in a parameter calculator 321. The decoder according to this embodiment is the decoder 200 according to the first embodiment with the residual decoding unit 220 replaced with the residual decoding unit 420 shown in FIG. 17. The residual decoding unit 420 differs from the residual decoding unit 220 in an additional value determination unit 422.

(Encoding Method)

The second embodiment differs from the first embodiment in the process of determining each additional value a(r) by the additional value determination unit 321b (step S30) and in that the auxiliary information d for identifying the determination method is included in the code $C_g$ (step S60).

In the following, only these differences will be described.

[Process of Determining Additional Value a(r)]

The additional value determination unit 321b according to this embodiment determines each additional value a(r) according to a criterion selected from among a plurality of criteria for determining the additional value.

Figure 18:
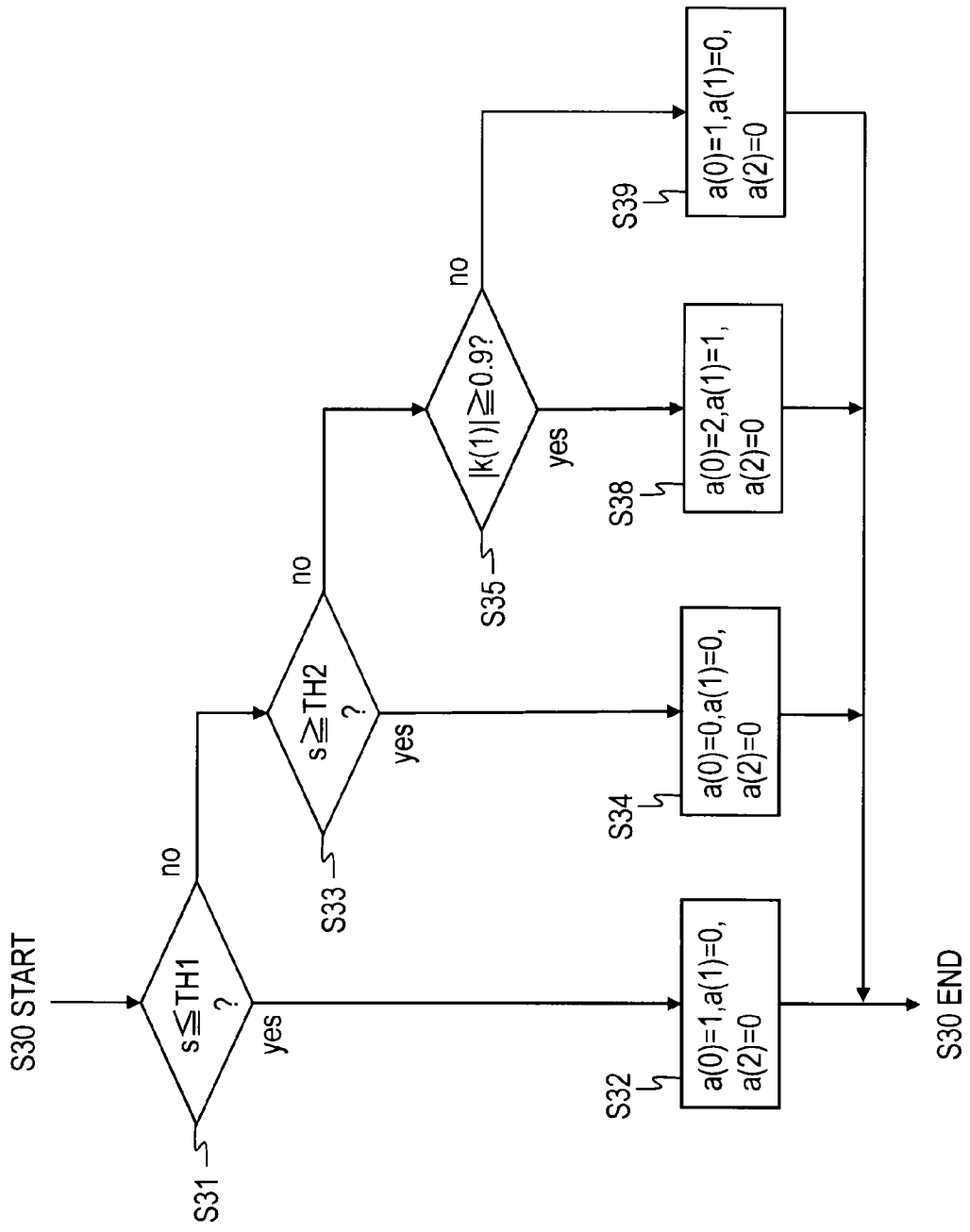
FIG. 18 is a flow chart for illustrating an example of a criterion for determining an additional value a(r)

For example, it is assumed that a criterion for determining the additional value a(r) according to the process illustrated in FIG. 12 and a criterion for determining the additional value a(r) according to the process illustrated in FIG. 18 are set, and the additional value determination unit 321b selects one of the criterion shown in FIG. 12 and the criterion shown in FIG. 18 and determine the additional value a(r) using the absolute value of the first-order PARCOR coefficient k(1) or the like. The criterion shown in FIG. 18 differs from the criterion shown in FIG. 12 only in that the additional values a(0)=2, a(1)=1 and a(2)=0 are determined if it is decided that the condition that |k(1)|≥0.9 is met in step S35 (step S38), and the additional values a(0)=1, a(1)=0 and a(2)=0 are determined if it is decided that the condition that |k(1)|≥0.9 is not met (step S39). According to the criterion shown in FIG. 18, the possible range of the additional value a(r) is narrower than according to the criterion shown in FIG. 12. In this case, the selection of the criterion is based on whether or not the average amplitude of the time-series signals x(n) (n=0, ..., N−1) in a frame is equal to or greater than a predetermined threshold, for example. For example, when the average amplitude of the time-series signals x(n) is equal to or greater than the predetermined threshold, the additional value determination unit 321b decides that the variation of the amplitude of the prediction residuals e(n) (n=0, ..., N−1) is also large and select the criterion shown in FIG. 12 in which the possible range of the additional value a(r) is wider. Otherwise, the additional value determination unit 321b decides that the variation of the amplitude of the prediction residuals e(n) is small and selects the criterion shown in FIG. 18 in which the possible range of the additional value a(r) is narrower. In this way, the parameter can be set appropriately.

Alternatively, the additional value determination unit 321b may select one of the criterion using the PARCOR coefficient as the index and the criterion using the optimum prediction order as the index and determine the additional value a(r) using the absolute value of the first-order PARCOR coefficient k(1) or the optimum prediction order $P_{opt}$ required for the selected criterion. Alternatively, information that represents the selected criterion may be externally given to the additional value determination unit 321b.

[Process of Including Auxiliary Information d in Code $C_g$]

The additional value determination unit 321b outputs the auxiliary information d for identifying the criterion selected as described above to the combining unit 2130, and the combining unit 2130 generates the code $C_g$ including the auxiliary information d. For example, the auxiliary information d is 1-bit information that assumes a value 0 or 1, which corresponds to the selected criterion.

(Decoding Method)

The second embodiment differs from the first embodiment in the process of determining each additional value a(r) by the additional value determination unit 422 (step S230). In the following, only the difference will be described.

The auxiliary information d separated from the code $C_g$ is input to the additional value determination unit 422, and the additional value determination unit 422 determines each additional value a(r) according to the criterion represented by the auxiliary information d.

For example, if the input auxiliary information d represents the criterion shown in FIG. 12, the additional value determination unit 422 reproduces the first-order PARCOR coefficient k(1) by inverse quantization of the input first-order quantized PARCOR coefficient k(1) and determines the additional value a(r) according to the criterion shown in FIG. 12. On the other hand, for example, if the input auxiliary information d represents the criterion shown in FIG. 18, the additional value determination unit 422 reproduces the first-order PARCOR coefficient k(1) by inverse quantization of the input first-order quantized PARCOR coefficient k(1) and determines the additional value a(r) according to the criterion shown in FIG. 18.

[Modification of Second Embodiment]

In this modification, in coding, a plurality of additional values a(r) (additional values corresponding to the indexes representing the prediction effectiveness) are set for each discrete time r, one of the additional values a(r) that minimizes the code amount of the prediction residuals e(n) is selected for each discrete time r, and the auxiliary information d representing the selection for each discrete time r is included in the code $C_g$. The following description will be mainly focused on differences from the first and second embodiments, and descriptions of features common to the first and second embodiments will be omitted.

(Configuration)

Figure 19:
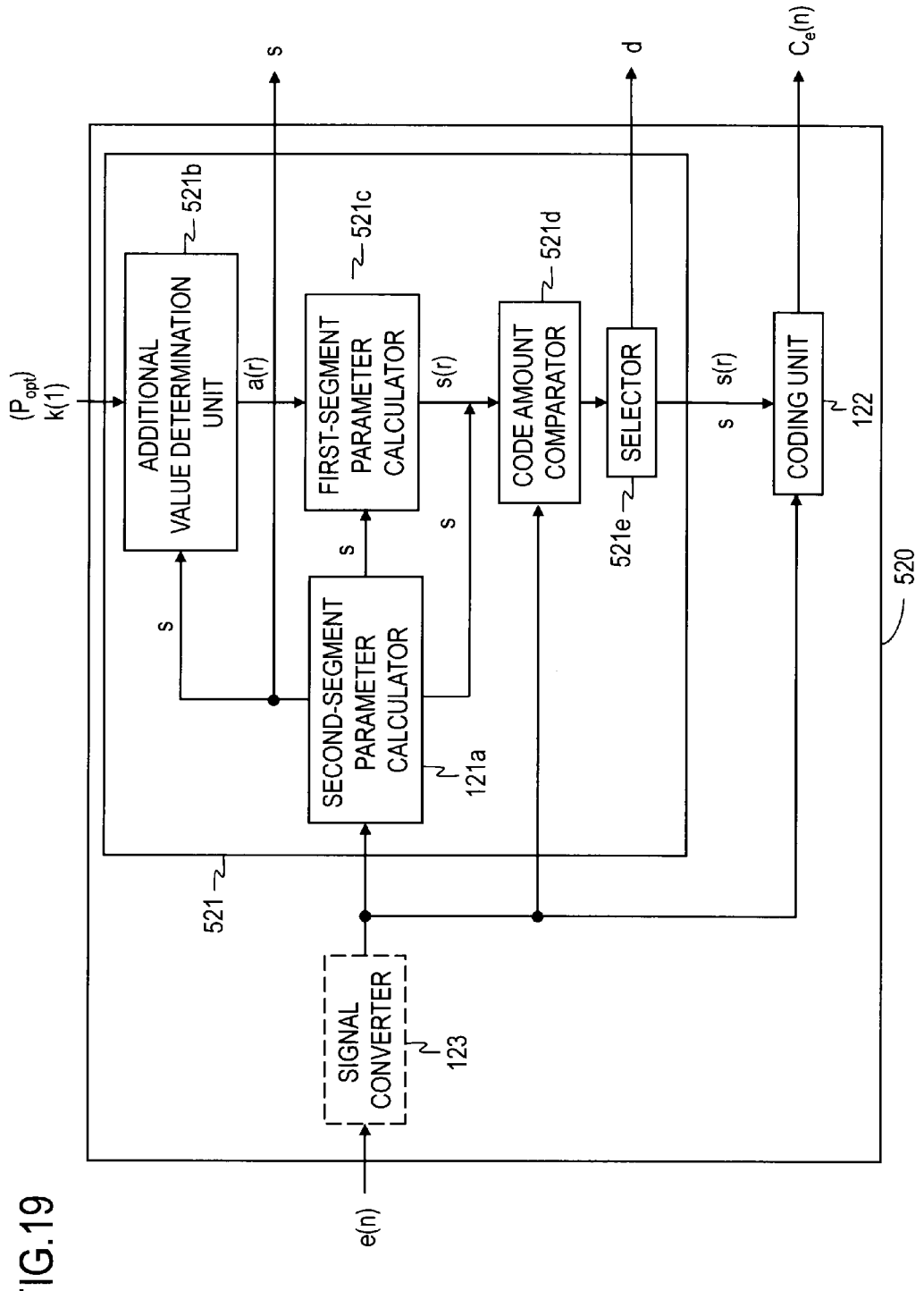
FIG. 19 is a block diagram for illustrating a functional configuration of a residual coding unit in an encoder according to a modification of the second embodiment.

FIG. 19 is a block diagram for illustrating a functional configuration of a residual coding unit 520 in an encoder according to the modification of the second embodiment. In this drawing, the same components as those in the first embodiment are denoted by the same reference numerals, and descriptions thereof will be omitted.

The encoder according to this modification is the encoder 100 according to the first embodiment with the residual coding unit 120 replaced with the residual coding unit 520 shown in FIG. 19. The residual coding unit 520 differs from the residual coding unit 120 in a parameter calculator 521, and the parameter calculator 521 comprises the second-segment parameter calculator 121a, an additional value determination unit 521b, a first-segment parameter calculator 521c, a code amount comparison unit 521d, and a selector 521e. The decoder according to this modification is the same as the decoder according to the second embodiment.

(Encoding Method)

Figure 20:
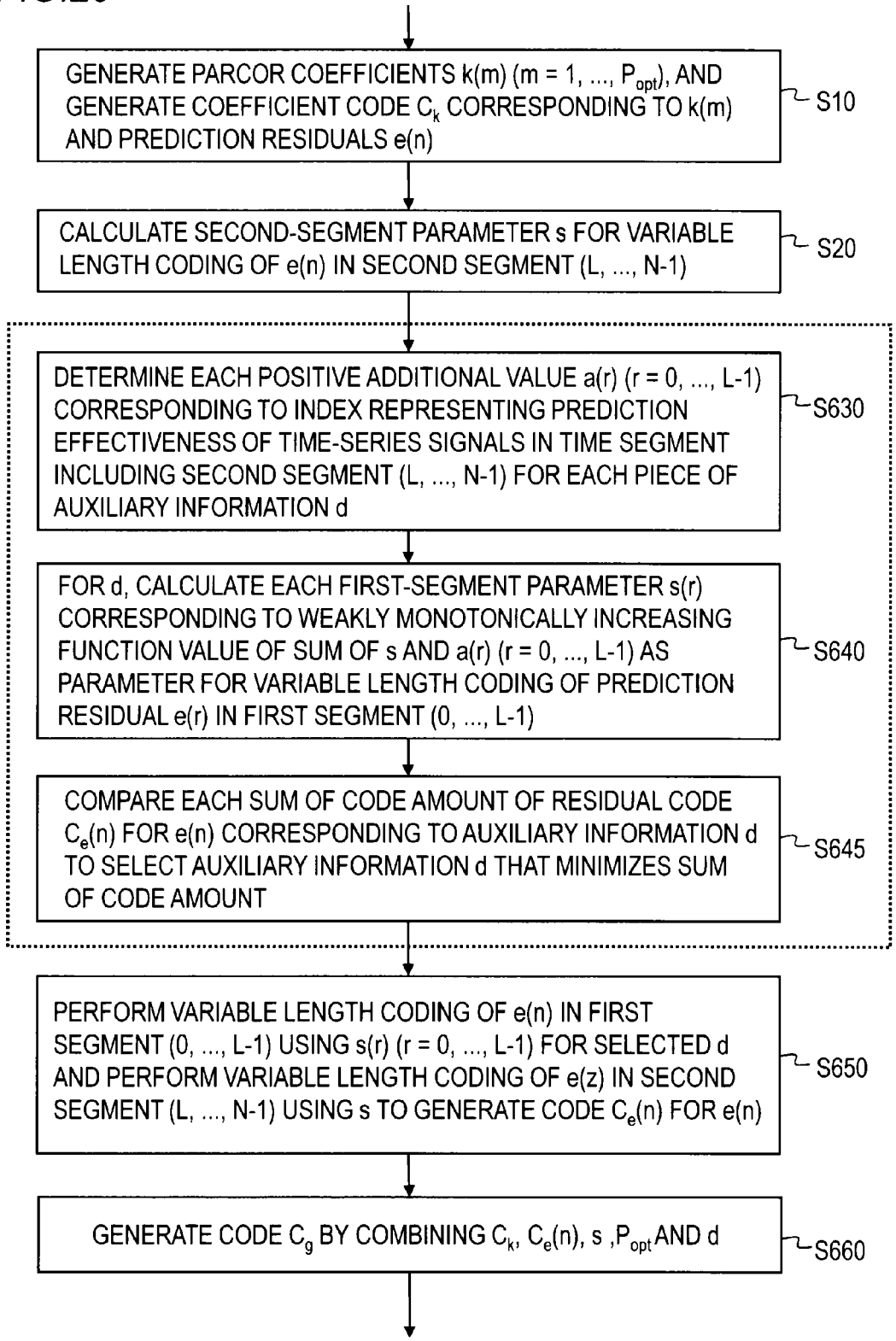
FIG. 20 is a flow chart for illustrating an encoding method according to the modification of the second embodiment.
Figure 21:
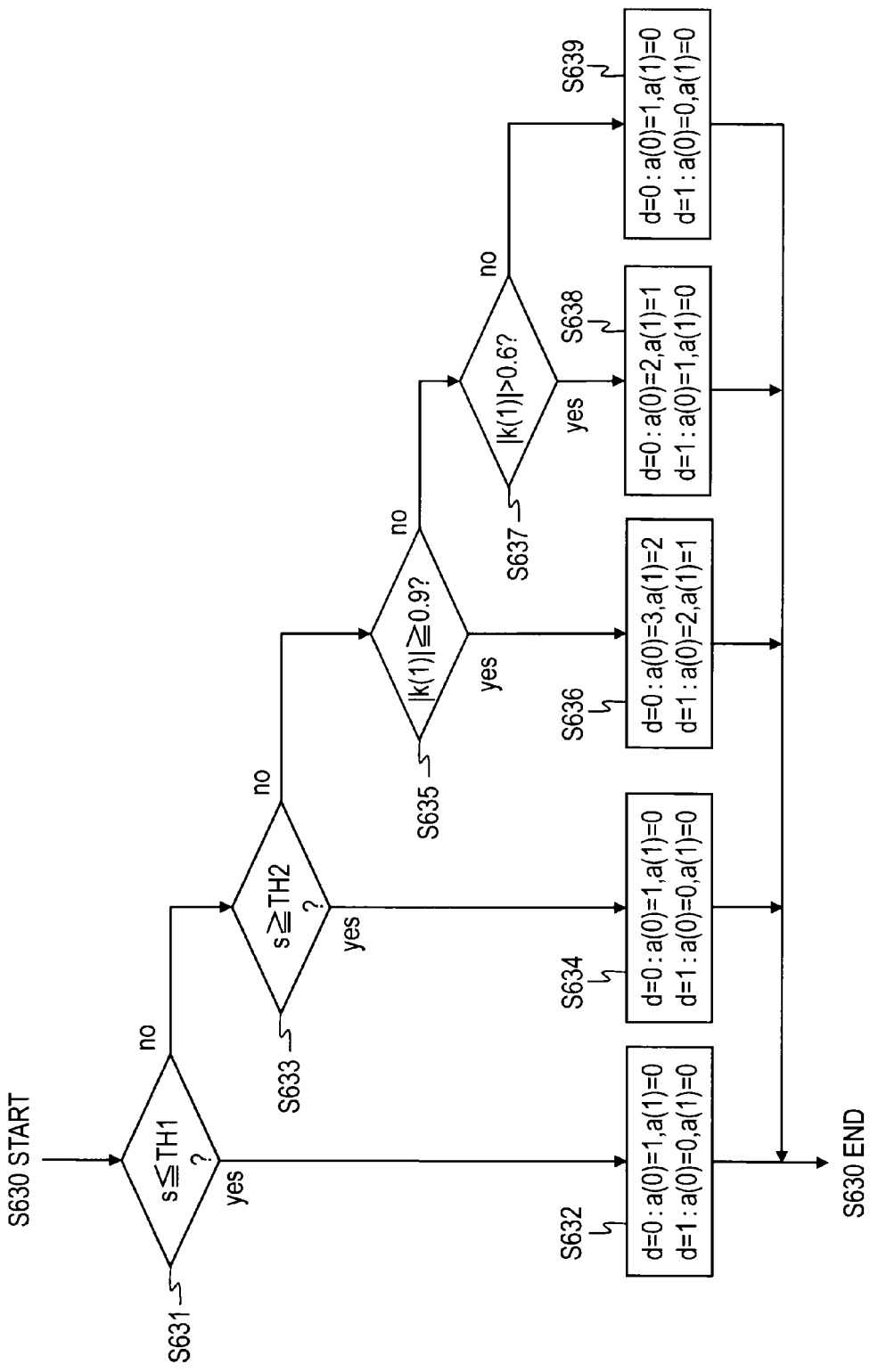
FIG. 21 is a flow chart for illustrating an example of step S630 in FIG. 20.

FIG. 20 is a flow chart for illustrating an encoding method according to the modification of the second embodiment. FIG. 21 is a flow chart for illustrating an example of step S630 in FIG. 20. In the following, the encoding method according to this modification will be described with reference to these drawings.

First, steps S10 and S20 in the first embodiment are performed. Then, the first-order PARCOR coefficient k(1) generated in step S10 and the second-segment parameter s generated in step S20 are input to the additional value determination unit 521b. Using these values, the additional value determination unit 521b determines each positive additional value a(r) (r=0, . . . , L−1) that weakly monotonically increases with a decrease of the ratio of the average amplitude of the prediction residuals e(μ) (μ=$\mu_{min}$, . . . , $\mu_{max}$) to the average amplitude of the time-series signals x(μ) (μ=$\mu_{min}$, . . . , $\mu_{max}$) in the time segment including the second segment (L, . . . , N−1) for each piece of auxiliary information d ($d_{max}$ represents a predetermined integer equal to or greater than 1) (step S630). For example, if $d_{max}$=1, two additional values a(r) are determined for each discrete time r. In this case also, each additional value a(r) corresponds to the index representing the prediction effectiveness of the time-series signals x(μ) (μ=$\mu_{min}$, . . . , $\mu_{max}$).

[Example of Step S630]

FIG. 21 shows an example of the processing in which L=2, and $d_{max}$=1. In this example, the additional value determination unit 521b first decides whether a condition that s≤TH1 is met or not (step S631). If the condition that s≤TH1 is met, the additional value determination unit 521b determines the additional values a(0)=1 and a(1)=0 for d=0, and determines the additional values a(0)=0 and a(1)=0 for d=1 (step S632). If the condition that s≥TH1 is not met, the additional value determination unit 521b decides whether a condition that s≥TH2 is met or not (step S633). If the condition that s≥TH2 is met, the additional value determination unit 521b determines the additional values a(0)=1 and a(1)=0 for d=0, and determines the additional values a(0)=0 and a(1)=0 for d=1 (step S634). Furthermore, if the condition that s≥TH2 is also not met, the additional value determination unit 521b decides whether a condition that |k(1)|≥0.9 is met or not (step S635). If the condition that |k(1)|0.9 is met, the additional value determination unit 521b determines the additional values a(0)=3 and a(1)=2 for d=0, and determines the additional values a(0)=2 and a(1)=1 for d=1 (step S636). If the condition that |k(1)|≥0.9 is also not met, the additional value determination unit 521b decides whether a condition that |k(1)|≥0.6 is met or not (step S637). If the condition that |k(1)|≥0.6 is met, the additional value determination unit 521b determines the additional values a(0)=2 and a(1)=1 for d=0, and determines the additional values a(0)=1 and a(1)=0 for d=1 (step S638). If the condition that |k(1)|≥0.6 is also not met, the additional value determination unit 521b determines the additional values a(0)=1 and a(1)=0 for d=0, and determines the additional values a(0)=0 and a(1)=0 for d=1 (step S639). In this example, the additional values a(r) are determined using the absolute value |k(1)| of the first-order PARCOR coefficient k(1) as the index. However, in order to prevent the additional values a(r) selected in the encoder 100 from being different from the additional values a(r) selected in the decoder 200 because of the quantization error of the first-order PARCOR coefficient k(1), the additional values a(r) may be determined in the above-described manner using as the index the absolute value of the first-order PARCOR coefficient k(1) obtained by once quantizing the first-order PARCOR coefficient k(1) and then performing inverse quantization of the resulting quantized first-order PARCOR coefficient (this is the end of the description of [Example of step S630]).

Then, the second-segment parameter s generated in step S20 and the additional values a(r) (r=0, . . . , L−1) generated in step S630 are input to the first-segment parameter calculator 521c. Using these values, for each piece of auxiliary information d, the first-segment parameter calculator 521c calculates first-segment parameters s(r)=s+a(r), which are the sums of the second-segment parameter s and the additional values a(r) (r=0, . . . , L−1), respectively, as parameters for variable length coding of the prediction residuals e(r) at discrete times r in the first segment (0, . . . , L−1) (step S640). For example, if L=2, and the additional values a(0)=3 and a(1)=2 for d=0 and the additional values a(0)=2 and a(1)=1 for d=1 are determined in step S630, the first-segment parameter calculator 521c determines the first-segment parameters s(0)=s+3 and s(1)=s+2 for d=0 and the first-segment parameters s(0)=s+2 and s(1)=s+1 for d=1.

Then, the second-segment parameter s generated in step S20, the first-segment parameters s(r) (r=0, . . . , L−1) for each piece of auxiliary information d generated in step S640 and the prediction residuals e(n) (n=0, . . . , N−1) are input to the code amount comparison unit 521d. The code amount comparison unit 521d performs variable length coding of the prediction residuals e(r) at the discrete times r in the first segment (0, . . . , L−1) using the first-segment parameters s(r) (r=0, . . . , L−1), performs variable length coding of the prediction residuals e(z) at discrete time z (z=L, . . . N−1) in the second segment (L, . . . , N−1) using the second-segment parameter s to determine, for each piece of auxiliary information d, the sum of the code amounts of the residual codes $C_e$(n) (n=0, . . . , N−1) (the sum for n=0, . . . , N−1), and outputs the result of comparison of the sums. The comparison of the sums of the code amounts may be performed by actually determining the residual codes $C_e$(n) (n=0, . . . , N−1) for each piece of auxiliary information d or by determining only the sums of the code amounts of the residual codes $C_e$(n) (n=0, . . . , N−1) or the sums of estimated code amounts for each piece of auxiliary information d. Based on the comparison result, the selector 521e selects the auxiliary information d for which the sum of the code amounts of the residual codes $C_e$(n) (n=0, . . . , N−1) corresponding to the prediction residuals e(n) (n=0, . . . , N−1) is minimized (step S645).

The second-segment parameter s generated in step S20 and the first-segment parameters s(r) (r=0, ..., L−1) for the auxiliary information d selected in step S645 are input to the coding unit 122. As in the first embodiment, the coding unit 122 performs variable length coding of the prediction residuals e(r) at the discrete times r in the first segment (0, ..., L−1) using the input first-segment parameters s(r) (r=0, ..., L−1) and performs variable length coding of the prediction residuals e(z) at the discrete times z (z=L, ..., N−1) in the second segment (L, ..., N−1) using the second-segment parameters s, thereby generating the residual codes $C_e(n)$ corresponding to the prediction residuals e(n) (step S650).

Then, the combining unit 2130 combines the coefficient code $C_k$, the residual codes $C_e(n)$, the second-segment parameter s, the prediction order $P_{opt}$ and the selected auxiliary information d to generate the code $C_g$ and outputs the code $C_g$ (step S660). The decoding method according to this modification is the same as the decoding method described in the second embodiment, and therefore, descriptions thereof will be omitted.

According to another modification of the second embodiment, a plurality of criteria for determining each additional value a(r) (criteria similar to those illustrated in the description of the principle) may be set for each piece of auxiliary information d, and the additional value determination unit 521d in the encoder may determine each additional value a(r) according to the criterion represented by the auxiliary information d in step S630. Furthermore, the second embodiment can also be modified as described in the modification of the first embodiment.

[Third Embodiment]

Next, a third embodiment of the present invention will be described.

According to this embodiment, the prediction residuals obtained by using the long-term prediction filter are encoded. In this embodiment, the magnitude of the gain ρ(0) is used as the index to set each additional value. In addition, in the specific example described below, the criterion in ((Example 12)) is used. Furthermore, in the example of this embodiment, the predetermined values TH1 and TH2 are set to fall within a range from 0 to the maximum amplitude value MAX both inclusive (0≤TH1<TH2≤MAX). The additional value a(r) in the case where the second-segment parameter s is equal to or smaller than the predetermined value TH1 is set to be equal to or smaller than the additional value a(r) in the case where the second-segment parameter is greater than the predetermined value TH1 and smaller than the predetermined value TH2. In addition, the additional value a(r) in the case where the second-segment parameter s is equal to or greater than the predetermined value TH2 is set to be equal to or smaller than the additional value a(r) in the case where the second-segment parameter s is greater than the predetermined value TH1 and smaller than the predetermined value TH2. Note that these conditions are not intended to limit the scope of the present invention. The following description will be mainly focused on differences from the first and second embodiments, and descriptions of features common to the first and second embodiments will be omitted.

(Configuration)

Figure 22:
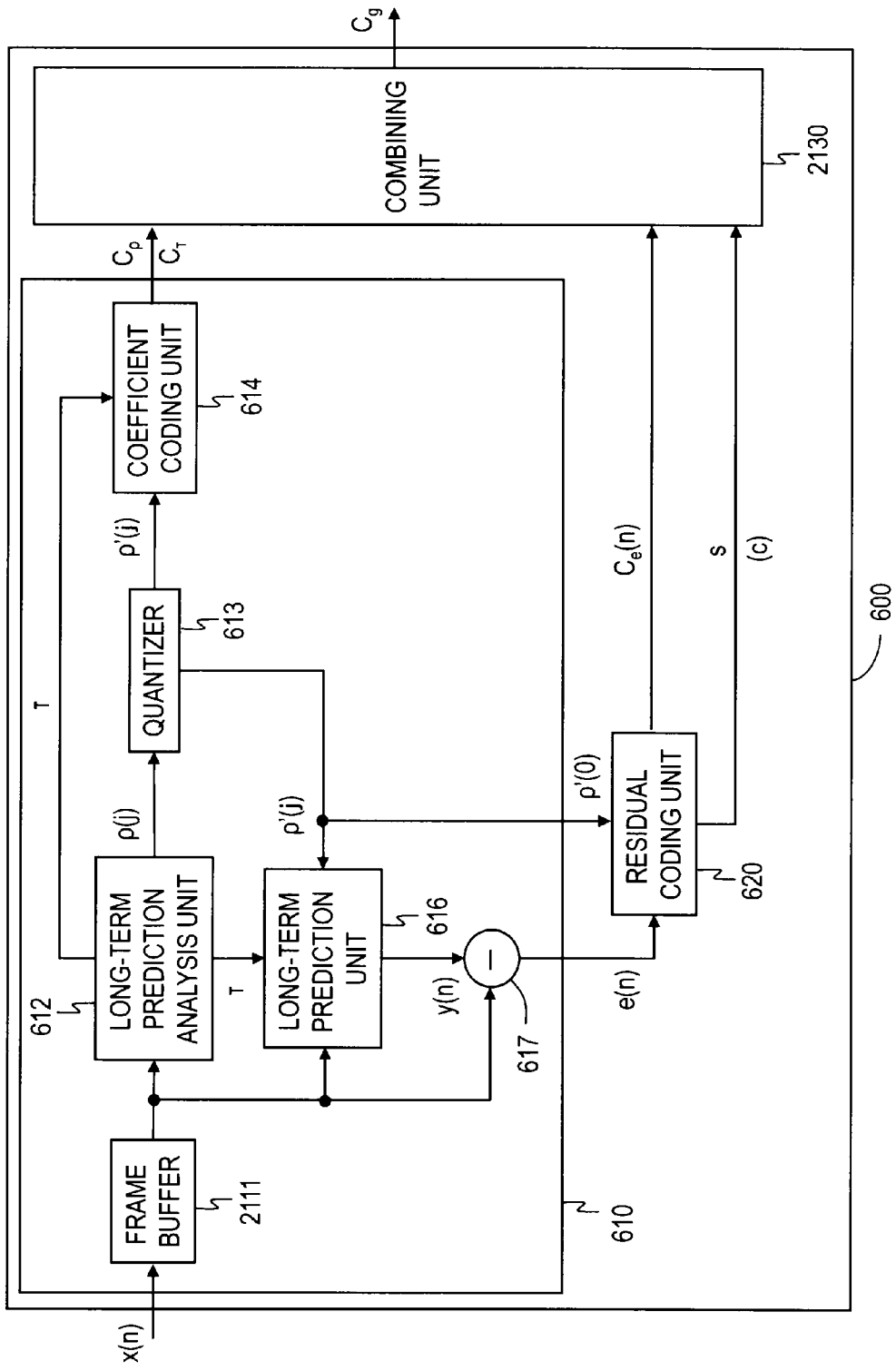
FIG. 22 is a block diagram for illustrating a functional configuration of an encoder according to a third embodiment.
Figure 23:
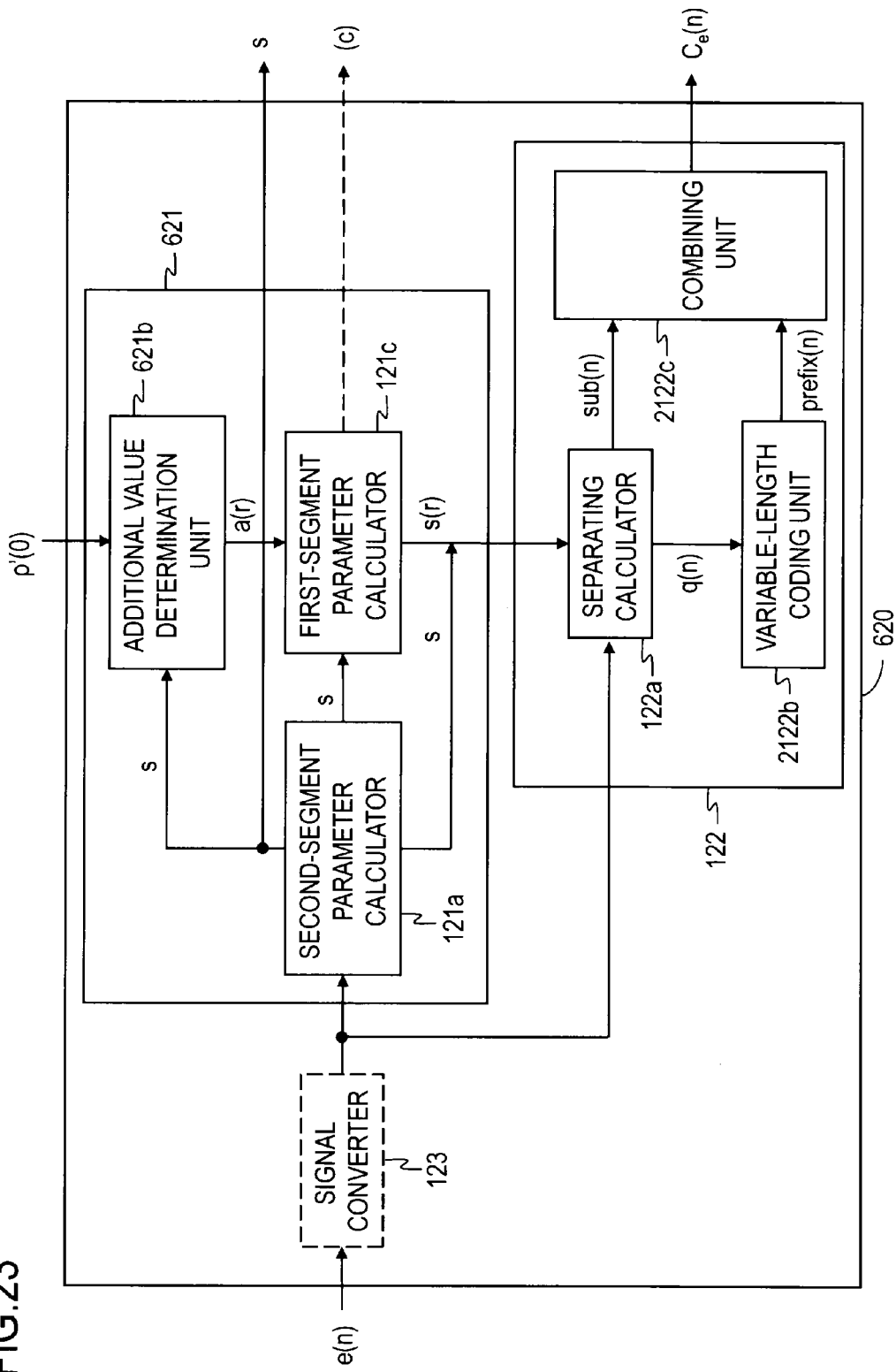
FIG. 23 is a block diagram for illustrating a functional configuration of a residual coding unit shown in FIG. 22.
Figure 24:
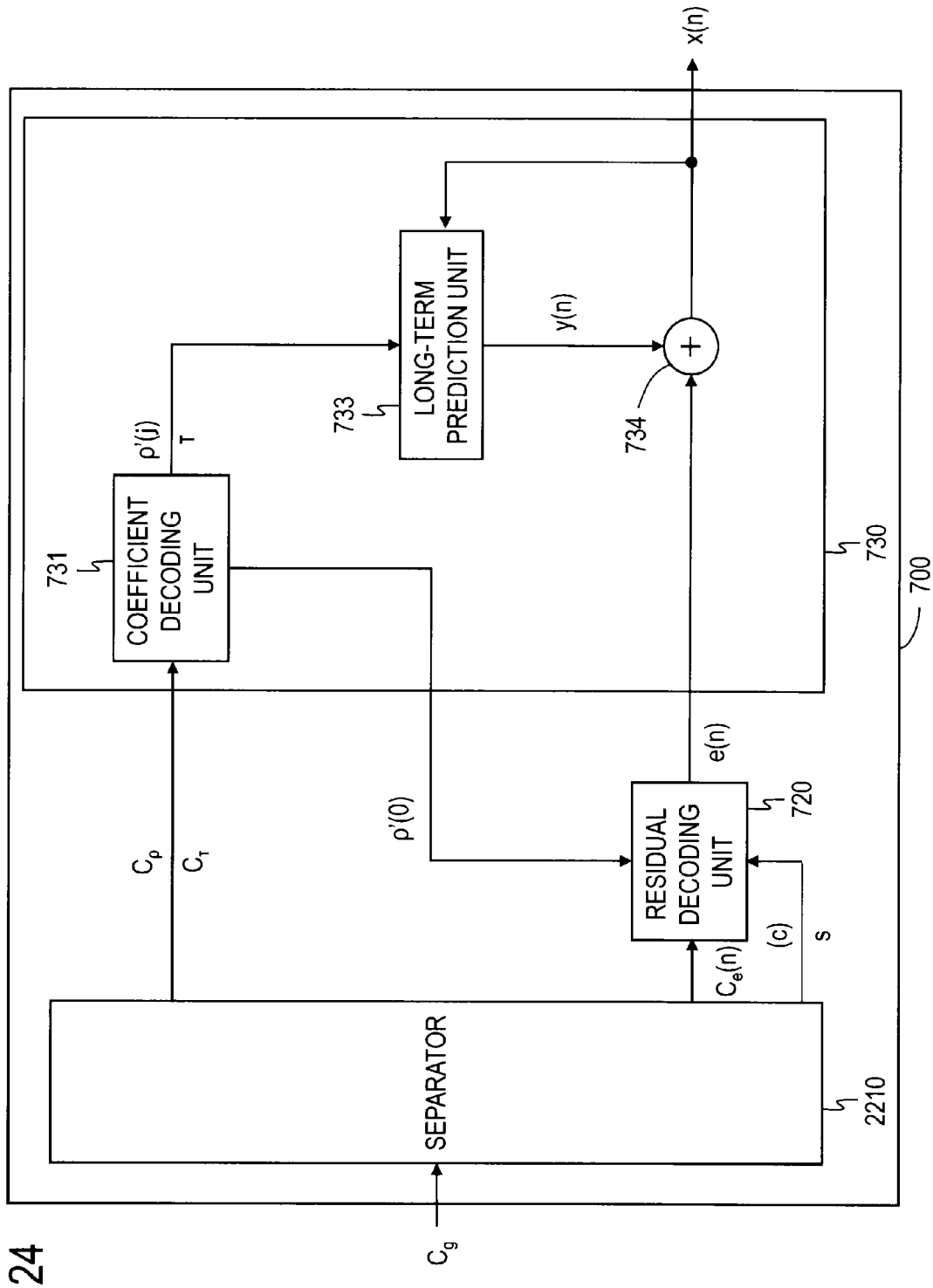
FIG. 24 is a block diagram for illustrating a functional configuration of a decoder according to the third embodiment.
Figure 25:
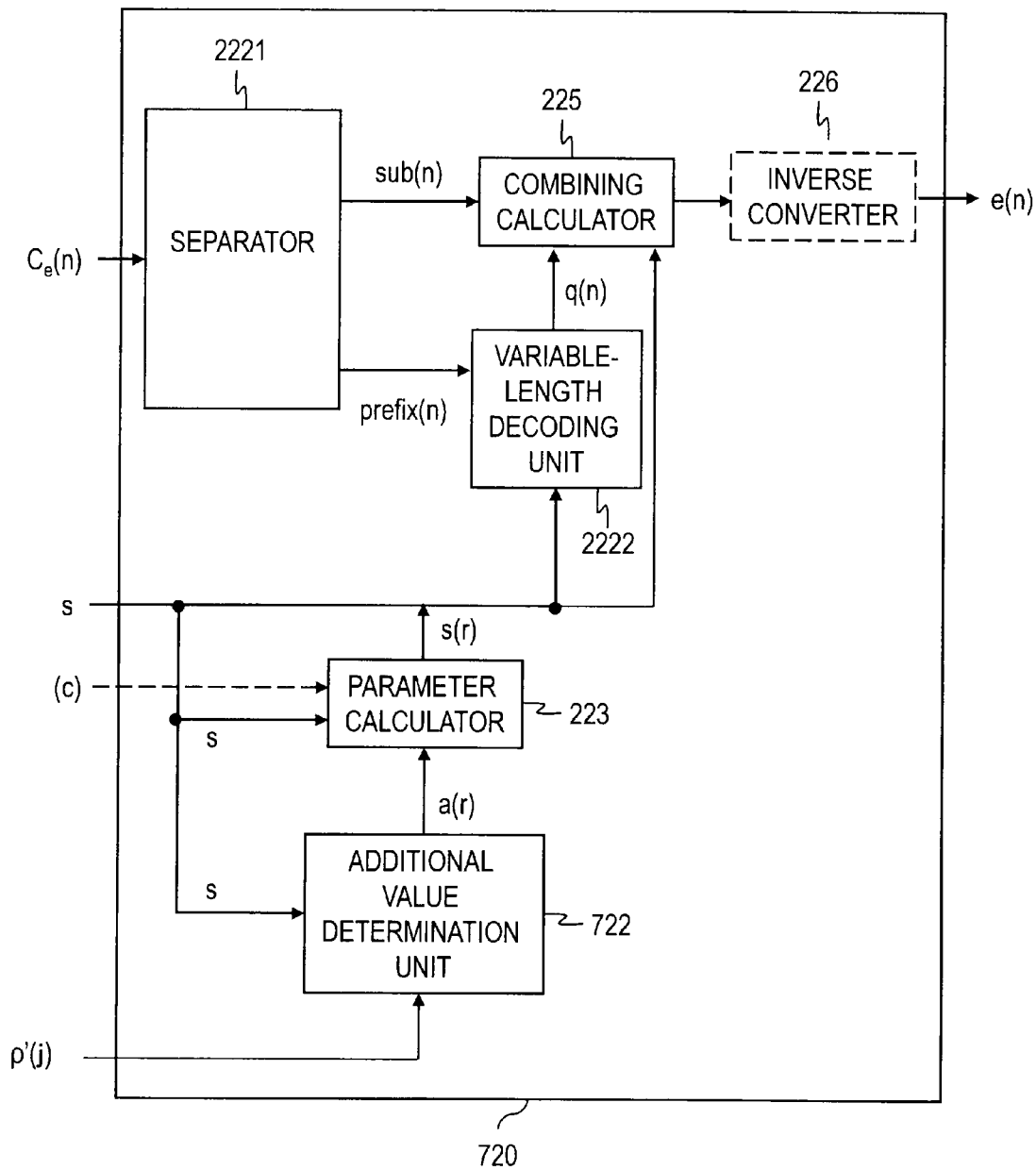
FIG. 25 is a block diagram for illustrating a functional configuration of a residual decoding unit shown in FIG. 24.

FIG. 22 is a block diagram for illustrating a functional configuration of an encoder 600 according to the third embodiment. FIG. 23 is a block diagram for illustrating a functional configuration of a residual coding unit 620 shown in FIG. 22. FIG. 24 is a block diagram for illustrating a functional configuration of a decoder 700 according to the third embodiment. FIG. 25 is a block diagram for illustrating a functional configuration of a residual decoding unit 720 shown in FIG. 24. In these drawings, the same components as those described above are denoted by the same reference numerals, and descriptions thereof will be omitted.

As shown in FIG. 22, the encoder 600 according to this embodiment comprises a predictive coding unit 610, the residual coding unit 620 and the combining unit 2130. As shown in FIG. 23, the residual coding unit 620 comprises a parameter calculator 621 and the coding unit 122. The parameter calculator 621 comprises the second-segment parameter calculator 121a, an additional value determination unit 621b and the first-segment parameter calculator 121c.

As shown in FIG. 24, the decoder 700 according to this embodiment comprises the separator 2210, a residual decoding unit 720 and a predictive decoding unit 730. As shown in FIG. 25, the residual decoding unit 720 comprises the separator 2221, the variable length decoding unit 224, the combining calculator 225, an additional value determination unit 722 and the parameter calculator 223.

The encoder 600 and the decoder 700 according to this embodiment are, for example, a special apparatus formed by a well-known computer or a dedicated computer that comprises a CPU, a RAM and a ROM, and is loaded with a predetermined program, which is executed by the CPU. Alternatively, an electronic circuit, such as an integrated circuit, may form at least part of these processing units. As required, the encoder 600 or the decoder 700 may additionally comprise a temporary memory that stores data that is output from the processing units and can be read out when the processing units perform another processing. Such implementations of the processing units apply to the other embodiments described below and modifications thereof.

(Encoding Method)

Figure 26:
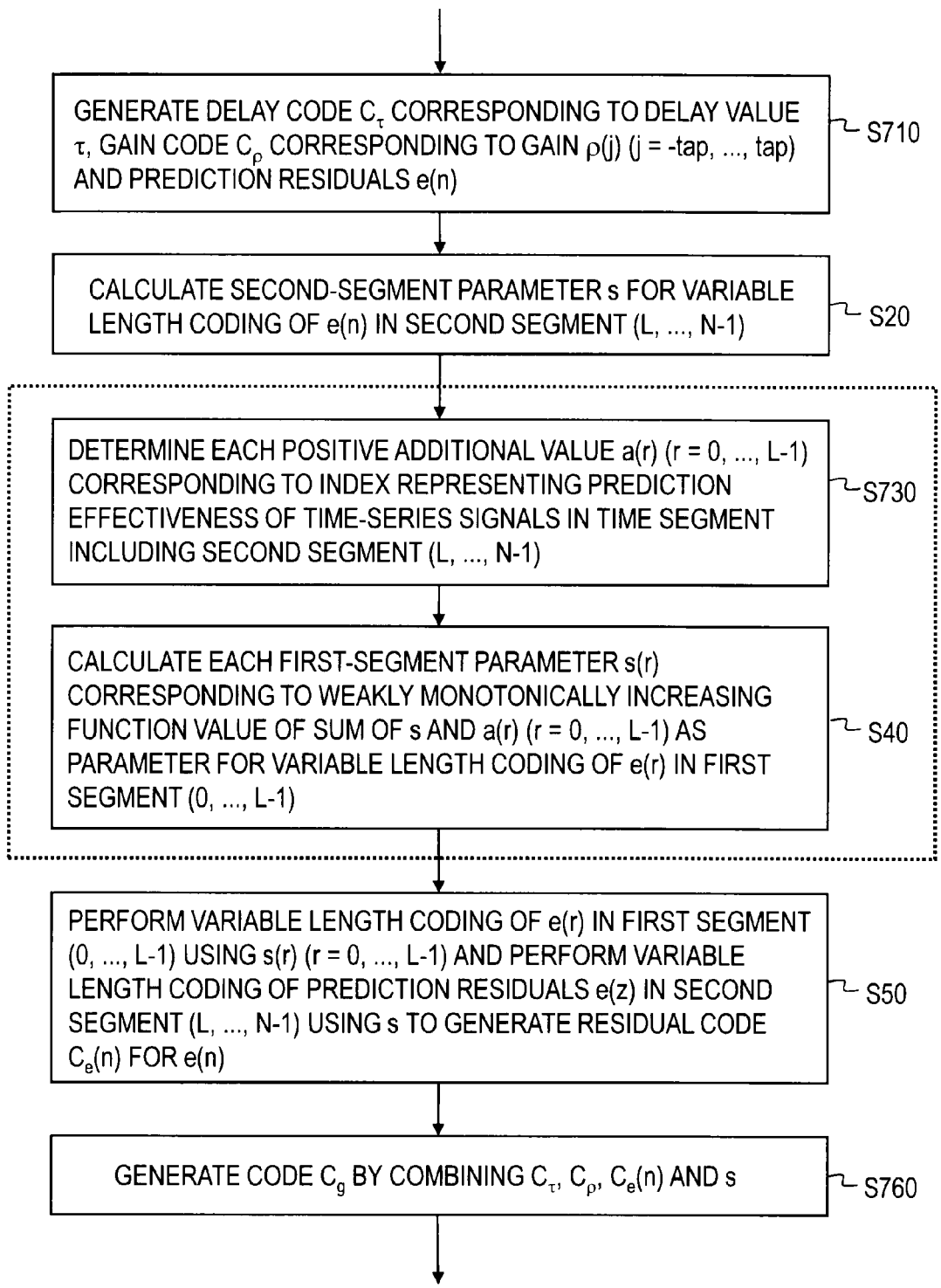
FIG. 26 is a flow chart for illustrating an encoding method according to the third embodiment.
Figure 27:
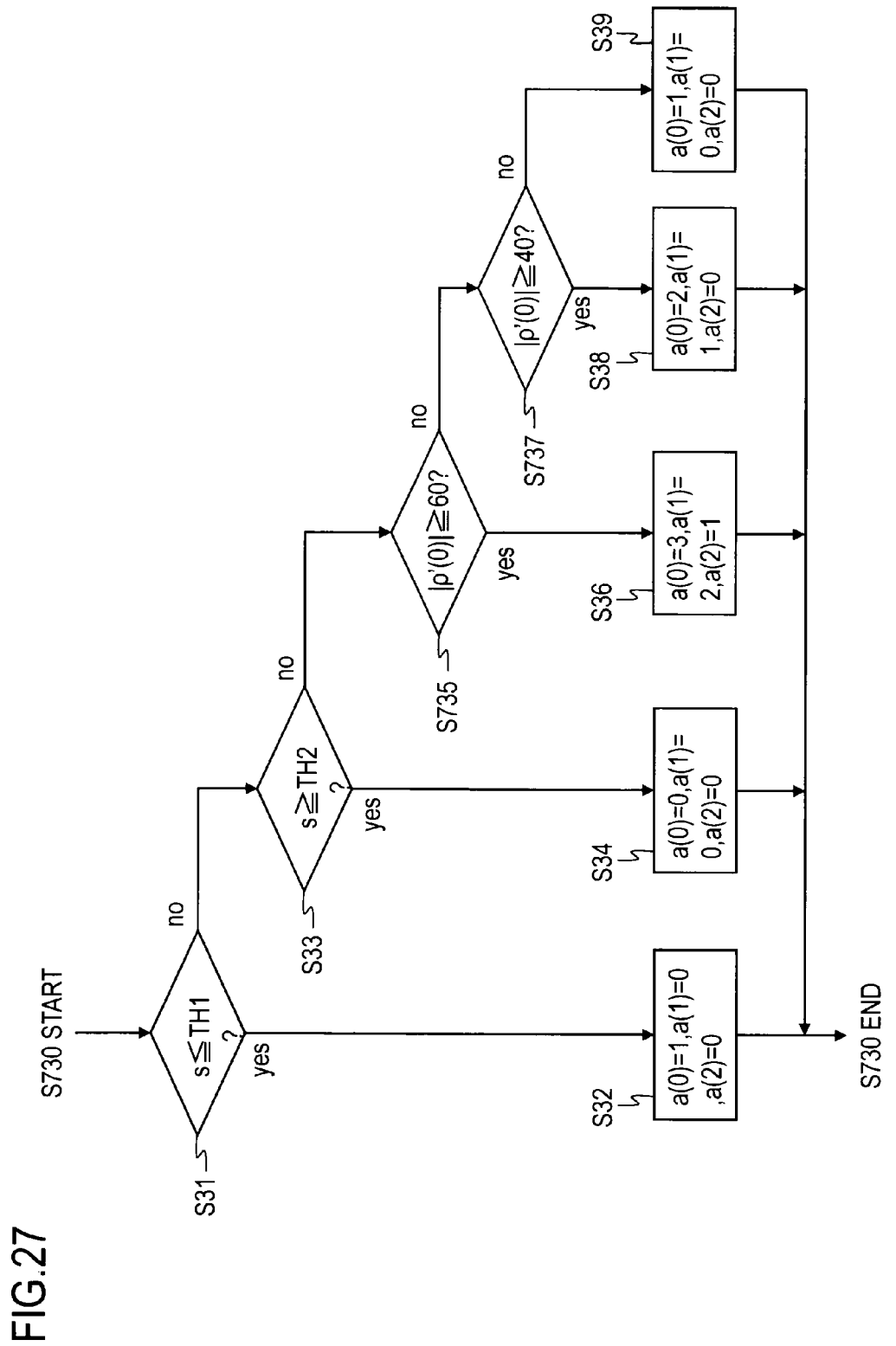
FIG. 27 is a flow chart for illustrating an example of step S730 in FIG. 26.

FIG. 26 is a flow chart for illustrating an encoding method according to the third embodiment. FIG. 27 is a flow chart for illustrating an example of step S730 in FIG. 26. In the following, the encoding method according to this embodiment will be described with reference to these drawings.

Time-series signals x(n) similar to those in the first embodiment are input to the predictive coding unit 610 in the encoder 600 (FIG. 22). One frame of time-series signals x(n) (n=0, ..., N−1) buffered in the frame buffer 2111 are passed to a long-term prediction analysis unit 612. The long-term prediction analysis unit 612 performs long-term prediction analysis of the time-series signals x(n) (n=0, ..., N−1) to calculate each gain ρ(j) (j=−tap, ..., tap) and the delay value τ (the minimum delay value $T_{min}$≤τ≤the maximum delay value $T_{max}$) that minimize the energy of the prediction residuals e(n) (n=0, ..., N−1) expressed by the formula (4). The long-term prediction analysis unit 612 may be configured to perform long-term prediction analysis of the time-series signals x(n) directly, or to map the input nonlinearly quantized time-series signals x(n) into linearly quantized signals or other nonlinearly quantized signals before performing the long-term prediction analysis. Each calculated gain ρ(j) is passed to a quantizer 613. The quantizer 613 quantizes each gain ρ(j) to generate each quantized gain p'(j) and outputs the quantized gain p'(j). The delay value τ and each quantized gain p'(j) are input to a coefficient coding unit 614. The coefficient coding unit 614 generates a delay code $C_τ$ corresponding to the delay value τ and a gain code $C_ρ$ corresponding to the gain ρ(j) and outputs the delay code $C_τ$ and the gain code $C_ρ$. The delay value τ, the quantized gain p'(j) and the time-series signals x(n) (n=0, ..., N−1) are input also to a long-term prediction unit 616. The long-term prediction unit 616 generates a long-term prediction value y(n) (n=0, ..., N−1) using the long-term prediction filter expressed by the formula (5) and outputs the long-term prediction value y(n).

Then, a subtraction unit 617 calculates the prediction residuals e(n) (n=0, ..., N−1) by subtracting the long-term prediction values y(n) from the time-series signals x(n) (step S710), respectively.

The prediction residuals e(n) are input to the second-segment parameter calculator 121a in the residual coding unit 620. Using the prediction residuals e(n), the second-segment parameter calculator 121a calculates a positive second-segment parameter s that weakly monotonically increases with an increase of the average amplitude of the prediction residuals $e(\mu)$ ($\mu=\mu_{min}, \ldots, \mu_{max}$) in the time segment including the second segment (L, ..., N−1) as a parameter for variable length coding of the prediction residuals e(z) (z=L, ..., N−1) in the second segment (L, ..., N−1) (step S20).

Then, the quantized gain p'(0) generated in step S710 and the second-segment parameter s generated in step S20 are input to the additional value determination unit 621b. Using these values, the additional value determination unit 621b determines each positive additional value a(r) (r=0, ..., L−1) that weakly monotonically increases with a decrease of the ratio of the average amplitude of the prediction residuals $e(\mu)$ ($\mu=\mu_{min}, \ldots, \mu_{max}$) to the average amplitude of the time-series signals $x(\mu)$ ($\mu=\mu_{min}, \ldots, \mu_{max}$) in the time segment including the second segment (L, ..., N−1) (step S730). In this case also, the additional value a(r) corresponds to the index representing the prediction effectiveness of the time-series signals $x(\mu)$ ($\mu=\mu_{min}, \ldots, \mu_{max}$).

[Example of Step S730]

FIG. 27 shows an example of the processing in which L=3. In this example, the additional value determination unit 621b first decides whether a condition that s≤TH1 is met or not (step S31). If the condition that s≤TH1 is met, the additional value determination unit 621b determines the additional values a(0)=1, a(1)=0 and a(2)=0 (step S32). If the condition that s≤TH1 is not met, the additional value determination unit 621b decides whether a condition that s≥TH2 is met or not (step S33). If the condition that s≥TH2 is met, the additional value determination unit 621b determines the additional values a(0)=0, a(1)=0 and a(2)=0 (step S34). Furthermore, if the condition that s≥TH2 is also not met, the additional value determination unit 621b decides whether a condition that |ρ'(0)|≥60 is met or not (step S735). If the condition that |ρ'(0)|≥60 is met, the additional value determination unit 621b determines the additional values a(0)=3, a(1)=2 and a(2)=1 (step S36). If the condition that |ρ'(0)|≥60 is also not met, the additional value determination unit 621b decides whether a condition that |ρ'(0)|≥40 is met or not (step S737). If the condition that |ρ'(0)|≥40 is met, the additional value determination unit 621b determines the additional values a(0)=2, a(1)=1 and a(2)=0 (step S38). If the condition that |ρ'(0)|≥40 is also not met, the additional value determination unit 621b determines the additional values a(0)=1, a(1)=0 and a(2)=0 (step S39) (this is the end of the description of [Example of Step S730]).

Then, processings similar to those in steps S40 and S50 in the first embodiment are performed, and then, the delay code $C_\tau$, the gain code $C_\rho$, the residual codes $C_e(n)$ (n=0, ..., N−1) and the second-segment parameter s are input to the combining unit 2130. The combining unit 2130 combines these to generate the code $C_g$ and outputs the code $C_g$ (step S760).

(Decoding Method)

Figure 28:
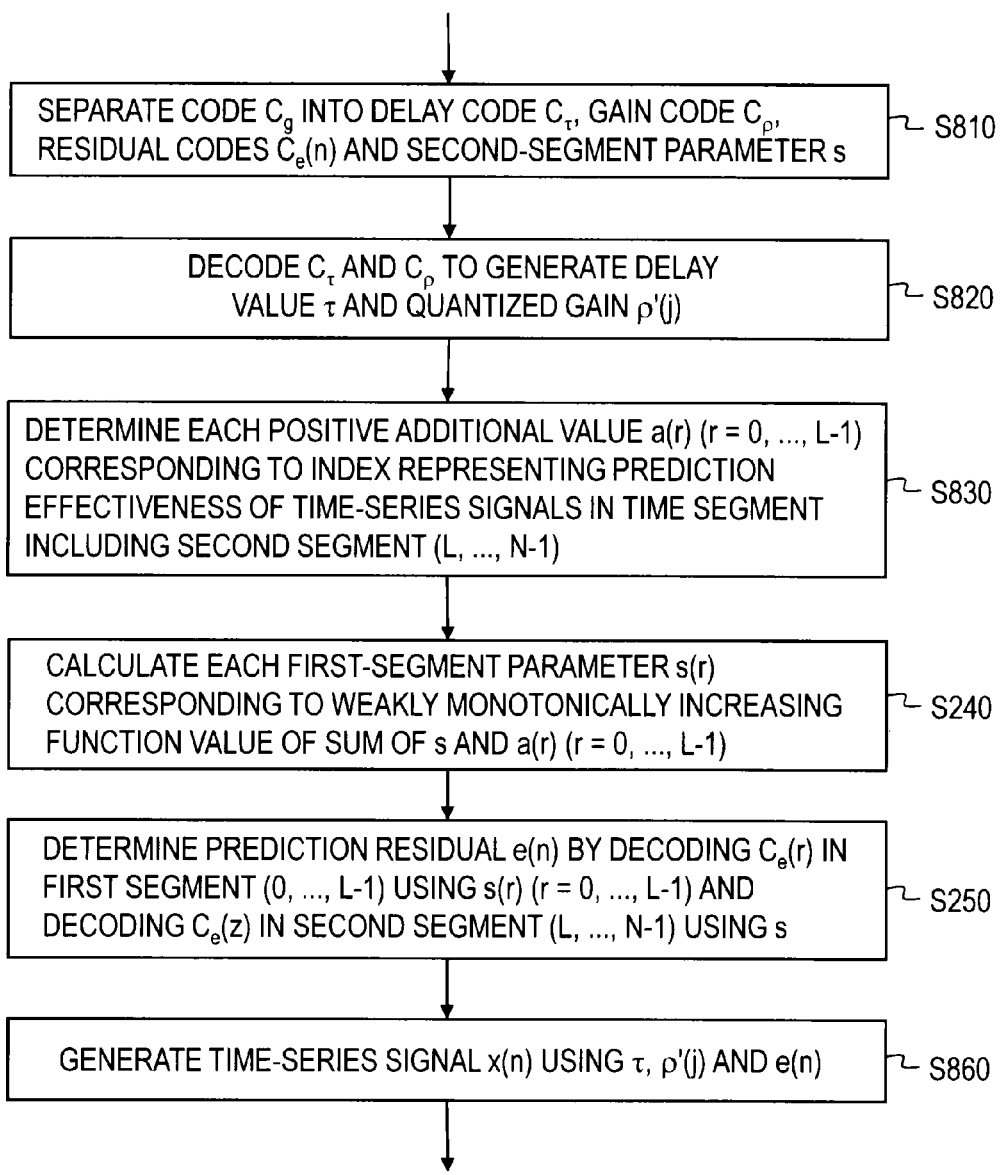
FIG. 28 is a flow chart for illustrating a decoding method according to the third embodiment.

FIG. 28 is a flow chart for illustrating a decoding method according to the third embodiment. In the following, the decoding method according to this embodiment will be described with reference to this drawing.

The separator 2210 in the decoder 700 (FIG. 24) separates the code $C_g$ input to the decoder 700 into the delay code $C_\tau$, the gain code $C_\rho$, the residual codes $C_e(n)$ (n=0, ..., N−1) and the second-segment parameter s (step S810).

The delay code $C_\tau$ and the gain code $C_\rho$ are input to a coefficient decoding unit 731. The coefficient decoding unit 731 decodes the delay code $C_\tau$ and the gain code $C_\rho$ to generate the delay value t and each quantized gain ρ'(j) (step S820).

Then, the second-segment parameter s output from the separator 2210 and each quantized gain ρ'(0) output from the coefficient decoding unit 731 are input to the additional value determination unit 722 in the residual decoding unit 720 (FIG. 25). Using these values, the additional value determination unit 722 determines each positive additional value a(r) (r=0, ..., L−1) according to the same criterion as in Step S730 (step S830). The additional value a(r) in this example also corresponds to the index representing the prediction effectiveness of the time-series signals $x(\mu)$ ($\mu=\mu_{min}, \ldots, \mu_{max}$).

Then, processings similar to those in steps S240 and S250 in the first embodiment are performed, and then, a long-term prediction unit 733 and an adder 734 generate the time-series signals x(n) (n=0, ..., N−1) using the prediction residuals e(n) (n=0, ..., N−1) output from the residual decoding unit 720, the delay value τ and each quantized gain ρ'(j) output from the coefficient decoding unit 731, and outputs the time-series signals x(n) (n=0, ..., N−1) (step S860).

[Modification of Third Embodiment]

In this embodiment, each additional value a(r) (r=0, ..., L−1) is set according to the criterion in ((Example 12)) described above. However, each additional value a(r) may be determined according to other criteria, such as the criterion in ((Example 13)). Alternatively, different criteria may be used in combination. For example, each additional value a(r) may be determined using different criteria for different discrete times r.

Furthermore, the unit of the encoding processing can be switch between a frame and a sub-frame, and the additional value determination units 621b and 722 may be configured to determine a greater additional value a(r) when a frame is used as the unit of the coding processing than when a sub-frame is used as the unit of the coding processing.

Furthermore, in the example of this embodiment described above, the predetermined values TH1 and TH2 are set to fall within a range from 0 to the maximum amplitude value MAX both inclusive (0≤TH1<TH2≤MAX), the additional value a(r) in the case where the second-segment parameter s is equal to or smaller than the predetermined value TH1 is set to be equal to or smaller than the additional value a(r) in the case where the second-segment parameter is greater than the predetermined value TH1 and smaller than the predetermined value TH2 (the lower limit criterion), and the additional value a(r) in the case where the second-segment parameter s is equal to or greater than the predetermined value TH2 is set to be equal to or smaller than the additional value a(r) in the case where the second-segment parameter s is greater than the predetermined value TH1 and smaller than the predetermined value TH2 (the upper limit criterion). However, such a criterion that uses the predetermined values TH1 and TH2 may not be used. Alternatively, one of the upper limit criterion and the lower limit criterion may be used, for example.

Furthermore, as described above as a modification of the first embodiment, a corrected value that weakly monotonically increases with respect to the sum of the second-segment parameter s and the additional value a(r) (r=0, ..., L−1) may be used as the first-segment parameter s(r) (r=0, ..., L−1). Furthermore, as described above in the second embodiment, the code $C_g$ may include auxiliary information used in the decoder 700 to reproduce each additional value a(r) (r=0, ..., L−1).

Furthermore, the present invention may be applied to a case where prediction residuals obtained by using the short-term prediction analysis and the long-term prediction analysis in combination are coded. More specifically, the present invention may be applied to a case where short-term prediction analysis is performed on input time-series signals using a short-term prediction filter to determine short-term prediction residuals, long-term prediction analysis is then performed on the short-term prediction residuals as secondary time-series signals using a long-term prediction filter to determine long-term prediction residuals, and the long-term prediction residuals are coded. Alternatively, the present invention may be applied to a case where long-term prediction analysis is performed on input time-series signals using a long-term prediction filter to determine long-term prediction residuals, short-term prediction analysis is then performed on the long-term prediction residuals as secondary time-series signals using a short-term prediction filter to determine short-term prediction residuals, and the short-term prediction residuals are coded. When the short-term prediction analysis and the long-term prediction analysis are used in combination in this way, each additional value may be set in the same way as the encoding of the prediction residuals obtained by using the short-term prediction filter described above, may be set in the same way as the encoding of the prediction residuals obtained by using the long-term prediction filter described above, or be an additional value set according to a combination of these setting criteria.

[Other Modifications]

Note that the scope of the present invention is not limited to the embodiments described above. For example, according to the embodiments described above, the present invention is applied on the assumption that a frame randomly accessed or a leading sub-frame is a "certain discrete time segment". However, under a situation where time-series signals in a time segment preceding the frame (or the sub-frame) to be processed cannot be used for calculation with the short-term prediction filter, the average code amount can be reduced by applying the present invention.

The processings described above can be performed not only sequentially in the order described above but also in parallel with each other or individually as required or depending on the processing power of the apparatus that performs the processings. Furthermore, of course, other various modifications can be appropriately made without departing from the spirit of the present invention.

In the case where the configuration described above is implemented by a computer, the specific processing capabilities of the apparatuses are described in a program. The computer executes the program to implement the processing capabilities described above.

The program that describes the specific processings can be recorded in a computer-readable recording medium. The computer-readable recording medium may be any type of recording medium, such as a magnetic recording device, an optical disk, a magneto-optical recording medium and a semiconductor memory.

The program may be distributed by selling, transferring or lending a portable recording medium, such as a DVD and a CD-ROM, in which the program is recorded, for example. Alternatively, the program may be distributed by storing the program in a storage device in a server computer and transferring the program from the server computer to other computers via a network.

The computer that executes the program first temporarily stores, in a storage device thereof, the program recorded in a portable recording medium or transferred from a server computer, for example. Then, when performing the processings, the computer reads the program from the recording medium and performs the processings according to the read program. In an alternative implementation, the computer may read the program directly from the portable recording medium and perform the processings according to the program. As a further alternative, the computer may perform the processings according to the program each time the computer receives a program transferred from the server computer. As a further alternative, the processings described above may be performed by on an application service provider (ASP) basis, in which the server computer does not transmit the program to the computer, and the processing capabilities are implemented only through execution instruction and result acquisition.

The programs according to the embodiments of the present invention include a quasi-program, which is information processed by a computer (data or the like that is not a direct instruction to a computer but has a property that defines the processings performed by the computer).

In the embodiments described above, the apparatuses are implemented by executing a predetermined program on a computer. However, at least part of the processings may be implemented in the form of hardware.

INDUSTRIAL APPLICABILITY

Industrial applications of the present invention include a lossless compression coding and decoding technique for acoustic signals, for example. In addition, the present invention is not limited to the acoustic signals but can also be applied to a lossless compression coding and decoding technique for video signals, biological signals, seismic signals or the like.

DESCRIPTION OF REFERENCE NUMERALS

2100, 100, 600, 800 encoder
2200, 200, 700, 900 decoder

What is claimed is:

1. A parameter selection method of selecting parameters for variable length coding of prediction residuals of time-series signals in a certain discrete time segment, comprising:
   (A) a step of designating a positive second-segment parameter that corresponds to a monotonically non-decreasing function value of an average amplitude of prediction residuals in a time segment including a second segment as a parameter for variable length coding of prediction residuals in the second segment, a first segment being an earliest time segment included in the discrete time segment, and the second segment being a time segment subsequent to the first segment; and
   (B) a step of designating a value that corresponds to a monotonically non-decreasing function value of a sum of the second-segment parameter and a positive additional value that corresponds to an index representing prediction effectiveness of time-series signals in the time segment including the second segment as a parameter for variable length coding of a prediction residual at a certain discrete time in the first segment.

2. A parameter selection method of selecting parameters for variable length coding of prediction residuals of time-series signals in a certain discrete time segment, comprising:

(A) a step of designating a positive second-segment parameter that corresponds to a monotonically non-decreasing function value of an average amplitude of prediction residuals in a time segment including a second segment as a parameter for variable length coding of prediction residuals in the second segment, a first segment being an earliest time segment included in the discrete time segment, and the second segment being a time segment subsequent to the first segment; and (B) a step of designating a value that corresponds to a monotonically non-decreasing function value of a sum of the second-segment parameter and a positive first additional value as a parameter for variable length coding of a prediction residual at a certain discrete time in the first segment when magnitude of a PARCOR coefficient of a certain order is a first value, where the PARCOR coefficient corresponds to the time-series signals in the discrete time segment, and designating a value that corresponds to a monotonically non-decreasing function value of a sum of the second-segment parameter and a second additional value that is equal to or greater than the first additional value as a parameter for variable length coding of the prediction residual at the certain discrete time in the first segment when the magnitude of the PARCOR coefficient is a second value greater than the first value.

3. A parameter selection method of selecting parameters for variable length coding of prediction residuals of time-series signals in a certain discrete time segment, comprising:

(A) a step of designating a positive second-segment parameter that corresponds to a monotonically non-decreasing function value of an average amplitude of prediction residuals in a time segment including a second segment as a parameter for variable length coding of prediction residuals in the second segment, a first segment being an earliest time segment included in the discrete time segment, and the second segment being a time segment subsequent to the first segment; and (B) a step of designating a value that corresponds to a monotonically non-decreasing function value of a sum of the second-segment parameter and a positive additional value that corresponds to an index representing prediction effectiveness of a long-term prediction analysis of time-series signals in the discrete time segment as a parameter for variable length coding of a prediction residual at a certain discrete time in the first segment.

4. The parameter selection method according to claim 1, wherein the additional value corresponds to a monotonically non-increasing function value of a ratio of the average amplitude of the prediction residuals to the average amplitude of the time-series signals in the time segment including the second segment.

5. The parameter selection method according to claim 1, wherein the additional value corresponds to a monotonically non-decreasing function value of magnitude of a PARCOR coefficient of a certain order, where the PARCOR coefficient corresponds to the time-series signals in the discrete time segment.

6. The parameter selection method according to claim 1, wherein the additional value corresponds to a monotonically non-decreasing function value of an optimum prediction order adaptively selected when a short-term prediction analysis of the time-series signals in the discrete time segment is performed.

7. The parameter selection method according to claim 1, wherein the additional value corresponds to a monotonically non-increasing function value of $\Pi_{m=1}^{P}\{1-k(m)^2\}$ where $k(m)$ $(m=1, \ldots, P)$ represents each of first-order to P-th-order PARCOR coefficients obtained by a short-term prediction analysis of the time-series signals in the discrete time segment with a prediction order P.

8. The parameter selection method according to claim 1, wherein, L represents a positive integer smaller than a number of discrete times in the discrete time segment, the first segment is a time segment from an earliest discrete time to an L-th discrete time in the discrete time segment, and indexes r $(r=0, \ldots, L-1)$ represent the earliest to L-th discrete times, respectively, additional values are set for discrete times corresponding to the indexes r, respectively, an additional value at the discrete time corresponding to an index $r=0$ corresponds to a monotonically non-decreasing function value of $1-\Pi_{m=1}^{P}\{1-k(m)^2\}$ where $k(m)$ $(m=1, \ldots, P)$ represents each of first-order to P-th-order PARCOR coefficients obtained by a short-term prediction analysis of the time-series signals in the discrete time segment with a prediction order P, and additional values at discrete times corresponding to indexes r falling within a range that $0<r<P$ correspond to monotonically non-decreasing function values of $\Pi_{m=1}^{r}\{1-k(m)^2\}-\Pi_{m=1}^{P}\{1-k(m)^2\}$, respectively, and the step (B) is a step of designating each value which corresponds to a monotonically non-decreasing function value of a sum of the second-segment parameter and each of the additional values at a discrete time corresponding to each of the indexes r as a parameter for variable length coding of the prediction residual at the discrete time corresponding to each of the indexes r.

9. The parameter selection method according to claim 1, wherein the step (B) is a step performed when the second-segment parameter is greater than a predetermined value, and the method comprises a step of designating a value that corresponds to a monotonically non-decreasing function value of a sum of the second-segment parameter and a positive second additional value smaller than the additional value as a parameter for variable length coding of the prediction residual at the certain discrete time in the first segment when the second-segment parameter is equal to or smaller than the predetermined value, wherein the predetermined value is a value equal to or greater than 0 and smaller than a maximum amplitude value of the second-segment parameter.

10. The parameter selection method according to any one of claims 1 to 3, wherein the additional value corresponds to a monotonically non-decreasing function value of a number of time-series signals in the discrete time segment.

11. The parameter selection method according to any one of claims 1 to 3, wherein the first segment is a time segment from an earliest discrete time to an L-th discrete time in the discrete time segment, the second segment is a time segment from an (L+1)-th discrete time to a last discrete time in the discrete time segment, and L represents a positive integer smaller than the number of discrete times in the discrete time segment.

12. An apparatus that selects parameters for variable length coding of prediction residuals of time-series signals in a certain discrete time segment, comprising:

a second-segment parameter calculator that designates a positive second-segment parameter that corresponds to a monotonically non-decreasing function value of an average amplitude of prediction residuals in a time segment including a second segment as a parameter for variable length coding of prediction residuals in the second segment, a first segment being an earliest time segment included in the discrete time segment, and the second segment being a time segment subsequent to the first segment; and a first-segment parameter calculator that designates a value that corresponds to a monotonically non-decreasing function value of a sum of the second-segment parameter and a positive additional value that corresponds to an index representing prediction effectiveness of time-series signals in the time segment including the second segment as a parameter for variable length coding of a prediction residual at a certain discrete time in the first segment.

13. An apparatus that selects parameters for variable length coding of prediction residuals of time-series signals in a certain discrete time segment, comprising:

a second-segment parameter calculator that designates a positive second-segment parameter that corresponds to a monotonically non-decreasing function value of an average amplitude of prediction residuals in a time segment including a second segment as a parameter for variable length coding of prediction residuals in the second segment, a first segment being an earliest time segment included in the discrete time segment, and the second segment being a time segment subsequent to the first segment; and a first-segment parameter calculator that designates a value that corresponds to a monotonically non-decreasing function value of a sum of the second-segment parameter and a positive first additional value as a parameter for variable length coding of a prediction residual at a certain discrete time in the first segment when magnitude of a PARCOR coefficient of a certain order is a first value, the PARCOR coefficient corresponding to the time-series signals in the discrete time segment, and designates a value that corresponds to a monotonically non-decreasing function value of a sum of the second-segment parameter and a second additional value that is equal to or greater than the first additional value as a parameter for variable length coding of the prediction residual at the certain discrete time in the first segment when the magnitude of the PARCOR coefficient is a second value greater than the first value.

14. An apparatus that selects parameters for variable length coding of prediction residuals of time-series signals in a certain discrete time segment, comprising:

a second-segment parameter calculator that designates a positive second-segment parameter that corresponds to a monotonically non-decreasing function value of an average amplitude of prediction residuals in a time segment including a second segment as a parameter for variable length coding of prediction residuals in the second segment, a first segment being an earliest time segment included in the discrete time segment, and the second segment being a time segment subsequent to the first segment; and a first-segment parameter calculator that designates a value that corresponds to a monotonically non-decreasing function value of a sum of the second-segment parameter and a positive additional value that corresponds to an index representing prediction effectiveness of a long-term prediction analysis of time-series signals in the discrete time segment as a parameter for variable length coding of a prediction residual at a certain discrete time in the first segment.

15. A non-transitory computer-readable recording medium that stores a program that makes a computer perform a processing of each step in a parameter selection method according to any one of claims 1 to 3.

* * * * *

UNITED STATES PATENT AND TRADEMARK OFFICE
CERTIFICATE OF CORRECTION

PATENT NO. : 8,576,910 B2  
APPLICATION NO. : 13/143554  
DATED : November 5, 2013  
INVENTOR(S) : Takehiro Moriya et al.

Page 1 of 1

It is certified that error appears in the above-identified patent and that said Letters Patent is hereby corrected as shown below:

On the title page, Item (75) inventors city of Residence are incorrect. Item (75) should read:

-- (75) Takehiro Moriya, Kanagawa (JP);  
Noboru Harada, Kanagawa (JP);  
Yutaka Kamamoto, Kanagawa (JP) --

Signed and Sealed this  
Thirtieth Day of December, 2014

Michelle K. Lee  
*Deputy Director of the United States Patent and Trademark Office*